United States Patent
Kamikawa et al.

[11] Patent Number: 6,001,191
[45] Date of Patent: Dec. 14, 1999

[54] SUBSTRATE WASHING METHOD, SUBSTRATE WASHING-DRYING METHOD, SUBSTRATE WASHING APPARATUS AND SUBSTRATE WASHING-DRYING APPARATUS

[75] Inventors: Yuuji Kamikawa, Koshimachi; Kinya Ueno; Naoki Shindo, both of Nirasaki; Yoshio Kumagai, Shiranemachi, all of Japan

[73] Assignee: Tokyo Electron Limited, Tokyo, Japan

[21] Appl. No.: 08/760,801

[22] Filed: Dec. 5, 1996

[30] Foreign Application Priority Data

| Dec. 7, 1995 | [JP] | Japan | 7-345277 |
|---|---|---|---|
| Mar. 1, 1996 | [JP] | Japan | 8-071382 |
| Jul. 5, 1996 | [JP] | Japan | 8-195461 |
| Jul. 18, 1996 | [JP] | Japan | 8-206366 |

[51] Int. Cl.$^6$ ........................................................ B08B 3/00
[52] U.S. Cl. ............................ 134/32; 134/2; 134/34; 134/61; 134/902
[58] Field of Search ........................... 134/1, 1.3, 2, 25.1, 134/25.4, 32, 26, 30, 34, 902, 61, 37, 28, 29

[56] References Cited

U.S. PATENT DOCUMENTS

| 4,643,774 | 2/1987 | Kishida et al. . |
|---|---|---|
| 4,778,532 | 10/1988 | McConnell et al. . |
| 4,899,768 | 2/1990 | Yatabe . |
| 4,911,761 | 3/1990 | McConnell et al. . |
| 5,315,766 | 5/1994 | Roberson, Jr. et al. . |
| 5,331,987 | 7/1994 | Hayashi et al. . |
| 5,370,142 | 12/1994 | Nishi et al. ........................ 134/902 X |
| 5,520,744 | 5/1996 | Fujikawa et al. . |

FOREIGN PATENT DOCUMENTS

| 385536 | 9/1990 | European Pat. Off. . |
|---|---|---|
| 0 385 536 B1 | 9/1994 | European Pat. Off. . |
| 1-138721 | 5/1989 | Japan . |
| 6-103686 | 12/1994 | Japan . |

*Primary Examiner*—Jill Warden
*Assistant Examiner*—Alexander Markoff
*Attorney, Agent, or Firm*—Oblon, Spivak, McClelland, Maier & Neustadt, P.C.

[57] ABSTRACT

Disclosed is a method of washing substrates, comprising the steps of (a) introducing a washing solution into a processing vessel having a wafer boat movably mounted therein to fill the vessel with the washing solution, (b) allowing a plurality of wafers to be held collectively by chuck such that the wafers held by the chuck are arranged at substantially an equal pitch, (c) dipping the wafers together with the chuck in the washing solution within the processing vessel, (d) transferring the wafers from the chuck onto the wafer boat in an upper region of the processing vessel, (e) moving the wafers together with the wafer boat within the washing solution to allow the substrates to be positioned in a lower region of the processing vessel, (f) discharging the washing solution from the upper region of the processing vessel, (g) supplying a fresh washing solution into the lower region of the processing vessel so as to cause the washing solution within the processing vessel to overflow the processing vessel, (h) taking the washed wafers out of the processing vessel.

8 Claims, 38 Drawing Sheets

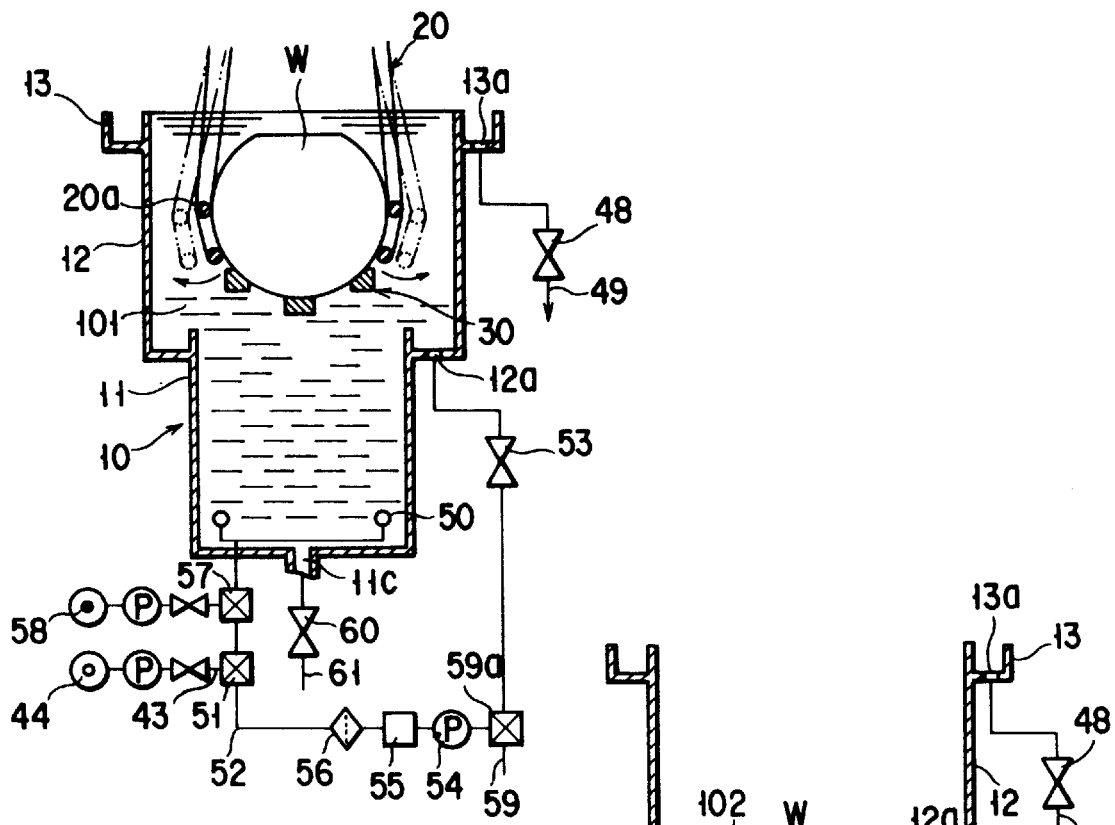
FIG. 8A
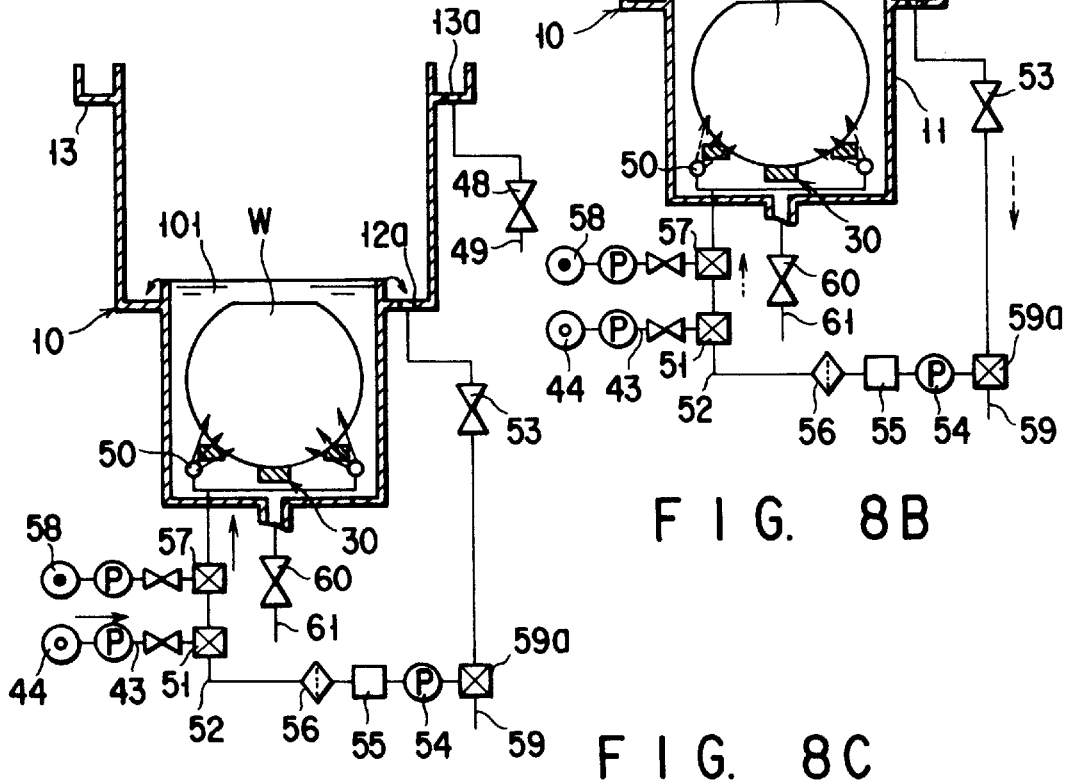
FIG. 8B
FIG. 8C

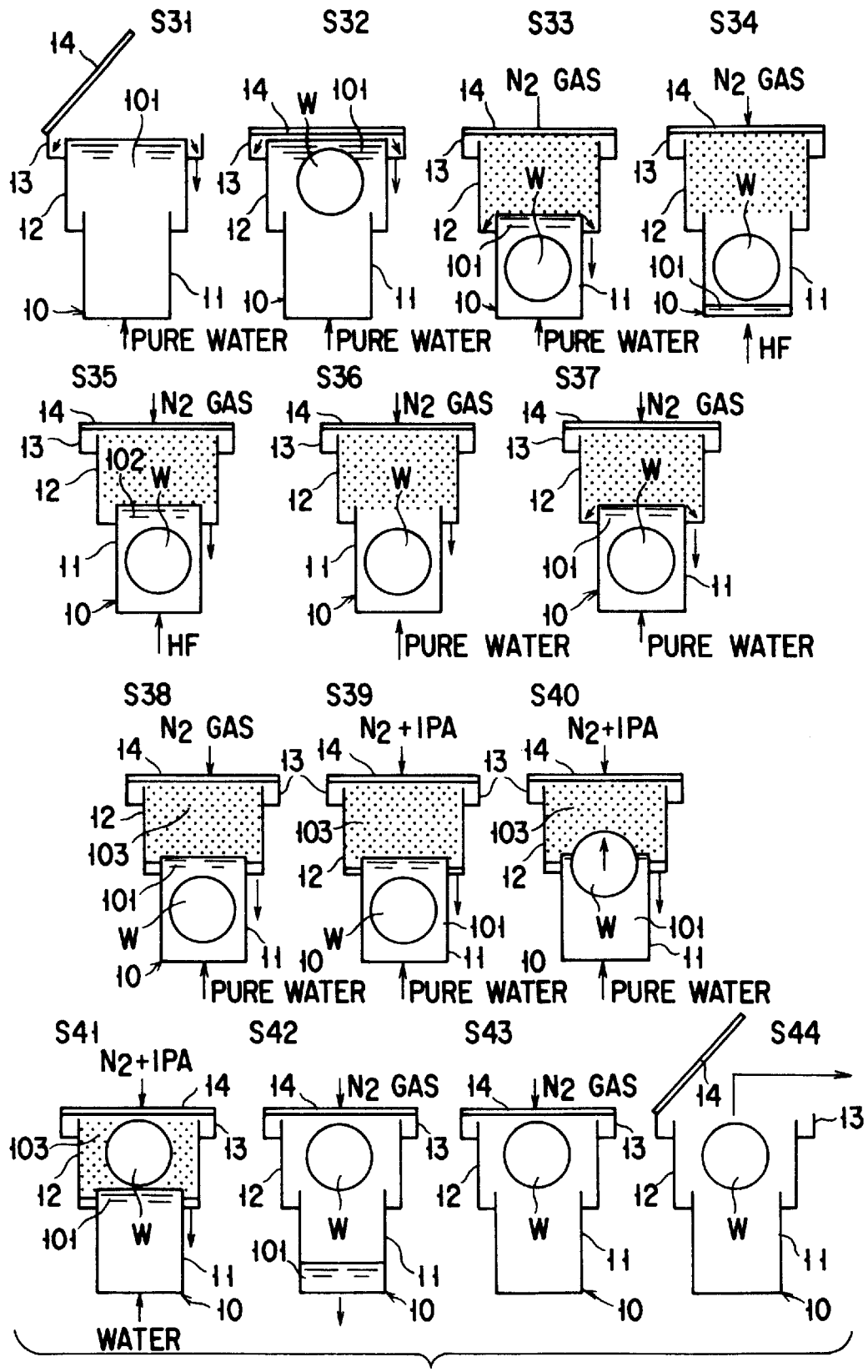
F I G. 14

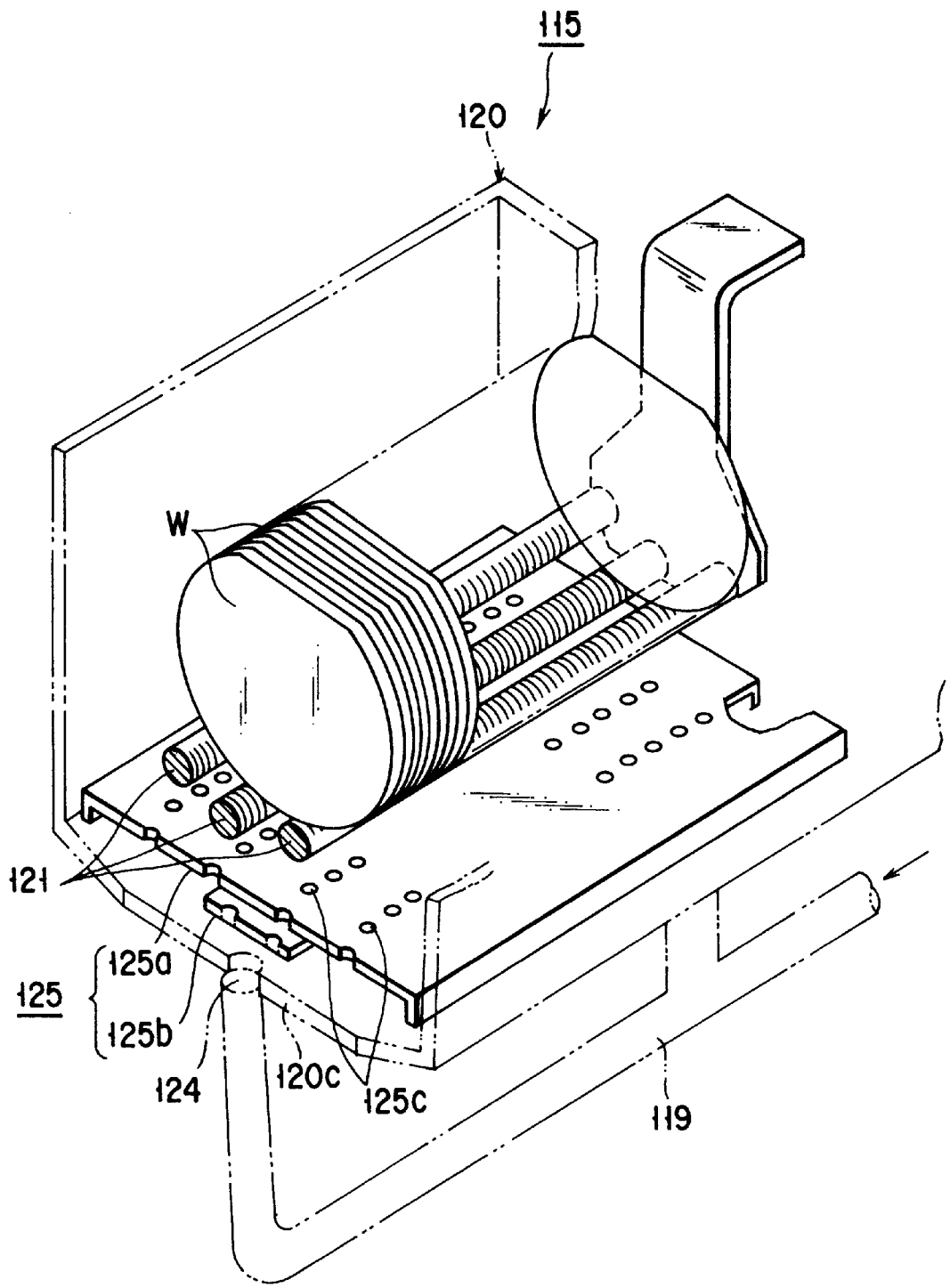
F I G. 16

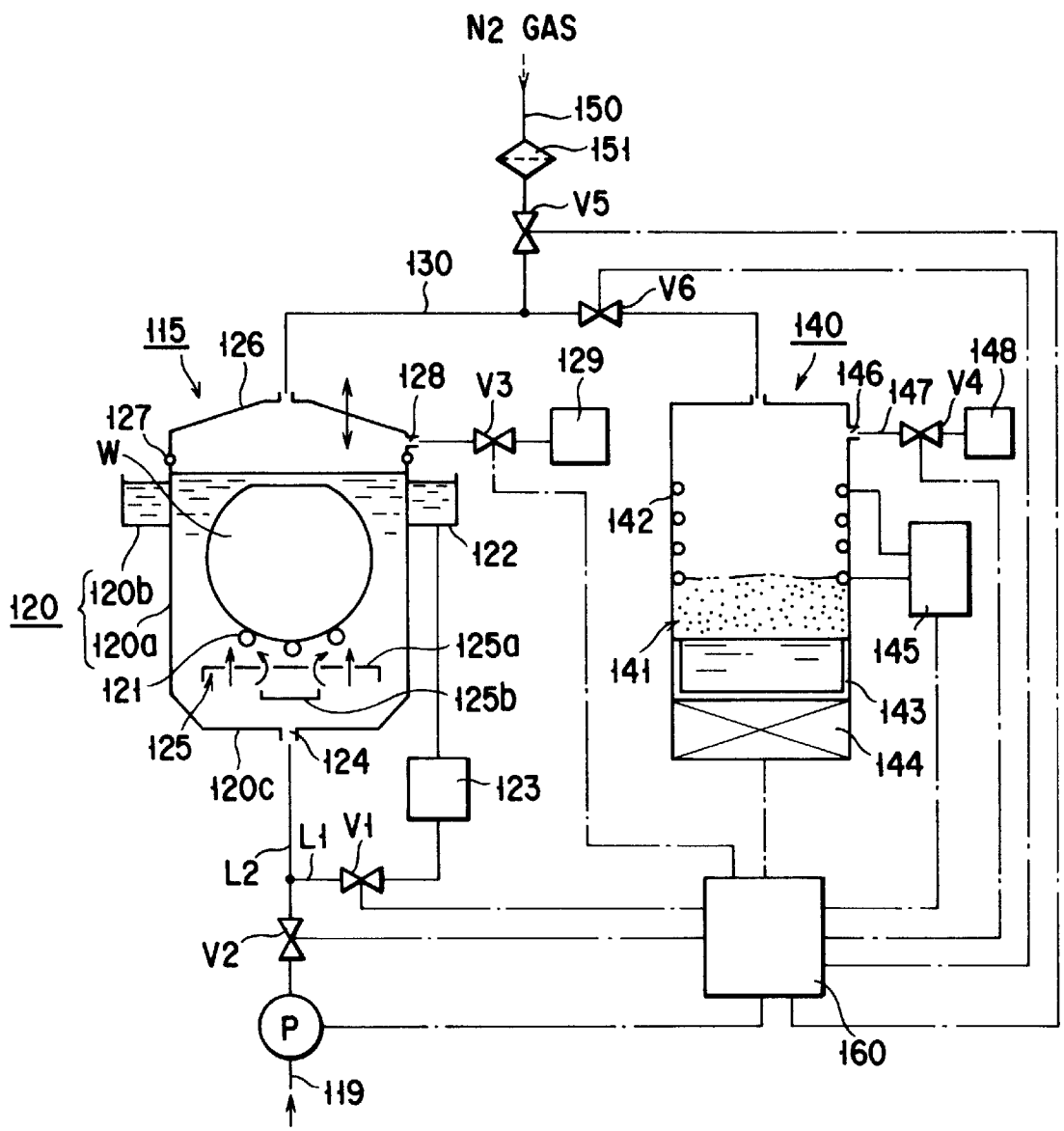
F I G. 22

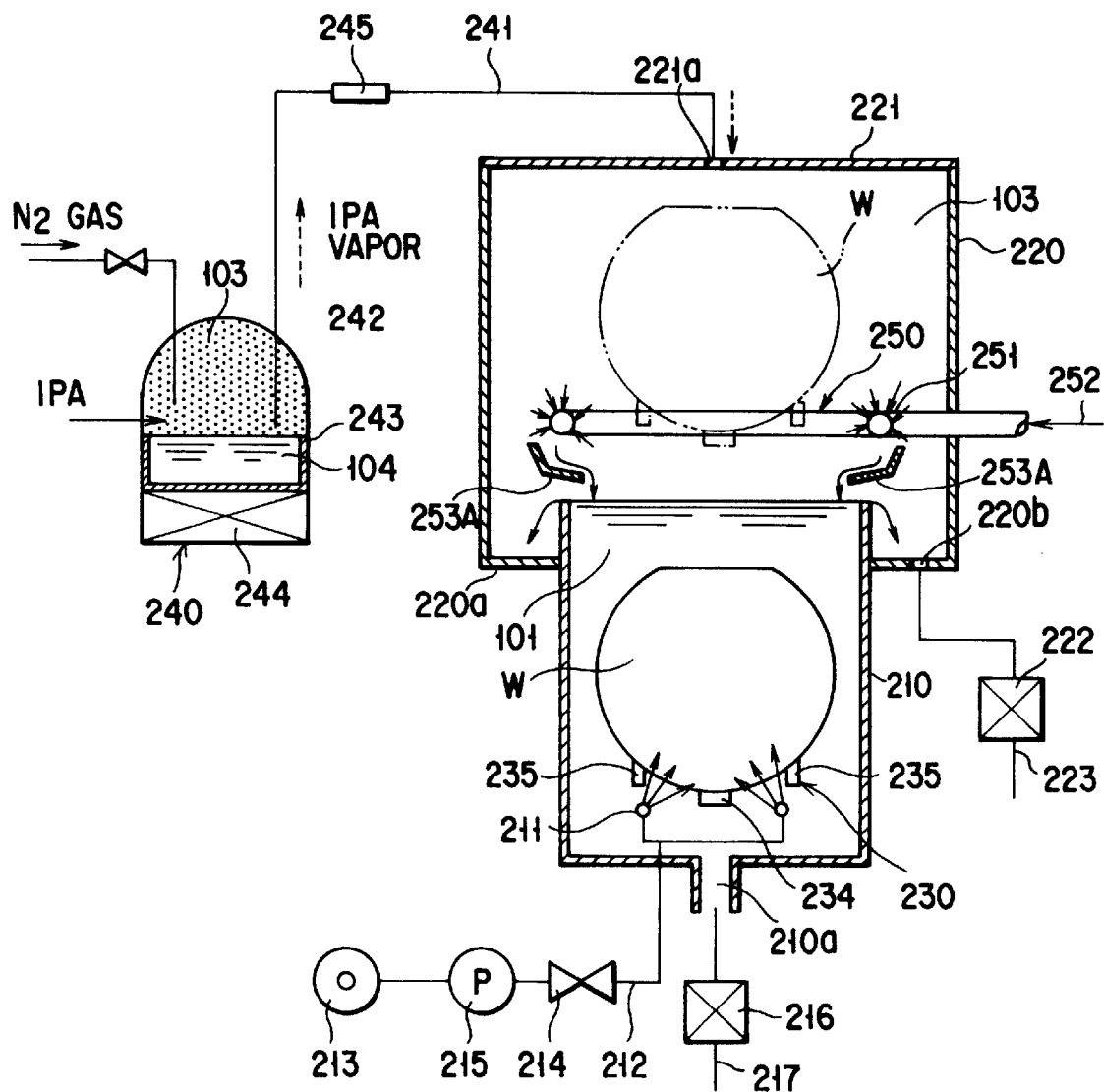
F I G. 27

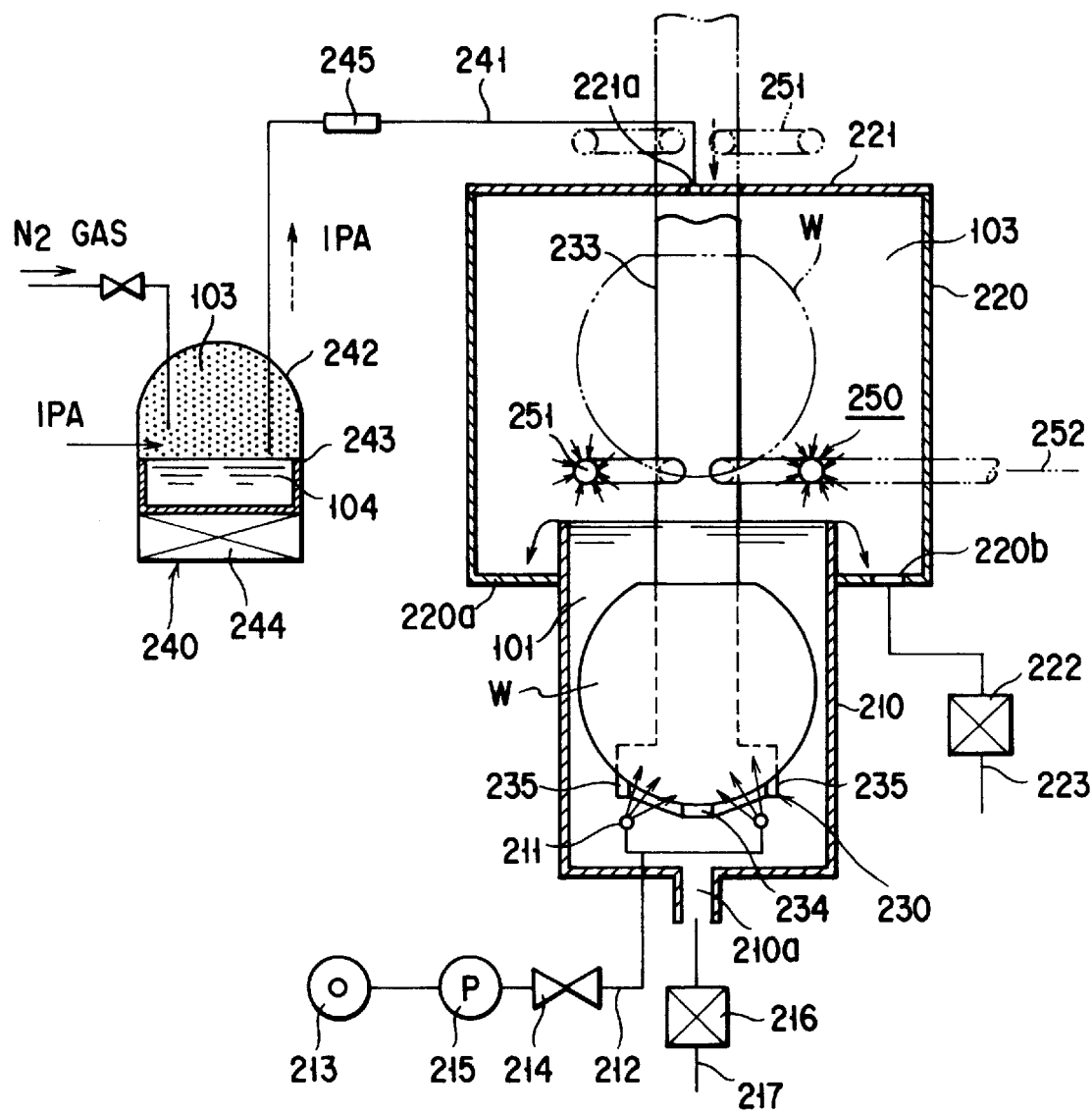
F I G. 30

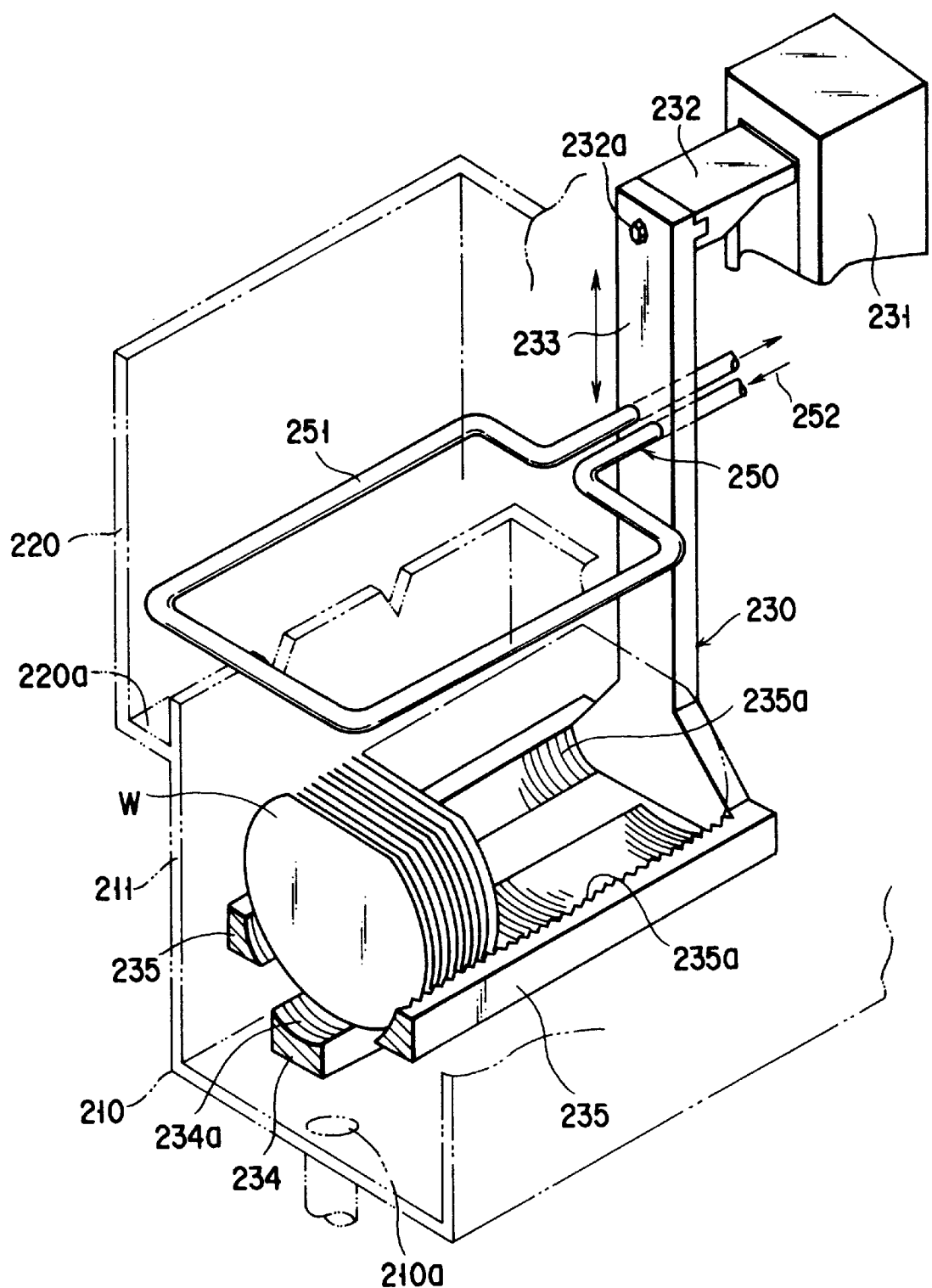
F I G. 31

SUBSTRATE WASHING METHOD, SUBSTRATE WASHING-DRYING METHOD, SUBSTRATE WASHING APPARATUS AND SUBSTRATE WASHING-DRYING APPARATUS

BACKGROUND OF THE INVENTION

1. Field of the Invention

The present invention relates to a method and apparatus for washing with a washing solution a substrate such as a semiconductor wafer or a glass substrate for a liquid crystal display (LCD) device and to a method and apparatus for washing-drying such a substrate.

2. Description of the Related Art

In the initial process of manufacturing a semiconductor device, a semiconductor wafer used as a substrate is dipped in a chemical solution so as to remove foreign substances such as particles, organic contaminants, and metal impurities from the surface of the substrate, followed by water wash with a rinsing solution and, then, drying. A wet type washing-drying system is used for performing a series of these treatments.

The wet type washing-drying system comprises a wet station prepared by arranging in series a plurality of processing vessels. In the wet station, the substrate such as a semiconductor wafer is washed with various chemical solutions such as an ammonia-hydrogen peroxide solution, a hydrofluoric acid solution, a dilute sulfuric acid solution and a dilute hydrochloric acid solution, followed by washing with water and, then, by drying. Since a plurality of processing vessels are arranged in series, a plurality of wafers are successively dipped in different chemical solutions housed in the processing vessels so as to perform the washing-drying treatments efficiently.

Japanese Patent Publication (Kokoku) No. 6-82647 discloses a closed drying apparatus in which an isopropyl alcohol (IPA) vapor is used for drying wafers after the washing treatments. This prior art teaches that a pure water film is removed from the wafer surface when IPA is evaporated, making it possible to dry the wafer clean without generating a water mark on the wafer surface. In the drying apparatus of this type, however, the wafer is moved within the air atmosphere when transferred between the washing section and the drying section. It follows that the wet wafer is kept in contact with the air for a long time, with the result that foreign substances such as particles are likely to be attached to the wafer surface.

Further, Japanese Patent Publication (Kokoku) No. 6-103686 discloses another type of drying apparatus. In this apparatus, an IPA vapor is supplied to a process chamber while discharging a pure water from the process chamber so as to fill the process chamber with the IPA vapor.

Still further, European Patent No. 03 85 536 B1 discloses a wafer drying apparatus utilizing Marangoni effect. In this apparatus, wafers are dried while being pulled out of a pure water.

It should be noted that IPA has such a high boiling temperature as 82° C., with the result that evaporation of the washing solution (pure water) is promoted. It follows that dews of pure water or IPA are formed on the inner surface of the chamber. The presence of the dews causes the purging time with a nitrogen gas, which is performed for bringing the atmosphere within the chamber back to the initial state, to be prolonged, leading to a low through-put. Further, the dews are likely to be evaporated again when the inner pressure of the chamber is lowered, with the result that the evaporated water or IPA is attached to the wafer W to form dews. It follows that water marks are likely to be formed on the wafer W. What should also be noted that, if the dew of water formed on the inner surface of the ceiling of the chamber drops onto the wafer W, the wafer W incurs a serious contamination. Still further, the dew of IPA is discharged without being dried, leading to waste of IPA.

SUMMARY OF THE INVENTION

An object of the present invention is to provide a substrate washing method, a substrate washing-drying method, a substrate washing apparatus and a substrate washing-drying apparatus, which permit shortening the time during which a wet substrate is exposed to the air atmosphere so as to treat the substrates at a high through-put and a high yield.

According to a first embodiment of the present invention, there is provided a method of washing substrates, comprising the steps of:

(a) introducing a washing solution into a processing vessel having a wafer boat movably mounted therein to fill the vessel with the washing solution;

(b) allowing a plurality of substrates to be held collectively by chuck means such that the substrates held by the chuck means are arranged at substantially an equal pitch;

(c) dipping the substrates together with the chuck means in the washing solution within the processing vessel;

(d) transferring the substrates from the chuck means onto the wafer boat in an upper region of the processing vessel;

(e) moving the substrates together with the wafer boat within the washing solution to allow the substrates to be positioned in a lower region of the processing vessel;

(f) discharging the washing solution from the upper region of the processing vessel;

(g) supplying a fresh washing solution into the lower region of the processing vessel so as to cause the washing solution within the processing vessel to overflow the processing vessel; and (h) taking the washed substrates out of said processing vessel.

According to a second embodiment of the present invention, there is provided a method of washing-drying substrates, comprising the steps of:

(A) introducing a washing solution into a processing vessel having a wafer boat movably mounted therein to fill the vessel with the washing solution;

(B) allowing a plurality of substrates to be held collectively by chuck means such that the substrates held by the chuck means are arranged at substantially an equal pitch;

(C) dipping the substrates together with the chuck means in the washing solution within the processing vessel;

(D) transferring the substrates from the chuck means onto the wafer boat in an upper region of the processing vessel;

(E) moving the substrates together with the wafer boat within the washing solution to allow the substrates to be positioned in a lower region of the processing vessel;

(F) discharging the washing solution from the upper region of the processing vessel;

(G) supplying a fresh washing solution into the lower region of the processing vessel so as to cause the washing solution within the processing vessel to overflow the processing vessel;

(H) introducing a vapor for a drying treatment into the upper region of the processing vessel;

(I) pulling the substrates out of the washing solution to put these substrates in a gaseous phase consisting of the vapor for the drying treatment, thereby bringing the substrates into contact with the vapor for the drying treatment so as to dry the substrates; and (J) taking the dried substrates out of the processing vessel.

According to a third embodiment of the present invention, there is provided an apparatus for washing substrates, comprising:

a processing vessel;

washing solution supply means for supplying a washing solution for washing substrates each having a first chemical solution attached thereto to the processing vessel;

transfer means for transferring substrates into the processing vessel, said transfer means including a chuck member for collectively holding a plurality of substrates at substantially an equal pitch;

a wafer boat onto which said plural substrates are transferred from the transfer means;

a main vessel arranged below the processing vessel and having an inner volume large enough to house the wafer boat together with the plural substrates to be washed;

an auxiliary vessel arranged in direct contact with the main vessel to constitute an upper portion of the processing vessel and having an inner volume large enough to house the plural substrates to be washed together with the chuck member; and lift means for vertically moving the wafer boat between the main vessel and the auxiliary vessel.

Further, according to the fourth embodiment of the present invention, there is provided an apparatus for washing-drying substrates, comprising:

a processing vessel;

washing solution supply means for supplying a washing solution for washing substrates each having a first chemical solution attached thereto to the processing vessel;

transfer means for transferring substrates into the processing vessel, said transfer means including a chuck member for collectively holding a plurality of substrates at substantially an equal pitch;

a wafer boat onto which said plural substrates are transferred from the transfer means;

a main vessel arranged below the processing vessel and having an inner volume large enough to house the wafer boat together with the plural substrates to be washed;

an auxiliary vessel arranged directly on the main vessel and having an inner volume larger than that of the main vessel and large enough to house the plural substrates to be washed together with the chuck member;

lift means for vertically moving the wafer boat between the main vessel and the auxiliary vessel; and drying-vapor supply means for supplying a vapor for drying wet substrates into the auxiliary vessel.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 8A, 8B and 8C are cross sectional views collectively showing the processing vessel in conjunction with the operation of the apparatus shown in FIG. 1;

FIG. 14 is a flow chart showing steps S31 to S44 of a method according to another embodiment of the present invention;

FIG. 16 is an oblique view, partly broken away, showing cooling pipes and a wafer boat positioned within the processing vessel;

FIG. 22 is a cross sectional view showing the processing vessel, drying gas-forming apparatus and peripheral circuits thereof;

FIG. 27 is a cross sectional view showing another processing vessel, drying gas-forming apparatus and peripheral circuits thereof;

FIG. 30 is a cross sectional view showing another processing vessel, drying gas-forming apparatus and peripheral circuits thereof;

FIG. 31 is an oblique view, partly broken away, showing cooling pipes and a wafer boat positioned within the processing vessel;

DETAILED DESCRIPTION OF THE PREFERRED EMBODIMENTS

Figure 1:
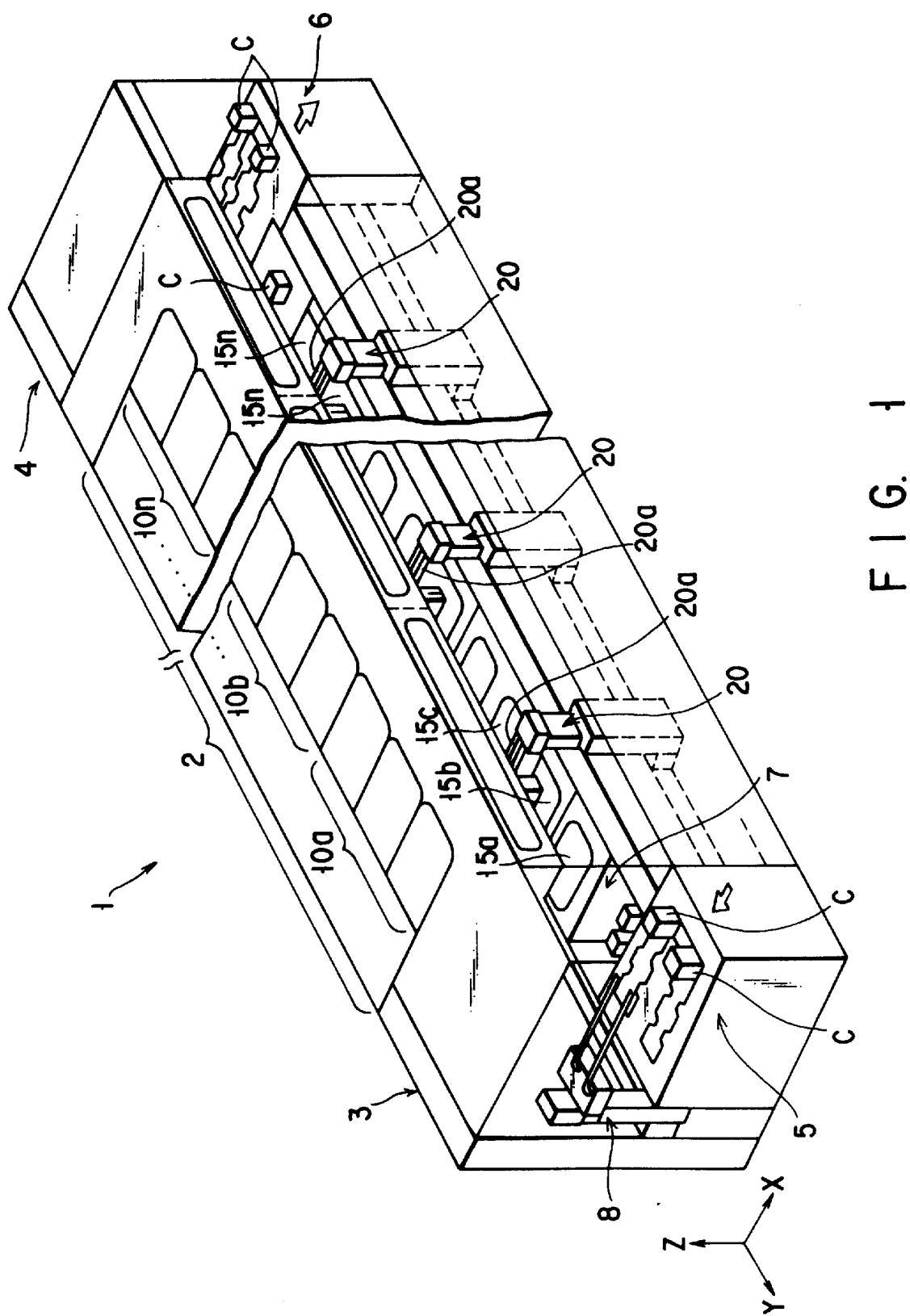
FIG. 1 is an oblique view schematically showing the entire construction of a washing-drying apparatus according to one embodiment of the present invention.
Figure 2:
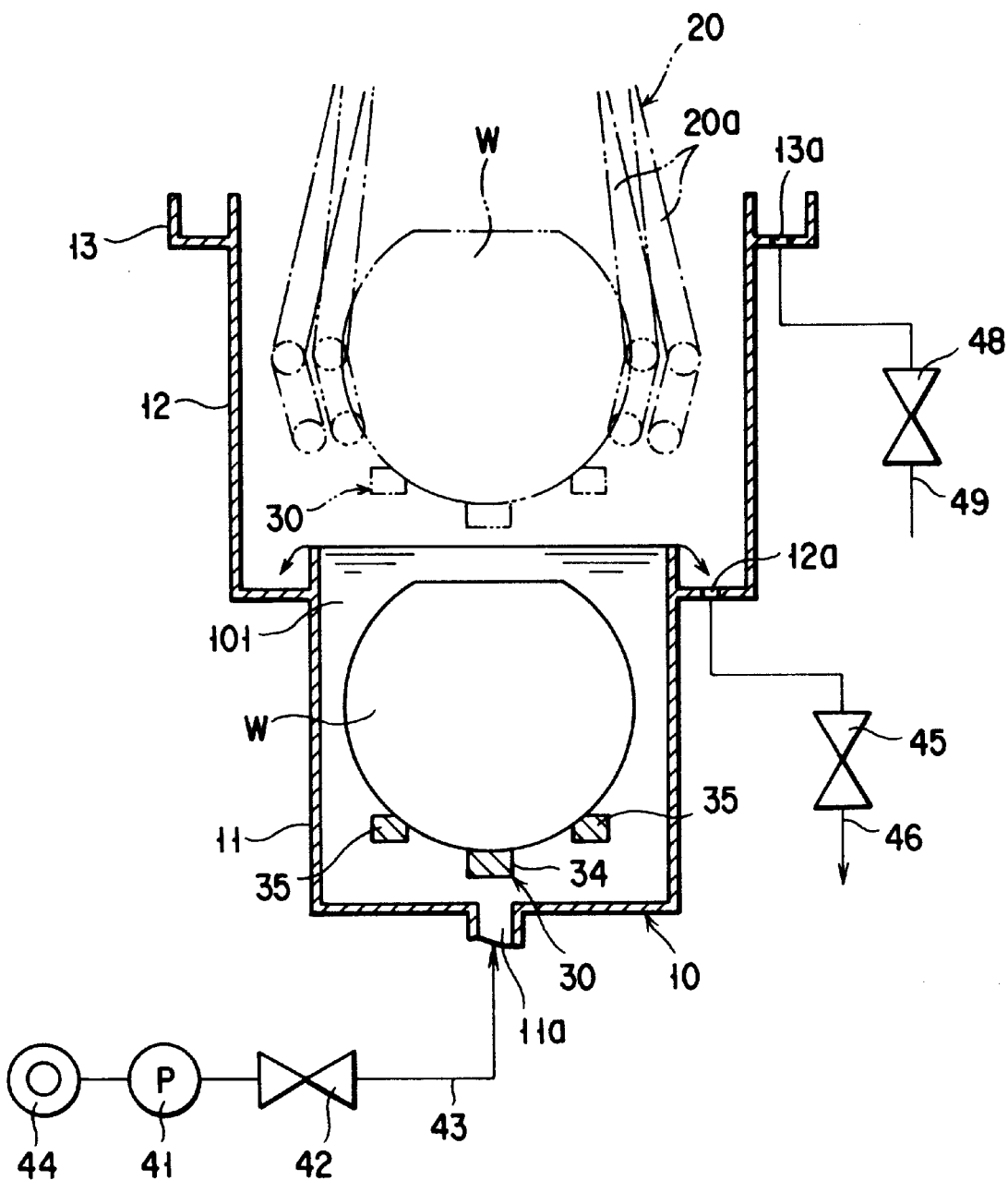
FIG. 2 is a cross sectional view showing the processing vessel included in the apparatus shown in FIG. 1.

Let us describe preferred embodiments of the present invention with reference to the accompanying drawings. First of all, let us describe how to wash and dry semiconductor wafers with reference to FIGS. 1, 2, 3, 4A and 4B.

Specifically, the washing system shown in these drawings comprises a process section 2, a loader section 3 and an unloader section 4. The loader section 3 is arranged on one side of the process section 2, with the unloader section 4 being arranged on the other side of the process section 2.

The loader section 3 includes a stage section 5, an interface 7 and a transfer device 8. A plurality of cassettes C each having 25 untreated wafers W housed therein are disposed on the stage section 5. The transfer device 8 serves to take the wafers W collectively out of the cassette C and, then, to transfer these wafers W whose positions are aligned by the transfer device 8 to the interface 7. The interface 7, which is positioned adjacent to the process section 2, acts as a transit port for delivering the wafers W from the transfer device 8 into a transfer mechanism 20.

The process section 2 includes a plurality of washing units $10_a$, $10_b$, ... $10_{n-1}$, which are arranged in series in a Y-axis direction. Each of these washing units includes a chemical solution vessel 15a, a primary water wash vessel 15b and a secondary water wash vessel 15c. A chemical solution such as an ammonia-hydrogen peroxide solution or a hydrofluoric acid solution is circulated through the chemical solution vessel 15a. On the other hand, pure water is circulated through each of the primary and secondary water wash vessels 15b and 15c. As apparent from FIG. 1, the wafers W washed with pure water in the water wash vessels 15b, 15c are successively transferred for additional washing treatment into the washing units $10_b$, etc., which are arranged downstream of the washing unit $10_a$.

A washing-drying unit $10_n$ is arranged downstream of the last washing unit $10_{n-1}$. In the washing-drying unit $10_n$, the wafers W are subjected to the final washing treatment and, then, dried with IPA. It should be noted that three transfer mechanisms 20 are arranged movable in the Y-axis direction along the process section 2. Each of these transfer mechanisms 20 includes a wafer chuck 20a capable of collectively holding 50 wafers W. The wafer chuck 20a is movable in the directions of X-axis and Z-axis and is swingable by an angle θ about the Z-axis.

The unloader section 4 includes a cassette holding portion 6. A plurality of cassettes C are disposed on the cassette holding portion 6. On the other hand, the wafers W which were subjected to the washing-drying treatments in units $10_b$ to $10_n$ are housed in the cassette C.

Let us describe more in detail the wafer washing apparatus with reference to FIGS. 2 to 4B. As seen from the drawings, the wafer washing apparatus comprises a processing vessel 10, the wafer chuck 20 and a wafer boat 30. The processing vessel 10 consists of a lower vessel (main vessel) 11 and an upper vessel (auxiliary vessel) 12. A pure water supply port 11a and a water flow regulating plate (not shown) are formed on the bottom portion of the main vessel 11. A pure water 101 is supplied from a pure water supply source 44 into the main vessel 11 through a pure water supply line 43 and, then, through the supply port 11a. A pump 41 and a valve 42 are mounted to the pure water supply line 43.

The auxiliary vessel 12, which is positioned above the main vessel 11, has a diameter slightly larger than that of the main vessel 11. On the other hand, these main and auxiliary vessels 11 and 12 are substantially equal to each other in height. The bottom portion of the auxiliary vessel 12 and an upper portion of the main vessel 11 overlap with each other to form a first overflow portion 12a, which communicates with a drain line 46 through a valve 45. Further, a second overflow portion 13a is formed along the outer circumferential surface at the upper end portion of the auxiliary vessel 12. The second overflow portion 13a communicates with a drain line 49 via a valve 48.

Figure 3:
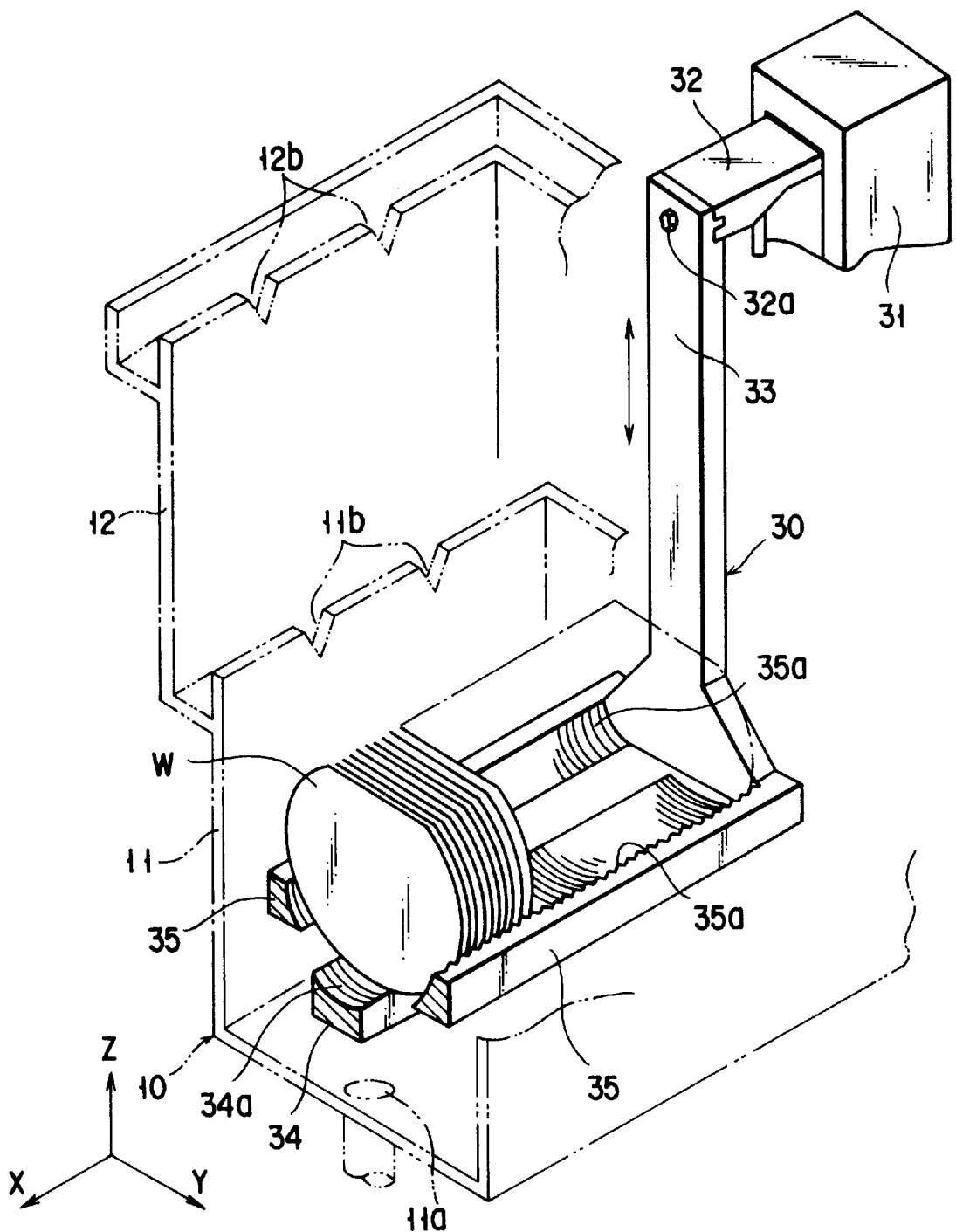
FIG. 3 is an oblique view showing the wafer boat positioned within the processing vessel.

As shown in FIG. 3, a plurality of recesses 11b are formed in the open upper end of the main vessel 11. Likewise, a plurality of recesses 12b are formed in the open upper end of the auxiliary vessel 12. The washing solution (pure water) 101 housed in these vessels 11 and 12 is allowed to flow into the overflow portions 12a, 13a through these recesses 11b, 12b.

The wafer boat 30 is joined to a lift mechanism 31 through arms 32 and 33 so as to be movable in a vertical direction between the main vessel 11 and the auxiliary vessel 12. Three holding rods 34 and 35 are horizontally mounted to the lower end portion of the arm 33. A plurality of grooves 34a are formed in the central holding rod 34. Likewise, a plurality of grooves 35a are formed in each of the side holding rods 35. These grooves 34a and 35a are arranged at a uniform pitch so as to allow 50 wafers W to be equidistantly held by the wafer boat 30. These holding rods 34, 35 are formed of a high strength resin such as polyether-etherketone (PEEK), which is excellent in its corrosion resistance and heat resistance.

Figure 4A:
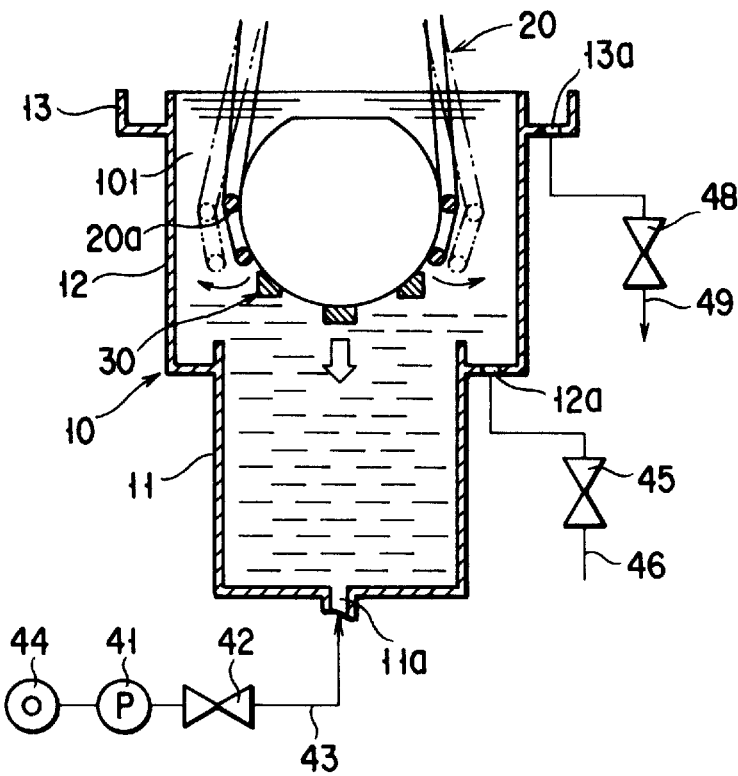
FIGS. 4A and 4B are cross sectional views collectively showing the processing vessel in conjunction with the operation of the apparatus shown in FIG. 1.
Figure 4B:
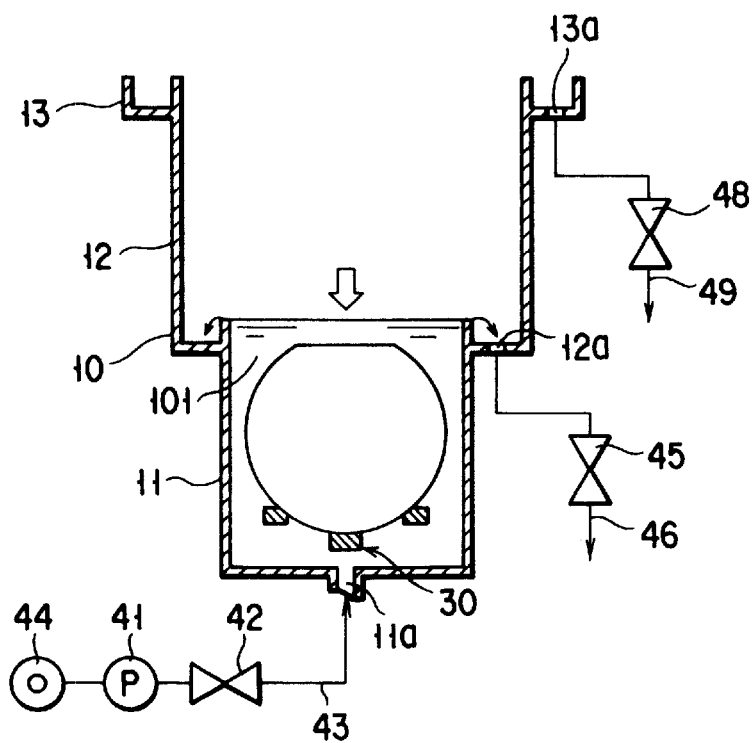
Figure 5:
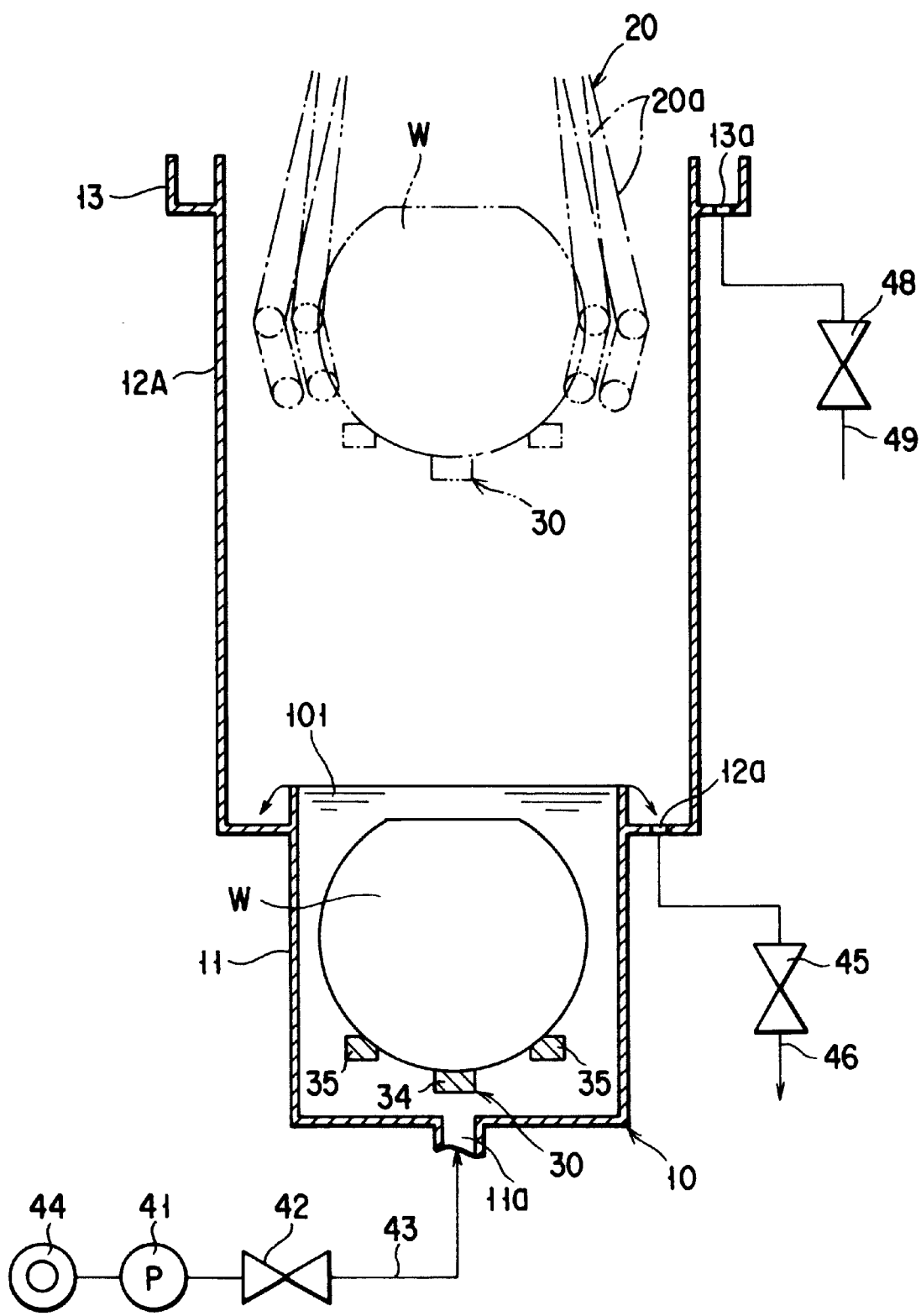
FIG. 5 is a cross sectional view showing the construction of another processing vessel.

FIGS. 4A ad 4B collectively show how the apparatus constructed as described above is operated for washing the wafers W. In the first step, the pure water 101 is supplied into the processing vessel 10 such that the level of the pure water 101 reaches the upper end of the auxiliary vessel 12. In this step, the wafer boat 30 is positioned within the auxiliary vessel 12. Then, the wafer chuck 20a is moved downward into the auxiliary vessel 12 so as to allow the wafers W to be collectively transferred onto the wafer boat 30, as shown in FIG. 4A. Under this condition, the boat 30 is moved downward to allow the wafers W to be positioned within the main vessel 11. After or simultaneously with movement of the wafers W into the main vessel 11, the pure water 101 within the auxiliary vessel 12 is discharged into the drain line 46. Then, the pure water 101 is supplied from the supply source 44 into the main vessel 11. At the same time, the pure water is allowed to overflow the main vessel 11 for a predetermined period of time so as to permit the overflowing pure water to flow into the overflow portion 12a. It follows that the pure water 101 flows upward within the main vessel 11. As a result, the wafers W within the main vessel 11 are washed with the pure water 101. After the water washing treatment, the wafer boat 30 is moved upward for transfer of the wafers W from the boat 30 onto the wafer chuck 20a. Further, the transfer device 20 serves to transfer the wafers W to the next step.

Figure 6A:
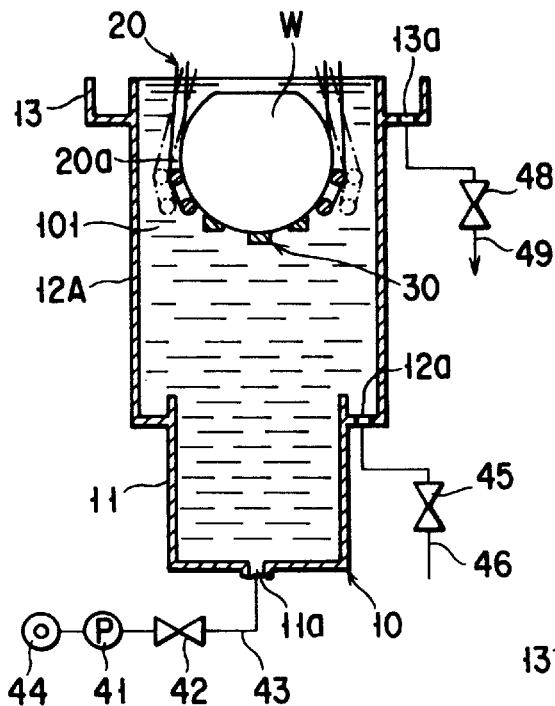
FIGS. 6A, 6B and 6C are cross sectional views collectively showing the processing vessel in conjunction with the operation of the apparatus shown in FIG. 1.
Figure 6B:
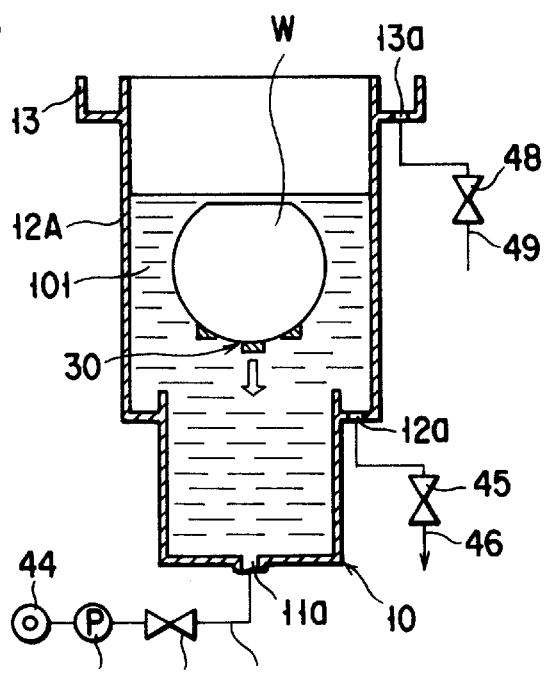
Figure 6C:
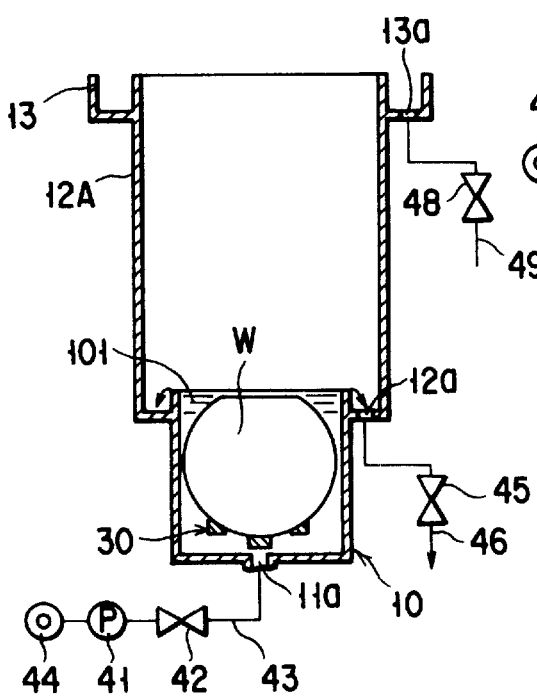

FIGS. 5, 6A, 6B and 6C collectively show a wafer washing apparatus according to another embodiment of the present invention. The processing vessel 10 included in this embodiment comprises an upper auxiliary vessel 12A having a height about two times as much as that of the main vessel 11. In this embodiment, the wafers W are moved over a longer distance when transferred from the auxiliary vessel 12A to the main vessel 11, as shown in FIGS. 6A to 6C. As a result, the wafers W are kept in contact with the flowing pure water 101 for a longer time, leading to a further improved wafer washing efficiency.

FIGS. 7, 8A, 8B and 8C collectively show a wafer washing apparatus according to another embodiment of the present invention. In this embodiment, a plurality of nozzles 50 are mounted within the main vessel 11 so as to allow a chemical solution 102 or the washing solution 101 to be spurted from these nozzles 50 onto the wafers W. These nozzles 50 are connected via switching valves 51 and 57 to each of a pure water supply line 43 and an HF solution supply line 58a. As seen from FIG. 7, a pure water supply source 44, a pump 41, a valve 42 and the switching valve 51 are mounted to the pure water supply line 43. On the other hand, an HF solution supply source 58, a pump 58b, a valve 58c and the switching valve 57 are mounted to the HF solution supply line 58a. An aqueous solution of hydrofluoric acid is housed in the HF solution supply source 58.

Further, the nozzle 50 is incorporated in an HF solution circulating line 52. The line 52 consists of the main vessel 11, the overflow portion 12a, a valve 53, the switching valves 51, 57, an additional switching valve 59a, a pump 54, a damper 55, a filter 56 and the nozzle 50. Incidentally, a drain pipe 59 is connected to the HF solution circulating line 52 via the switching valve 59a.

The nozzles 50 arranged within the main vessel 11 are positioned on both sides below the wafers W held within the main vessel 11. Each of these nozzles 50 has a plurality of spurting ports which are arranged at a uniform pitch in the arranging direction of the wafers W, i.e., in the direction of X-axis. Further, a drain port 11c, which communicates with a drain line 61 including a valve 60, is formed through the bottom wall of the main vessel 11.

In operating the apparatus of the construction described above, the pure water 101 is supplied first into the processing vessel 10 such that the level of the pure water reaches the upper end of the auxiliary vessel 12. In this step, the wafer boat 30 is positioned within the auxiliary vessel 12. Incidentally, a chemical solution can be housed in the main vessel 11 alone in the initial stage of the treatment so that the wafer W may be subjected directly to the washing with the chemical solution. Then, the wafer chuck 20a is moved downward into the auxiliary vessel 12 so as to allow the wafers W to be collectively transferred onto the wafer boat 30, as shown in FIG. 8A, followed by moving the boat 30 downward so as to permit the wafers 30 to be positioned within the main vessel 11. After or simultaneously with movement of the wafers W into the main vessel 11, the pure water 101 within the auxiliary vessel 12 is discharged into the drain line 46.

In the next step, the switching valves 51, 57, 59a are operated to allow the HF solution 102 to be spurted from the nozzles 50 onto the wafers W. In this step, the HF solution 102 is allowed to overflow the main vessel 11 into the first overflow portion 12a for a predetermined period of time. The overflowing HF solution is brought back into main vessel 11 through the circulating line 52, with the result that the wafers W within the main vessel 11 are washed with the chemical solution (HF solution). Incidentally, it is possible to discharge the overflowing chemical solution 102 to the outside in place of circulating the solution 102 back into the main vessel 11.

After the washing treatment with the chemical solution, the switching valves 51, 57 and 59a are operated again so as to allow the pure water 101 to be spurted from the nozzles 50 onto the wafers W, as shown in FIG. 8C. In this step, the pure water is allowed to overflow the main vessel 11 into the first overflow portion 12a for a predetermined period of time. The overflowing pure water 101 discharged to the outside through the drain line 59. In this fashion, the wafers W within the main vessel 11 are washed with water. After the water wash treatment, the wafer boat 30 is moved upward so as to permit the wafers W to be transferred from the boat 30 to the wafer chuck 20a. Then, the wafers W are transferred by the transfer device 20 to the next step.

Figure 7:
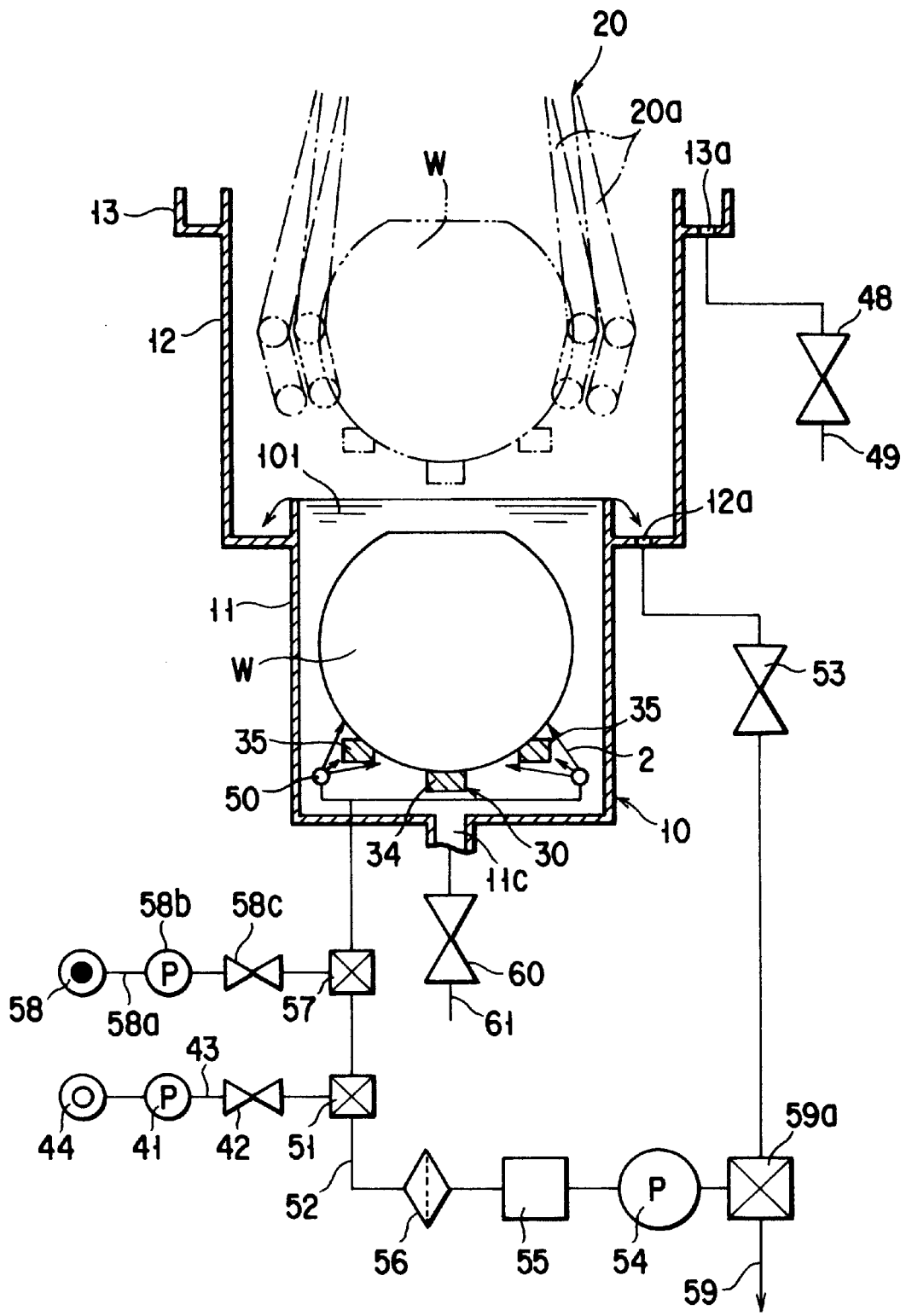
FIG. 7 is a cross sectional view showing the construction of another processing vessel.
Figure 9:
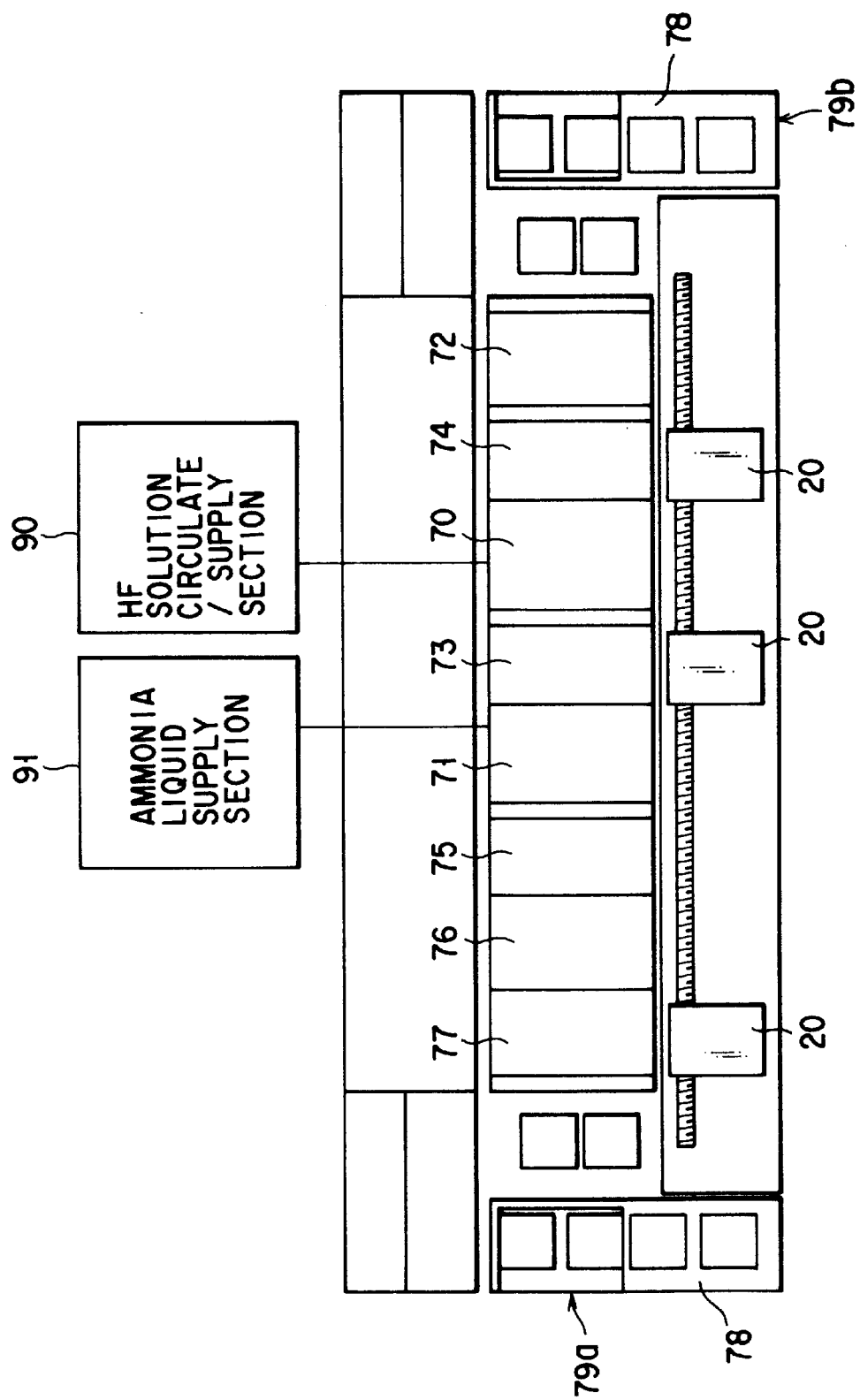
FIG. 9 is a plan view schematically showing the construction of a conventional washing-drying apparatus.

In the embodiment described above, both the washing treatment with the chemical solution and the water wash treatment are carried out within a single processing vessel, making it possible to miniaturize the apparatus. To be more specific, if the processing vessel 10 of the construction described above is mounted in a final washing unit 70 shown in FIG. 9, which is directed to a conventional processing system, it is possible to omit one water washing unit. As shown in FIG. 9, the conventional system comprises a processing unit 71 with a chemical solution. In the case of using the processing vessel 10 constructed as shown in FIG. 7 in the final washing unit 70 included in the conventional system shown in FIG. 9, the wafers W washed with an ammonia water in a chemical solution washing unit 71 are washed with water in the final washing unit 70. Further, immediately after the water wash in the final washing unit 70, the wafers W are treated with an HF solution, leading to an improved through-put.

In the conventional processing system shown in FIG. 9, the chemical solution processing unit 71 is arranged upstream of the final washing unit 70 with a water washing unit 73 interposed therebetween. In the case where the processing vessel 10 shown in FIG. 7 is employed in the final washing unit 70, however, it is possible to omit the water washing unit 73 because both water wash and washing with a chemical solution are carried out in the final washing unit 70.

Figure 10:
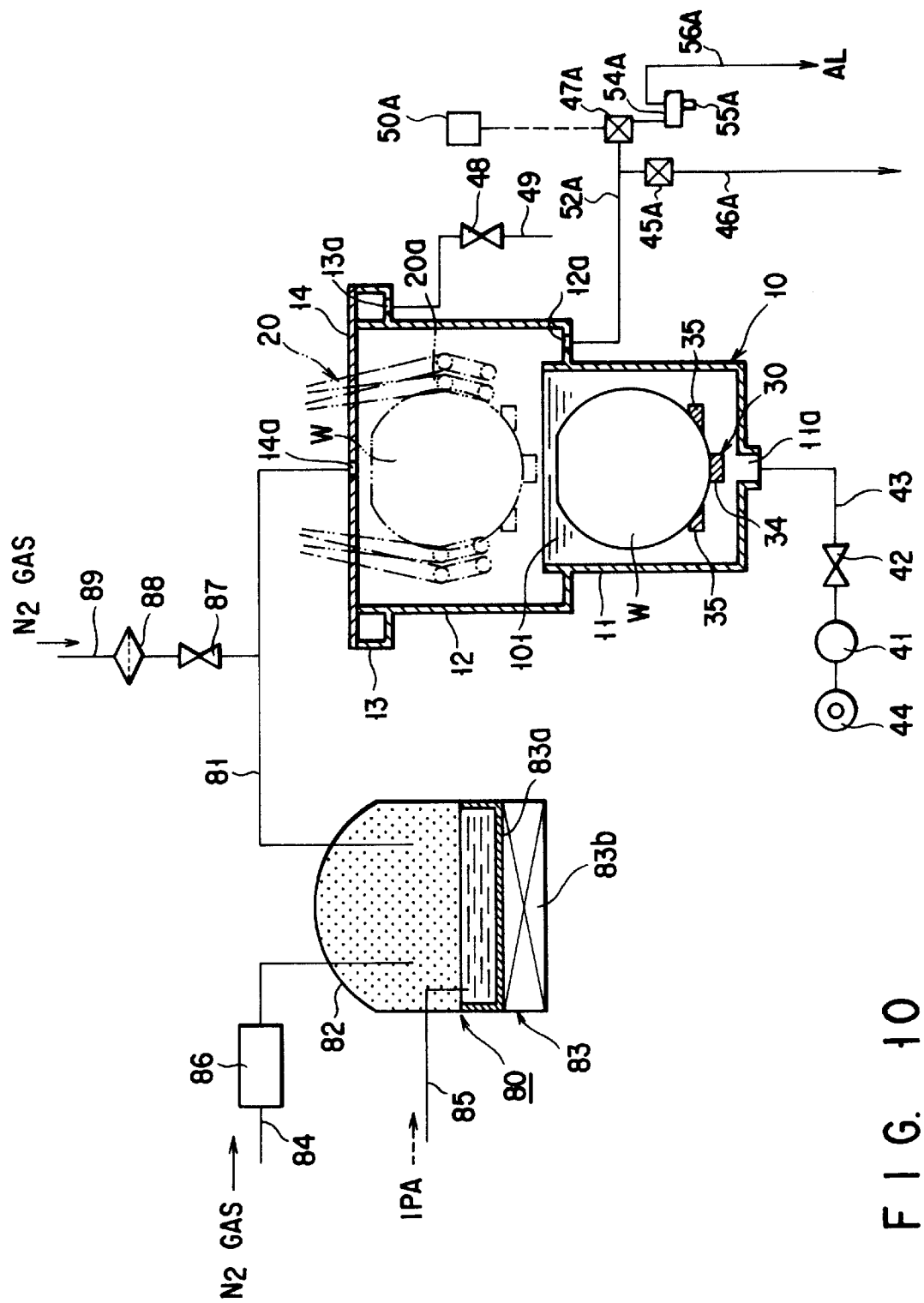
FIG. 10 is a cross sectional view showing the construction of another processing vessel.
Figure 11:
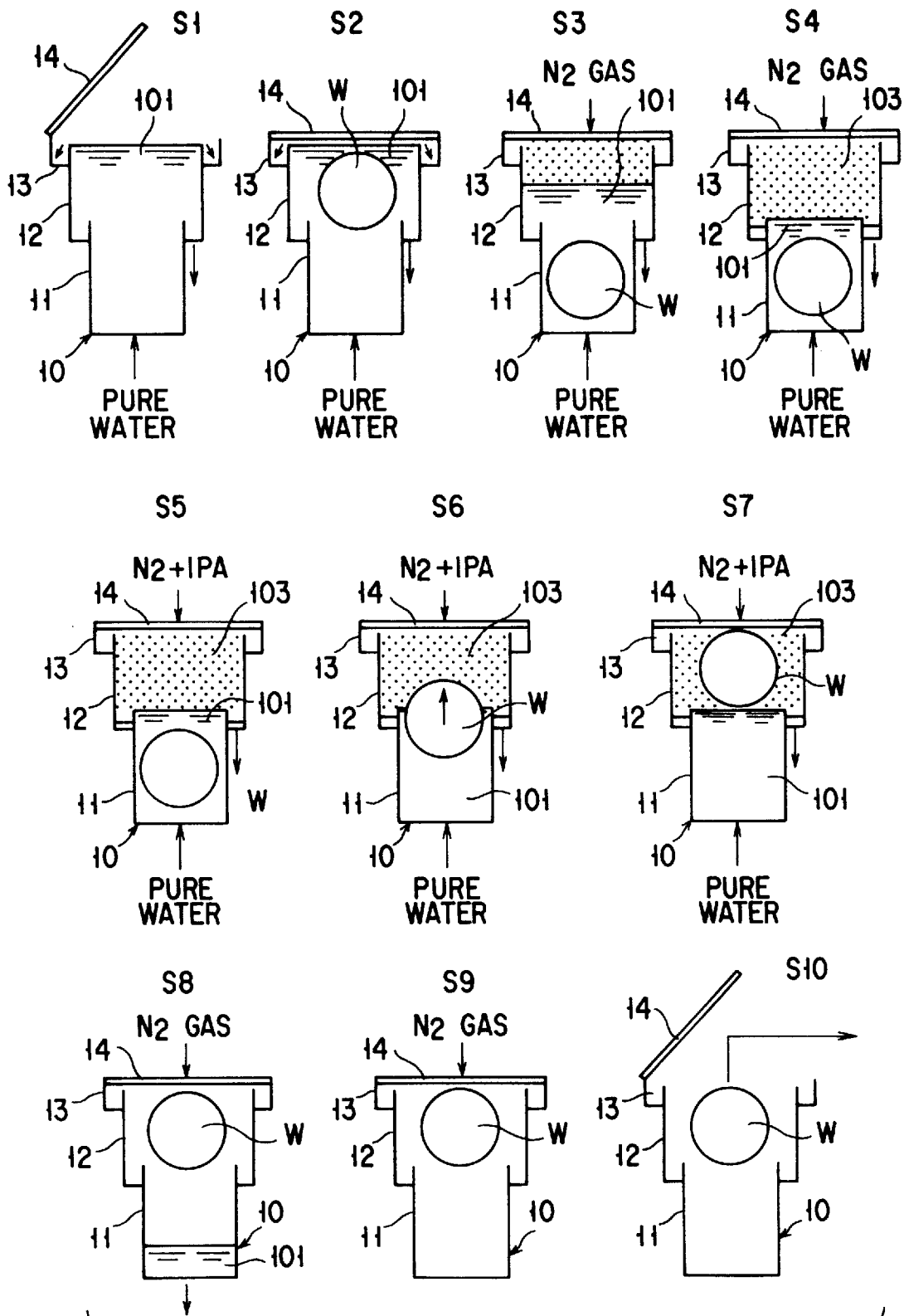
FIG. 11 is a flow chart showing steps S1 to S10 of a method according to another embodiment of the present invention.

FIGS. 10 and 11 collectively show a wafer washing-drying apparatus according to another embodiment of the present invention. In this embodiment, the processing vessel 10 is constructed to permit the wafers W to be dried within the auxiliary vessel 12. Specifically, a lid 14 is removably mounted to close the upper open end of the auxiliary vessel 12. Also, an IPA vapor supply port 14a formed through the lid 14 communicates via a line 81 with a hermetically closed vessel 82 included in an IPA vapor forming device 80 so as to permit an IPA vapor to be introduced into the auxiliary vessel 12.

The vessel 82 of the IPA vapor forming apparatus 80 communicates with an IPA supply source (not shown) via line 85. A liquid reservoir dish 83a is formed in the bottom portion of the vessel 82. Further, a heater 83b is arranged below the liquid reservoir dish 83a. A vapor forming section 83 is formed of these vessel 82, liquid reservoir dish 83a and heater 83b. The vessel 82 also communicates with a nitrogen gas supply source (not shown) via a gas supply line 84. The nitrogen gas within the line 84 is heated to a desired temperature by a heater 86 mounted to the line 84.

Further, the IPA vapor supply line 81 communicates with another nitrogen gas supply source (not shown) through a line 89 to which are mounted a valve 87 and a filter 88.

The apparatus shown in FIG. 10 also comprises a resistivity measuring circuit including a resistivity meter 54A. As shown in the drawing, the resistivity meter 54A communicates with the first overflow portion 12a via an overflow line 52A. A drain line 46A having a switching valve 45A mounted thereto is branched from the overflow line 52A. The resistivity meter 54A is arranged downstream of the branched portion. On the other hand, a switching valve 47A is arranged upstream of the resistivity meter 54A, with a drain line 56A connected to the resistivity meter 54A on the downstream side. It should be noted that the operation of the switching valves 45A and 47A are controlled by a controller 50A.

The apparatus constructed as described above is operated for washing-drying semiconductor wafers W as shown in steps S1 to S10 given in FIG. 11. A pure water 101 is supplied into the processing vessel 10 so as to cause the pure water to overflow the processing vessel 10 (step S1). At the same time, the wafer boat (not shown) is positioned within the auxiliary vessel 12. Then, the wafers W are transferred into the auxiliary vessel 12 by operating the transfer device 20, followed by operating the wafer chuck 20a (not shown) to deliver the wafers W to the wafer boat 30 (step S2). The wafer chuck 2a is moved upward, followed by closing the lid 14 so as to hermetically close the processing vessel 10 (step S3). Under this condition, the wafers W are moved downward together with the wafer boat so as to allow the wafers W to be positioned within the main vessel 11. As a result, the wafers W are washed with water. Then, the pure water 101 within the auxiliary vessel 12 is discharged to the outside (step S4). At the same time, a nitrogen gas is supplied into the auxiliary vessel 12 so as to purge the inner space of the auxiliary vessel 12 with the nitrogen gas. It should be noted that particles within the auxiliary vessel 12 are discharged to the outside in this step together with the pure water 101.

Further, an IPA vapor carried by a nitrogen gas is introduced into the auxiliary vessel 12 so as to fill the inner space of the auxiliary vessel 12 with the IPA vapor 103 (step S5). Then, the wafers W are moved upward together with the wafer boat 30 so as to pull gradually the wafers W from within the pure water 101 positioned within the main vessel 11 (step S6). Further, the wafers W are pulled completely out of the pure water 101 within the main vessel 11 so as to bring the wafers W into contact with the IPA vapor 103 filling the auxiliary vessel 12 so as to dry the wafers W (step S7).

After completion of the wafer drying operation, the pure water 101 is discharged out of the main vessel 11 (step S8). Incidentally, the operation for discharging the pure water 101 may be performed in step S7 described above. At the same time, a nitrogen gas is introduced into the auxiliary vessel 12. Then, the pure water 101 is discharged completely out of the processing vessel 10 (step S9). Finally, the lid 14 is opened a predetermined period of time after step S9 so as to transfer the washed wafers W out of the processing vessel 10 (step S10).

As described above, both washing and drying operations are performed within the single processing vessel 10 in the embodiment shown in FIG. 10, making it possible to miniaturize the apparatus and, at the same time, to increase the through-put.

Figure 12:
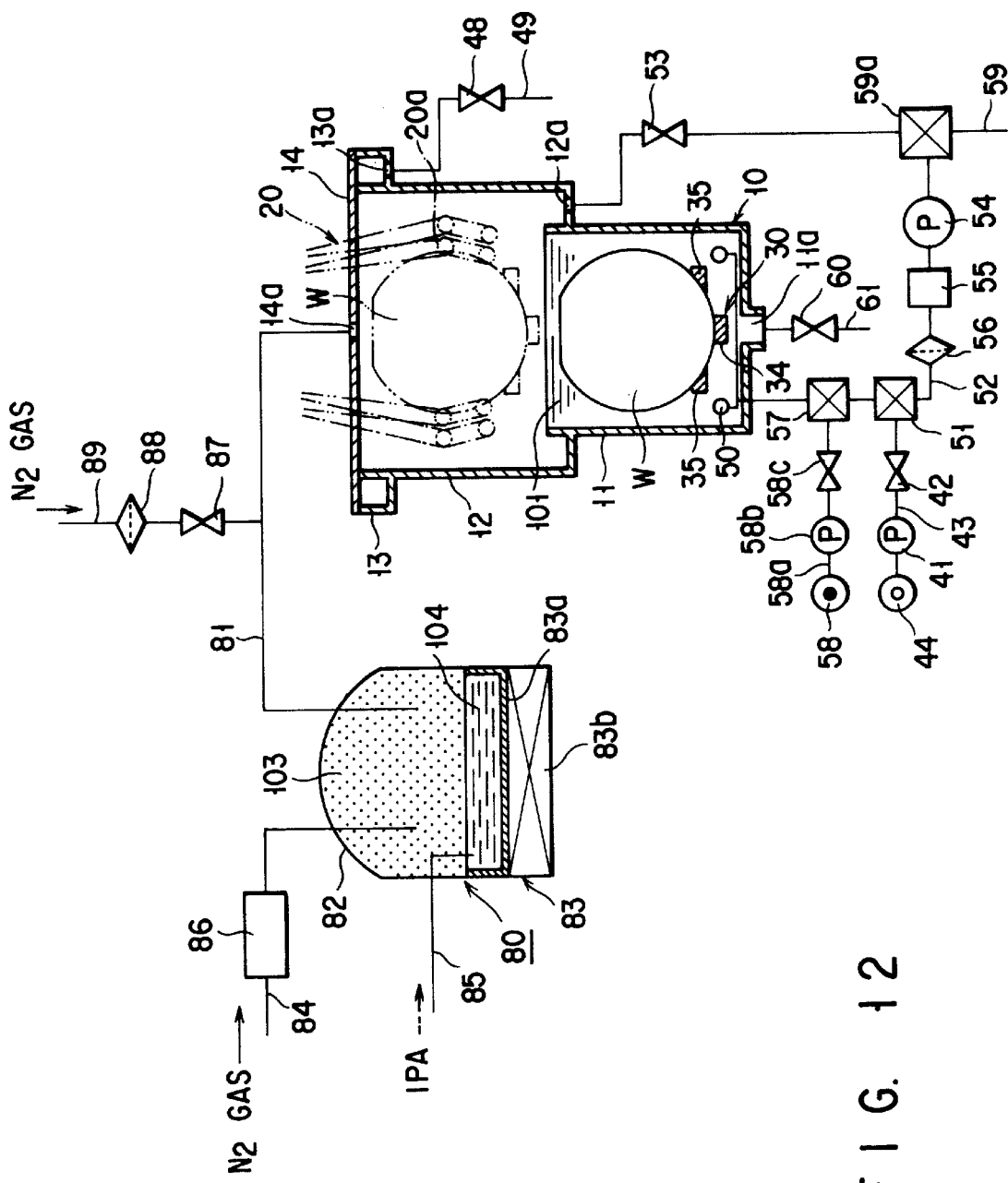
FIG. 12 is a cross sectional view showing the construction of another processing vessel.
Figure 13:
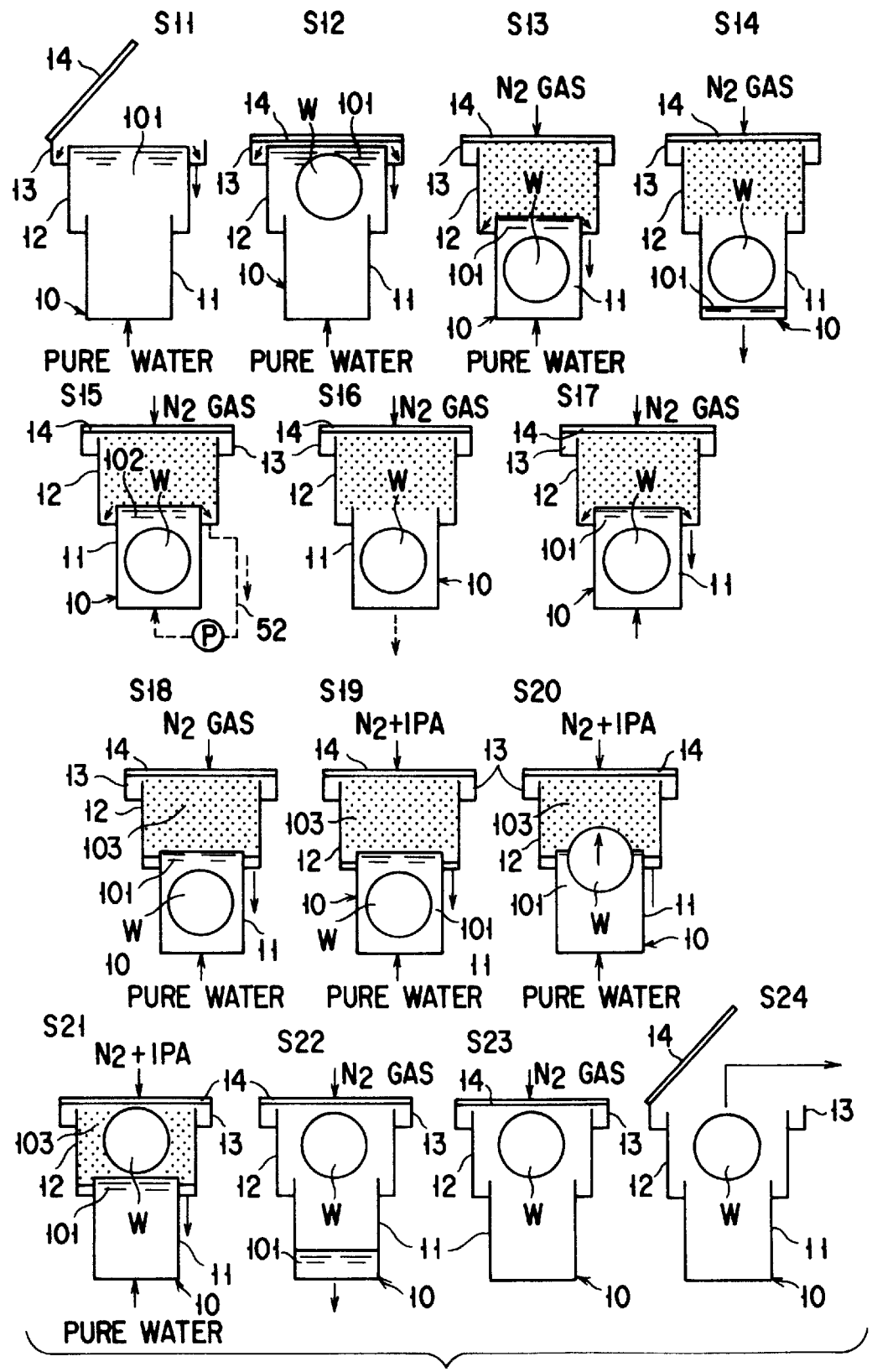
FIG. 13 is a flow chart showing steps S11 to S24 of a method according to another embodiment of the present invention.

FIGS. 12 and 13 collectively show a wafer washing-drying apparatus according to another embodiment of the present invention. In this embodiment, the processing vessel 10 is constructed such that the wafers W can be subjected to a washing treatment with a chemical solution and to a water washing treatment within the main vessel 11. Further, the washed wafers W are dried within the auxiliary vessel 12. To be more specific, nozzles 50 are arranged within the main vessel 11 so as to allow any of the chemical solution 102 and the pure water 101 to be spurted selectively from the nozzles 50. On the other hand, the IPA vapor 103 is introduced into the auxiliary vessel 12 so as to dry the wafers W.

The apparatus constructed as described above is operated for washing-drying semiconductor wafers W as shown in steps S11 to S24 given in FIG. 13. A pure water 101 is supplied into the processing vessel 10 so as to cause the pure water to overflow the processing vessel 10 (step S11). At the same time, the wafer boat (not shown) is positioned within the auxiliary vessel 12. Then, the wafers W are transferred into the auxiliary vessel 12 by operating the transfer device 20, followed by operating the wafer chuck 20a (not shown) to deliver the wafers W to the wafer boat 30 (step S12). The wafer chuck 2a is moved upward, followed by closing the lid 14 so as to hermetically close the processing vessel 10 (step S13). Under this condition, the wafers W are moved downward together with the wafer boat 30 so as to allow the wafers W to be positioned within the main vessel 11. As a result, the wafers W are subjected to a primary water wash treatment. Then, the pure water 101 within the auxiliary vessel 12 is discharged to the outside (step S14). At the same time, a nitrogen gas is supplied into the auxiliary vessel 12 so as to purge the inner space of the auxiliary vessel 12 with the nitrogen gas. It should be noted that particles within the auxiliary vessel 12 are discharged to the outside in this step together with the pure water 101.

Further, a nitrogen gas is introduced into the auxiliary vessel 12 so as to purge the inner space of the auxiliary vessel 12 with the nitrogen gas. At the same time, the HF solution 102 is spurted from the nozzles 50 onto the wafers W positioned within the main vessel 11 so as to wash the wafers W with the HF solution 102 (step S15). Incidentally, an aqueous solution of HF may be introduced into the main vessel 11 in steps S14 to S15 after discharge of the pure water from within the main vessel 11. After the washing treatment, the HF solution 102 is discharged from the main vessel 11 (step 16). Then, the pure water 101 is supplied into the main vessel 11 while spurting the pure water 101 from the nozzles 50 onto the wafers W (step 17). In this fashion, the wafers W are subjected to a secondary washing with water while allowing the pure water 101 to overflow the main vessel 11.

In the next step, the IPA vapor 103 carried by a nitrogen gas is introduced into the auxiliary vessel 12 so as to fill the auxiliary vessel 12 with the IPA vapor 103 (steps S18 and S19). Under this condition, the wafers W are moved upward together with the wafer boat 30 so as to pull gradually the wafers W out of the pure water 101 within the main vessel 11 (step S20). Then, the wafers W are pulled completely out of the pure water 101 within the main vessel 11 so as to bring the wafers W into contact with the IPA vapor 103 within the auxiliary vessel 12 so as to dry the wafers W (step S21).

After completion of the wafer drying treatment, the pure water 101 is discharged from the main vessel 11 (step S22). At the same time, a nitrogen gas is introduced into the auxiliary vessel 12. Then, the pure water 101 is discharged completely out of the processing vessel 10 (step S23). A predetermined time after step S23, the lid 14 is opened so as to transfer the wafers W out of the processing vessel 10 (step S24).

As described above, a washing with a chemical solution, a water wash and a drying treatment can be performed within the single processing vessel 10 in the embodiment shown in FIGS. 12 and 13, making it possible to miniaturize the apparatus and, at the same time, to increase the throughput.

Alternatively, the apparatus constructed as shown in FIG. 12 is operated for washing-drying semiconductor wafers W as shown in steps S31 to S44 given in FIG. 14. Specifically, a pure water 101 is supplied into the processing vessel 10 so as to cause the pure water to overflow the processing vessel 10 (step S31). At the same time, the wafer boat (not shown) is positioned within the auxiliary vessel 12. Then, the wafers W are transferred into the auxiliary vessel 12 by operating the transfer device 20, followed by operating the wafer chuck 20a (not shown) to deliver the wafers W to the wafer boat 30 (step S32). Further, the wafer chuck 2a is moved upward, followed by closing the lid 14 so as to hermetically close the processing vessel 10 (step S33). Under this condition, the wafers W are moved downward together with the wafer boat 30 so as to allow the wafers W to be positioned within the main vessel 11. As a result, the wafers W are subjected to a primary water wash treatment. Then, the pure water 101 within the auxiliary vessel 12 is discharged to the outside (step S34). At the same time, a nitrogen gas is supplied into the auxiliary vessel 12 so as to purge the inner space of the auxiliary vessel 12 with the nitrogen gas. It should be noted that particles within the auxiliary vessel 12 are discharged to the outside in this step together with the pure water 101.

In the subsequent step, a nitrogen gas is introduced into the auxiliary vessel 12 so as to purge the inner space of the auxiliary vessel 12 with the nitrogen gas. At the same time, the HF solution 102 is allowed to overflow the main vessel 11 (step S35). Incidentally, an aqueous solution of HF may be introduced into the main vessel 11 in steps S34 to S35 after discharge of the pure water from within the main vessel 11. Then, after the treatment with the HF solution 102, the HF solution 102 is discharged from the main vessel 11 (step S36), followed by supplying the pure water 101 into the main vessel 11 (step S37). As a result, the wafers W are subjected to a secondary water wash while allowing the pure water 101 to overflow the main vessel 11.

In the next steps, the IPA vapor 103 carried by a nitrogen gas is introduced into the auxiliary vessel 12 so as to fill the auxiliary vessel 12 with the IPA vapor 103 (steps S38 and S39). Then, the wafers W are moved upward together with the wafer boat 30 so as to pull the wafers W gradually out of the pure water 101 within the main vessel 11 (step S40). Further, the wafers W are pulled completely out of the pure water 101 within the main vessel 11 so as to bring the wafers W into contact with the IPA vapor 103 within the auxiliary vessel 12, thereby to dry the wafers W (step S41).

After completion of the wafer drying operation, the pure water 101 is discharged from the main vessel 11 and, at the same time, a nitrogen gas is introduced into the auxiliary vessel 12 (step S42). Then, the pure water 101 within the processing vessel 10 is discharged completely in step S43. Finally, a predetermined period of time after completion of step S43, the lid 14 is opened so as to transfer the wafers W out of the processing vessel 10 (step S44).

In the embodiment described above, the wafer boat 30 is moved upward so as to bring the wafers W into contact with the IPA vapor. Alternatively, it is possible to discharge the pure water 101 from the main vessel 11, with the wafers W held stationary within the main vessel 11, so as to bring the wafers W into contact with the drying gas of the IPA vapor.

FIGS. 15 to 22 collectively show a washing-drying apparatus 115 according to another embodiment of the present invention. As seen from the drawings, the washing-drying apparatus 115 comprises a processing vessel 120, an IPA vapor supply line 130, an IPA vapor forming section 140, a nitrogen gas supply line 150 and a controller 160.

The processing vessel 120 includes an inner vessel 120a, an outer vessel 120b, and a wafer boat 121. As shown in FIG. 16, the wafer boat 121 includes a plurality holding rods capable of vertically holding 50 semiconductor wafers W at a uniform pitch. These 50 wafers are transferred from the transfer mechanism 20 (not shown) onto the wafer boat 121.

A supply-discharge port 124 is formed at a bottom 120c of the inner vessel 120a so as to communicate with a discharge line L1 for discharging the pure water 101 from the inner vessel 120a and with a supply line L2 for supplying the pure water 101 into the inner vessel 120a. For example, the pure water 101 is recovered in a recovery device 123 through the supply-discharge port 124 and the discharge line L1. On the other hand, a chemical solution is recovered in the recovery device 123 via a valve V1 and the discharge line L1.

A discharge port 122 is formed at a bottom portion of the outer vessel 120b. The pure water after the washing treatment is recovered in the recovery device 123 through the discharge port 122. A pump P and a valve V2 are mounted to the supply line L2. It should be noted that the pure water 101 is supplied from a pure water supply source (not shown) into the inner vessel 120a though a line 119.

A fluid flow straightening means 125, which comprises a flow straightening plate 125a and a diffusion plate 125b, is mounted right above the supply-discharge port 124. A large number of small holes 125c are formed in the flow straightening plate 125a so as to straighten the flow of the pure water introduced through the supply-discharge port 124.

Figure 15:
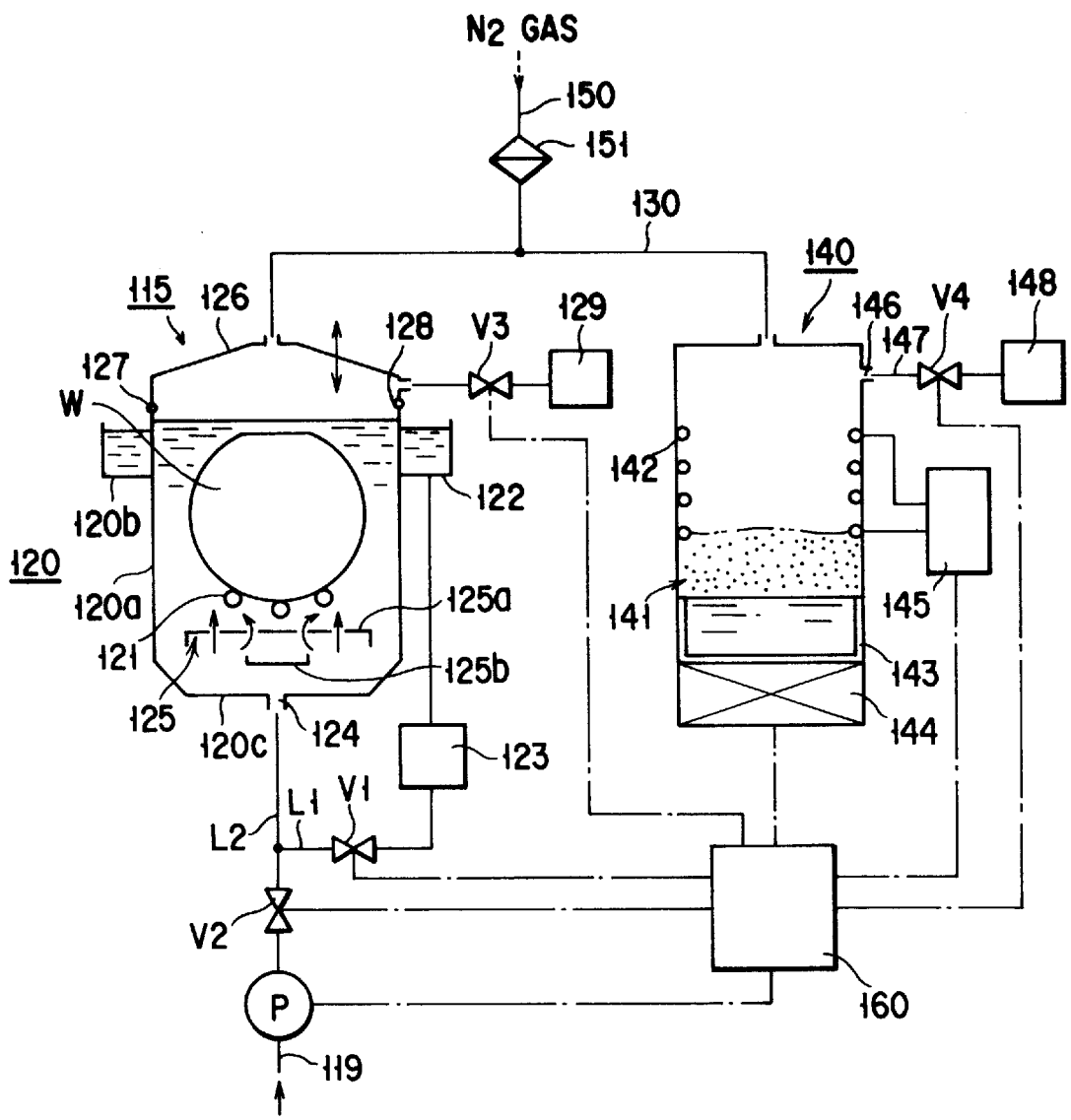
FIG. 15 is a cross sectional view showing the processing vessel, drying gas-forming apparatus and peripheral circuits thereof.
Figure 18:
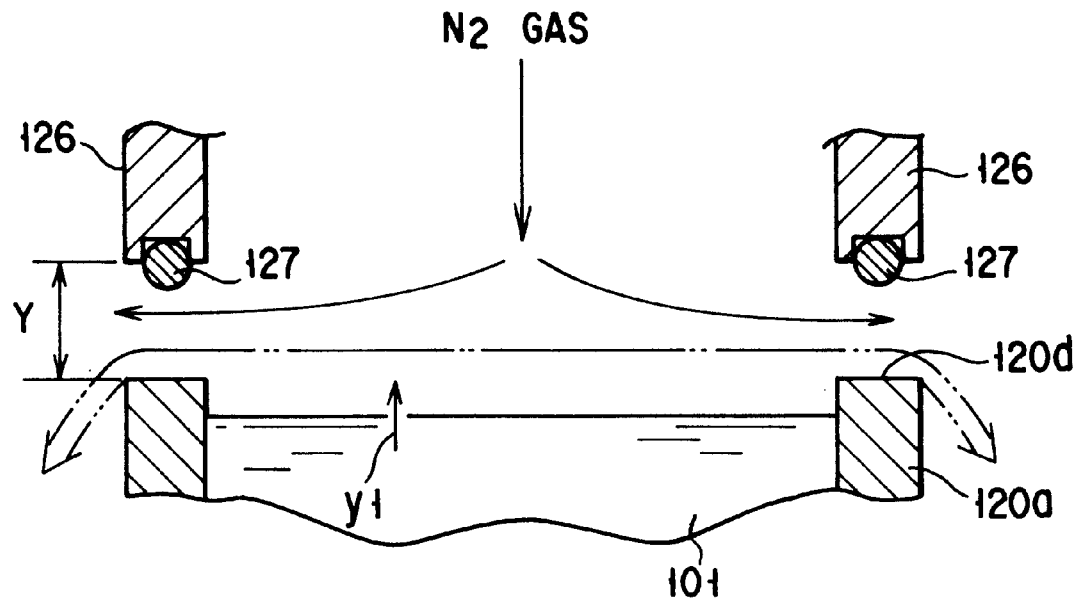
FIG. 18 is a cross sectional view schematically showing in a magnified fashion a part of the processing vessel.
Figure 19:
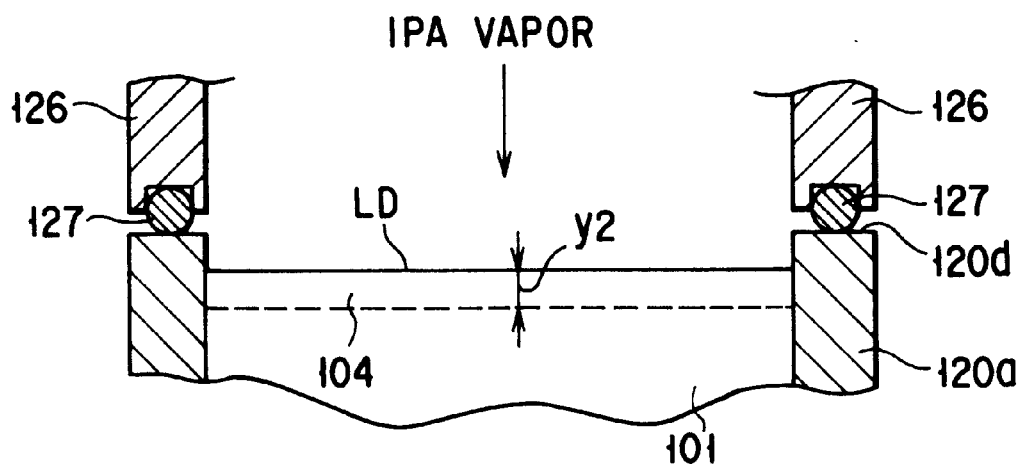
FIG. 19 is a cross sectional view schematically showing in a magnified fashion a part of the processing vessel.

As shown in FIGS. 15, 18 and 19, a cup 126 is mounted above the processing vessel 120. The cup 126, which is supported movable in a vertical direction by a lift mechanism (not shown), is removably mounted to the processing vessel 120. An O-ring 127 is mounted to the lower end portion of the cup 126. As shown in FIG. 19, the O-ring 127 abuts against the upper end portion of the inner vessel 120a so as to hermetically close the inner space of the processing vessel 120. Each of the IPA vapor 103 and a nitrogen gas can be supplied through a supply line 130 into the processing vessel 120. It should be noted that a heater (not shown) is mounted to surround the outer circumferential surface of the cup 126 so as to heat promptly the inner space of the processing vessel 120 to temperatures higher than the boiling point of the IPA vapor 103, preferably to 80° C. or more.

A discharge port 128, which communicates with a discharge mechanism 129 via a valve V3, is formed in the cup 126. Incidentally, it is possible to form the gas supply line 130 and the discharge port 128 in the processing vessel 120.

The IPA vapor forming device 140 includes a vapor forming section 141 and a cooling section 142. The IPA vapor 103 within the vapor forming section 141 is cooled in the cooling section 142 for condensing the IPA vapor. An IPA liquid storing section 143 is formed in a bottom portion of the vapor forming section 141. Further, a heater 144 is arranged in a lower portion of the IPA liquid storing section 143. As seen from the drawings, the cooling section 142 is formed to extend spirally along the inner wall in an upper region of the vapor forming section 141. A coolant is supplied from a coolant supply means 145 into the spiral cooling section 142.

A discharge port 146 is formed in the side wall in an upper region of the vapor forming section 141. The discharge port 146 communicates with a discharge line 147 via a valve V4. Further, the discharge line 147 communicates with a discharge means 148. It should be noted that the valves V1 to V4, pump P and the coolant supply means 145 are independently controlled by the control means 160.

Figure 17:
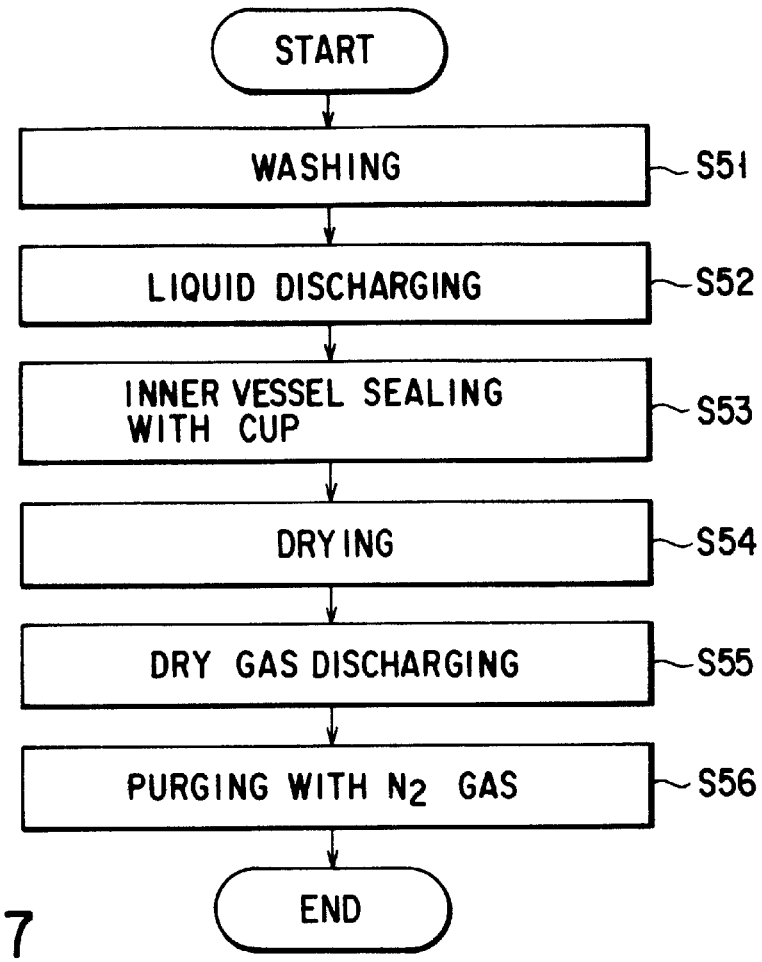
FIG. 17 is a flow chart showing steps S51 to S56 of a method according to another embodiment of the present invention.

FIG. 17 shows how the apparatus of the construction described above is used for subjecting the wafers W to the washing-drying treatment. Specifically, in the first step (step S51), the cup 126 is opened so as to introduce the wafer chuck 20a holing 50 semiconductor wafers W at a uniform pitch into the processing vessel 120. Then, the wafers W are transferred onto the wafer boat 121, followed by moving upward the wafer chuck 20a. Under this condition, the pure water 101 is supplied to the processing vessel 120 so as to dip the wafers W in the pure water 101 while allowing the pure water to overflow the processing vessel 120. In this step, the pump P and the valve V2 are operated by the control means 160 in accordance with a predetermined processing program so as to permit the pure water 101 to flow at a predetermined flow rate into the inner vessel 20a for a predetermined period of time. Alternatively, the pure water flow rate into the inner vessel 20a may be changed stepwise. Further, it is also possible to continue to supply the pure water 101 until the electrical resistance value of the pure water within the inner vessel 20a reaches a predetermined value. In this fashion, the wafers W are washed with the pure water (step S51).

After completion of the washing with the pure water, the cup 126 is moved toward the inner vessel 20a so as to keep a distance "d" between the O-ring 127 of the cup 126 and an upper surface 120d of the inner vessel 120a at a predetermined value Y (step S52), as shown in FIG. 18. Under this condition, the pump P is driven to supply a pure water through the supply-discharge port 124 into the inner vessel 120a, while supplying a nitrogen gas from a gas supply source into the cup 126 by operating the control means 160. As a result, the surface level of the pure water 101 is moved upward so as to cause the pure water to overflow the upper surface 120d of the inner vessel 120a. It should be noted that, in step S52, the nitrogen gas introduced into the cup 126 permits the particles, which are attached to the inner surface, etc. of the cup 126, to be discharged to the outside through the clearance formed between the cup 126 and the inner vessel 120a. Further, the particles floating on the surface of the pure water are also discharged to the outside in accordance with the nitrogen gas introduction into the cup 126.

It should be noted that, when the pure water 101 is allowed to overflow the upper surface 120d of the inner vessel 120a, it is desirable to provide the distance Y, which is large enough to prevent the O-ring 127 of the cup 126 from contacting the pure water 101, between the lower surface of the cup 126 and the upper surface 120d of the inner vessel 120a. If the overflowing pure water 101 is brought into contact with the O-ring 127 of the cup 126, the particles floating on the pure water 101 tend to be attached to the wafers W.

It should also be noted that, where the particles floating on the surface of the pure water are unlikely to be attached to the O-ring 127 of the cup 126 or where the detrimental effect given by the particle attachment is negligibly small, it is possible for the overflowing pure water 101 to be brought into contact with the O-ring 127 so that the particles attached to the O-ring 127 may be washed away by the overflowing pure water. A predetermined period of time later, the valve V2 is opened by the control means 160 so as to stop supplying the pure water into the inner vessel 120a.

During the washing step S51 and the liquid discharging step S52, the IPA vapor 103 is formed in the drying gas forming section 140. The IPA vapor 103 thus formed is condensed by a coolant supplied from the coolant supply means 145 to the cooling pipe, with the result that the IPA vapor 103 is inhibited from being supplied into the drying gas supply line 130. In this step, the valve V4 is kept closed.

In the next step, the cup 126 is moved toward the inner vessel 120a so as to bring the O-ring 127 of the cup 126 into contact with the upper surface 120d of the inner vessel 120a, as shown in FIG. 19, so as to hermetically seal the processing vessel 120 (step S53). Then, the IPA vapor 103 is supplied into the hermetically sealed processing vessel 120 so as to fill the inner space of the processing vessel 120 with the IPA vapor 103 and, thus, to dry the wafers W (step S54). As shown in FIG. 19, an IPA liquid layer 104 of a predetermined concentration is formed in this step in a depth y2 from the liquid surface SD of the pure water within the inner vessel 120a.

A predetermined period of time later, the IPA vapor 103 is discharged in step S55 from within the processing vessel 120, followed by introducing a nitrogen gas into the processing vessel 120 for the purging purpose in step S56. Finally, the cup 126 is opened so as to transfer the wafers W out of the processing vessel 120.

Figure 20:
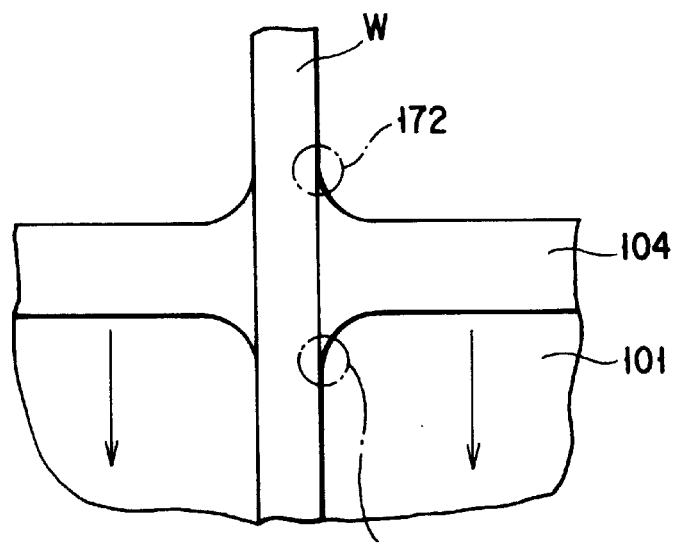
FIG. 20 schematically shows in a magnified fashion the contact interface between a wafer and a washing solution.

FIG. 20 shows the drying mechanism of the wafers W in the step of discharging the pure water from within the processing vessel. Specifically, when the pure water 101 is discharged from within the inner vessel 120a through the supply-discharge port 124 at a predetermined flow rate as denoted by arrows in FIG. 20, the upper surface of the IPA liquid layer 104 is upheaved to form a projection 172 at the interface with the wafer W. On the other hand, the lower surface of the IPA liquid layer 104 in direct contact with the pure water 101 is depressed at the interface with the wafer W to form a recess 173. It should be noted that the recess 173 is formed depending on the wettability of IPA regardless of the surface condition of the wafer W. As a result, the surface of the wafer W is made hydrophobic. Since the wafer W exhibits a hydrophobic surface condition, the particles (not shown), even if contained in the pure water 101, are not attached to the wafer W which has been pulled up. Further, since the wafer W exhibits a hydrophobic surface condition, the upper surface of the pure water 101 is also depressed at the interface with the wafer W so as to form the recess 173. It follows that droplets of the pure water 101 are not attached to the wafer W which has been pulled up. Under this condition, the wafer W which has been pulled out of the pure water 101 is dried with the IPA vapor 103.

In the next step, i.e., step S55, the exhaust means 148 is driven with the valve V4 opened, so as to discharge the IPA vapor 103 remaining within the drying gas supply line 130. After the discharge of the IPA vapor 103 has been performed for a predetermined period of time, a nitrogen gas is supplied into the drying gas supply line 130 in step S56 so as to substitute the nitrogen gas atmosphere within the supply line 130. These steps S51 to S56 are repeated so as to wash and dry the 50 wafers W in a single lot successively.

Incidentally, the resistivity meter 55A is mounted downstream of the first overflow portion 12a, as shown in FIG. 10, so as to measure the resistivity of the washing solution 101 overflowing the main vessel 11. The resistivity meter 55A is mounted to a cell 54A which communicates with the overflow line 52A via the valve 47A. A drain line 56A communicating with a dilute waste liquid line AL is connected to the bottom of the cell 54A. On the other hand, the valve 47A controlled by the controller 50A is mounted upstream of the cell 54A. Further, the other drain line 46A having the valve 45A mounted thereto is branched from the overflow line 52A upstream of the valve 47A.

Figure 21:
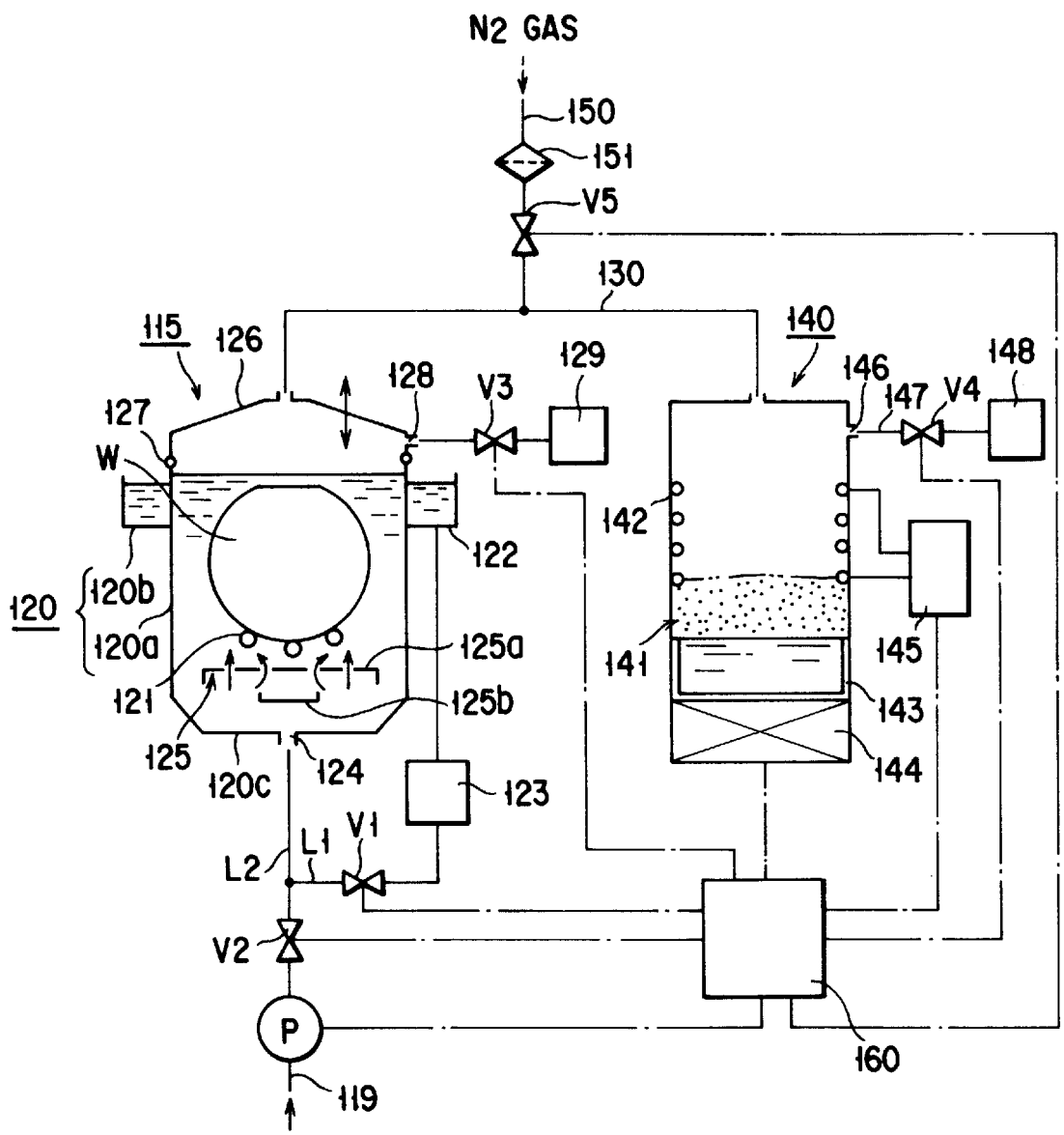
FIG. 21 is a cross sectional view showing the processing vessel, drying gas-forming apparatus and peripheral circuits thereof.
Figure 23:
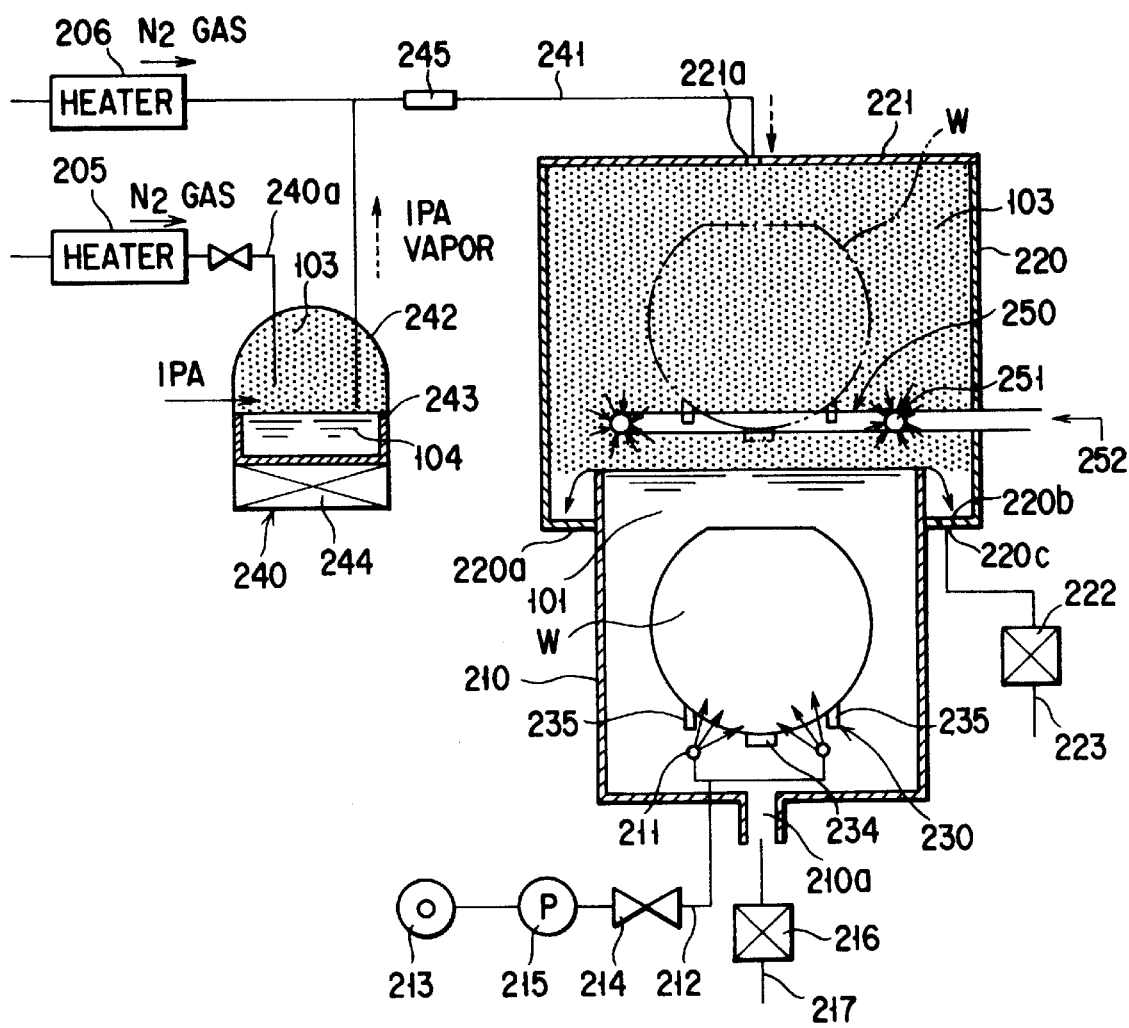
FIG. 23 is a cross sectional view showing the processing vessel, drying gas-forming apparatus and peripheral circuits thereof.

FIG. 21 shows another embodiment of the present invention. In this embodiment, the IPA vapor 103 remaining within the processing vessel 120 is discharged after the drying operation. At the same time, a nitrogen gas is substituted within the processing vessel 120. To be more specific, a valve V5 is mounted to the nitrogen gas supply line 150 communicating with the supply line 130. The valve V5 is opened or closed on the basis of a command signal generated from the control means 160.

It should be noted that, if the valve V4 of the discharge line 147 and the valve V5 of the nitrogen gas supply line 150 are opened, the IPA vapor 103 remaining within the supply line 130 is discharged to the outside by the pressure of the nitrogen gas flowing into the supply line 130. At the same time, the nitrogen gas is substituted within the supply line 130. In this fashion, the operations in steps S55 and S56 can be performed simultaneously, leading to a marked improvement of the through-put.

FIG. 22 shows another embodiment of the present invention. In this embodiment, the IPA vapor 103 remaining within the processing vessel 120 is discharged to the outside after the drying operation. At the same time, it is possible to ensure substitution of a non-oxidizing gas, e.g., nitrogen gas, within the processing vessel 120. To be more specific, a valve V5 is mounted to the nitrogen gas supply line 150 communicating with the drying gas supply line 130. Also, a valve V6 is mounted in the vicinity of the junction with the nitrogen gas supply line 150. These valves V5 and V6 are opened or closed on the basis of a command signal generated from the control means 160.

After the wafers W have been subjected to a drying operation, the valve V6 is closed, with the valve V4 being opened, so as to discharge the remaining IPA vapor 103 from within the drying gas supply line 130, followed by closing the valve V5 so as to introduce a nitrogen gas into the supply line 130. As a result, the remaining IPA vapor 103 can be discharged from within the drying gas supply line 130 without fail. Also, the IPA vapor 103 can be replaced by a small amount of the nitrogen gas within the supply line 130.

In the apparatus shown in FIG. 22, the wafer W immediately after the washing treatment is dried within the processing vessel 120 without being brought into contact with the air atmosphere, with the result that particles are not attached to the surface of the wafer W. Further, since the upper layer portion of the washing solution is discharged from within the processing vessel, the particles floating on the surface of the washing solution are not attached to the wafer W. What should also be noted is that, since the IPA liquid layer 104 is formed on the surface of the washing solution, the washing solution 101 is unlikely to be attached to the wafer W when the wafer W is exposed in the IPA vapor. As a result, a non-uniform drying of the wafer W is eliminated so as to cause the wafer W to be unlikely to bear water marks, etc. Still further, since the IPA vapor supply line 130 is purged with a non-oxidizing gas in the step of discharging the remaining IPA vapor 103 from within the IPA vapor supply line 130, it is possible to suppress the particle formation.

Incidentally, the temperature of the washing solution 101 should desirably be set at a level substantially equal to or higher than the temperature of the IPA vapor 103. In this case, formation of the IPA liquid layer 104 is promoted so as to increase the through-put.

In any of the embodiments described above, the IPA vapor 103 is used as a drying agent. However, it is possible to use another drying agent as far as the drying agent permits making the surface of the wafer W hydrophobic and can be dissolved in the pure water 101. It is also possible to use glass substrates for LCD as an object to be washed in addition to the semiconductor wafer used in any of the embodiments described above. Further, it is possible to use an inert gas such as an argon gas or helium gas as a non-oxidizing gas in addition to the nitrogen gas used in any of the embodiments described above. Still further, semiconductor wafers alone are dipped in the solution housed in the processing vessel in any of the embodiments described above. However, it is possible to dip the wafers W together with the cassette C in the solution housed in the processing vessel.

FIGS. 23 to 32 collectively show a washing-drying apparatus according to another embodiment of the present invention. Specifically, the washing-drying apparatus of this embodiment comprises a lower washing vessel 210, an upper drying vessel 220, a lid 221, a wafer boat 230, and a drying gas-forming device 240.

The lower vessel 210 is formed of, for example, quartz or resin such as PTFE which is excellent in corrosion resistance and resistance to chemicals. A discharge port 210a communicating with a drain line 217 via a valve 216 is formed in a bottom portion of the lower vessel 210. Also, a plurality of pairs of nozzles 211 communicating with a washing solution (pure water) supply source 213 are arranged in a lower portion of the lower vessel 210. These nozzles 211 are positioned lower than the lowest point of the wafer boat 230 which can be moved upward so as to permit the pure water 101 to be spurted therefrom toward the wafers W. Incidentally, a valve 214 and a pump 215 are mounted to a pure water supply line 212.

The upper vessel 220 is also formed of quartz or resin such as PTFE. As apparent from FIG. 23, the bottom portion 220b of the upper vessel is larger in diameter than the upper portion of the lower vessel 210. Also, the upper vessel 220 is positioned to allow the bottom portion 220b to overlap with the upper portion of the lower vessel 210 so as to form an overflow portion 220a in the overlapping portion. The pure water 101 overflowing the lower vessel 210 flows into the overflowing portion 220a. Also, a discharge port 220c is formed in a bottom portion 220b of the upper vessel. The discharge port 220c communicates with a drain line 223 via a drain valve 222.

An IPA vapor supply port 221a, which communicates with an IPA vapor forming device 240 through a line 241, is formed in the lid 221. The IPA vapor forming device 240 comprises a hermetic vessel 242, a receptacle 243, a heater 244, and compression transfer lines 240a and 241. The heater 244 is arranged right under the receptacle 243 so as to heat the IPA liquid 104 housed in the receptacle 243. As a result, the IPA vapor 103 is generated within the hermetic vessel 242. The compression transfer line 240a on the upstream side communicates with a nitrogen gas supply source (not shown) such that the nitrogen gas within the transfer line 240a is heated by a heater 205.

On the other hand, the compression transfer line 241 on the downstream side communicates with the supply port 221a of the lid 221 via a heater 245 for preventing dew formation. The compression transfer line 241 also communicates with another nitrogen gas supply source (not shown) via another heater 206. Incidentally, each of the heaters 205, 206 and 241 serves to heat each line for preventing IPA and water from forming dews within each line.

Figure 24:
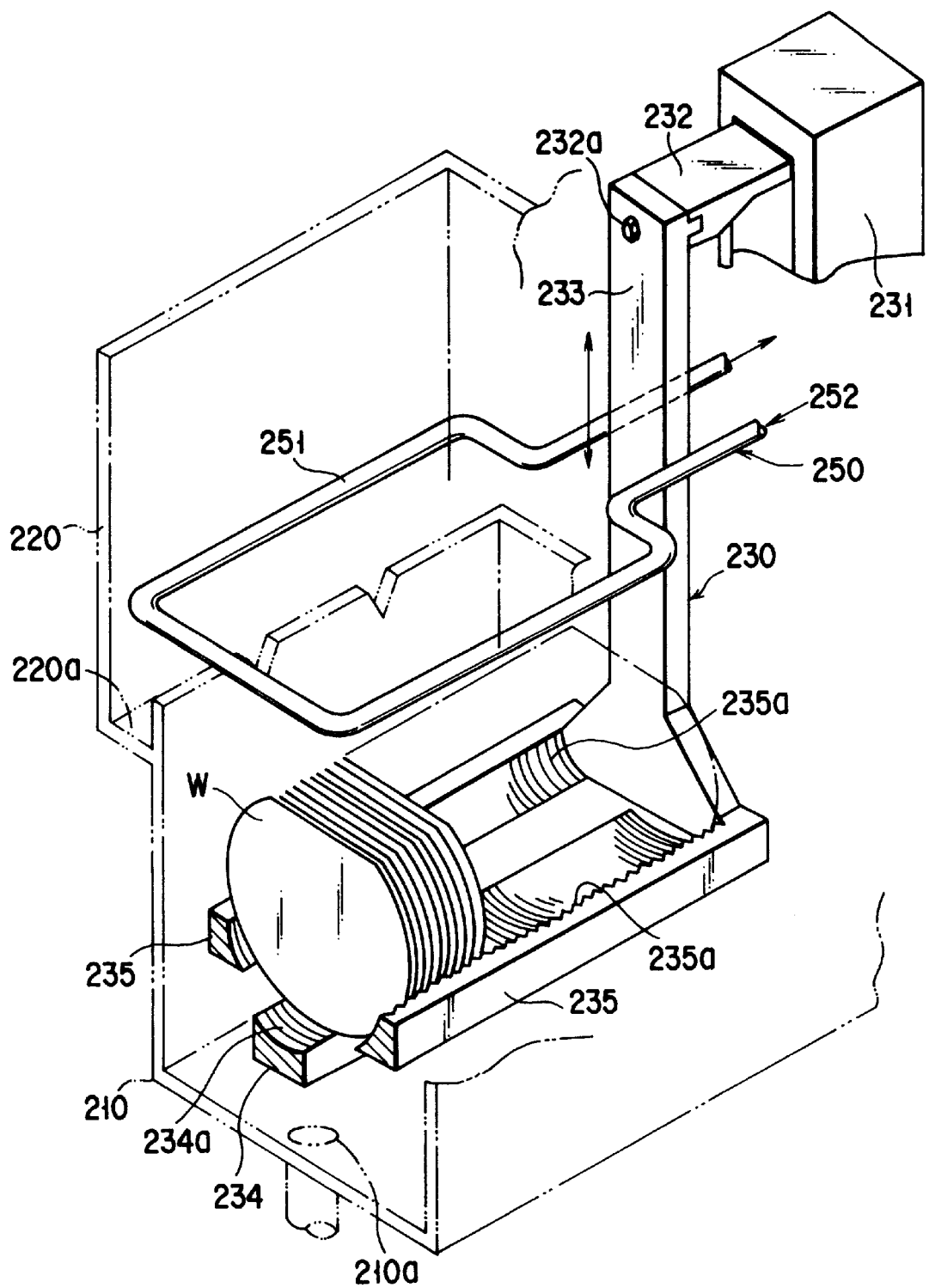
FIG. 24 is an oblique view, partly broken away, showing cooling pipes and a wafer boat positioned within the processing vessel.

As shown in FIG. 24, a coolant pipe 251 included in a cooling-condensing mechanism 250 is arranged within the upper vessel 220. The coolant pipe 251 communicates with a coolant supply source (not shown) such that a coolant 252 such as ethyl alcohol or ethylene glycol is circulated through the pipe 251. It should be noted that the temperature of the coolant 252 is set lower than the IPA vapor temperature and higher than the condensation temperature of IPA, which is about −90° C. Also, when the IPA vapor 103 is not supplied into the upper vessel 220, the temperature of the coolant 252 is set at a freezing temperature 0° C. of the pure water 101.

In this fashion, the IPA cooling mechanism 250 permits positively forming dews of the IPA liquid 104 and the pure water 101 within the upper vessel 220 so as to prevent these dews from being formed on the inner wall of the upper vessel 220.

Figure 25:
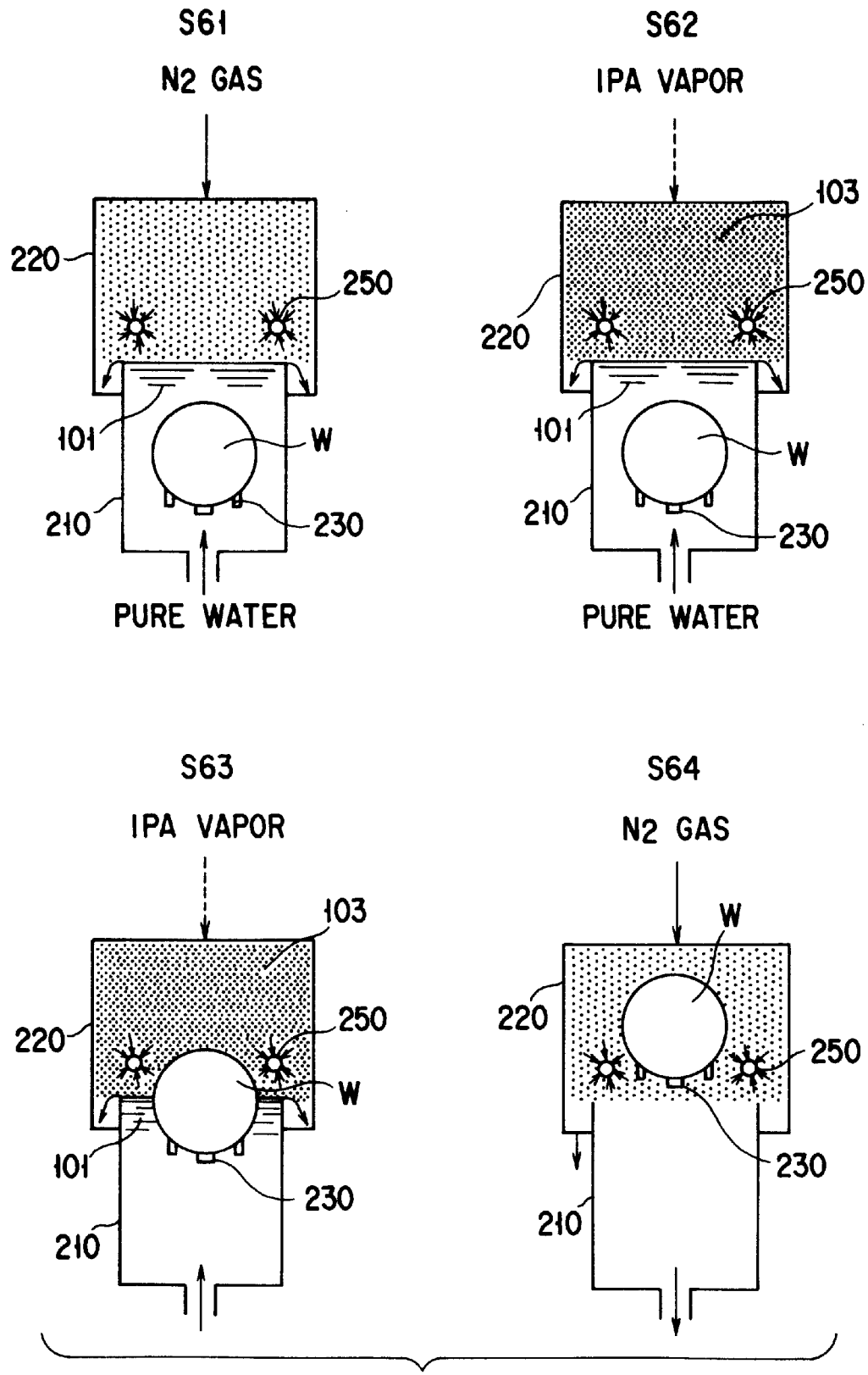
FIG. 25 is a flow chart showing steps S61 to S64 of a method according to another embodiment of the present invention.

FIG. 25 shows steps S61 to S64 in applying the washing-drying treatment to semiconductor wafers W in the washing-drying apparatus of the construction described above.

Specifically, 50 wafers W are transferred to the washing-drying apparatus by a wafer chuck (not shown) so as to be delivered to the wafer boat 30, followed by moving the wafer boat 30 downward so as to permit the wafers W to be positioned within the lower vessel 210. Under this condition, the pure water 101 is spurted from the nozzle 211 so as to wash the wafers W within the lower vessel 210 (step S61). In this step, dews are not formed on the inner wall of the upper vessel 220 because the coolant 252 is circulated through the coolant pipe 251 and, at the same time, a nitrogen gas is introduced from above into the upper vessel 220. It should be noted that water or IPA forms dews in the heat exchange portion of the coolant pipe 251 (step S62).

Then, the pure water 101 is allowed to overflow the lower vessel 210, and the resistivity of the overflowing pure water 101 is measured. When the resistivity thus measured has reached a predetermined value, the washing treatment is finished, followed by supplying an IPA vapor into the upper vessel 220. Then, the wafers W are pulled out of the pure water 101 within the lower vessel 210 (step S63). Further, if the wafer boat 130 is moved upward to pull the wafers W out of the pure water 101, the IPA liquid layer 104 is brought into contact with the wafers W. Also, the IPA vapor 103 within the upper vessel 220 is brought into contact with the wafers W. As a result, the wafers W are dried while preventing the particles from being attached to the wafers W (step S64).

As described above, the water and IPA within the upper vessel 220 are allowed to form dews on the inner surface of the coolant pipe 251 included in the cooling-condensing mechanism 250 so as to lower the humidity and IPA vapor concentration within the upper vessel 220. As a result, it is possible to promote the drying of the wafers W and the groove portions 234a and 235a of the wafer boat 230. Further, since the IPA dews drop from the coolant pipe 251 into the IPA liquid layer 104 formed in the lower vessel 210, IPA can be effectively utilized for drying the wafers W.

Figure 26:
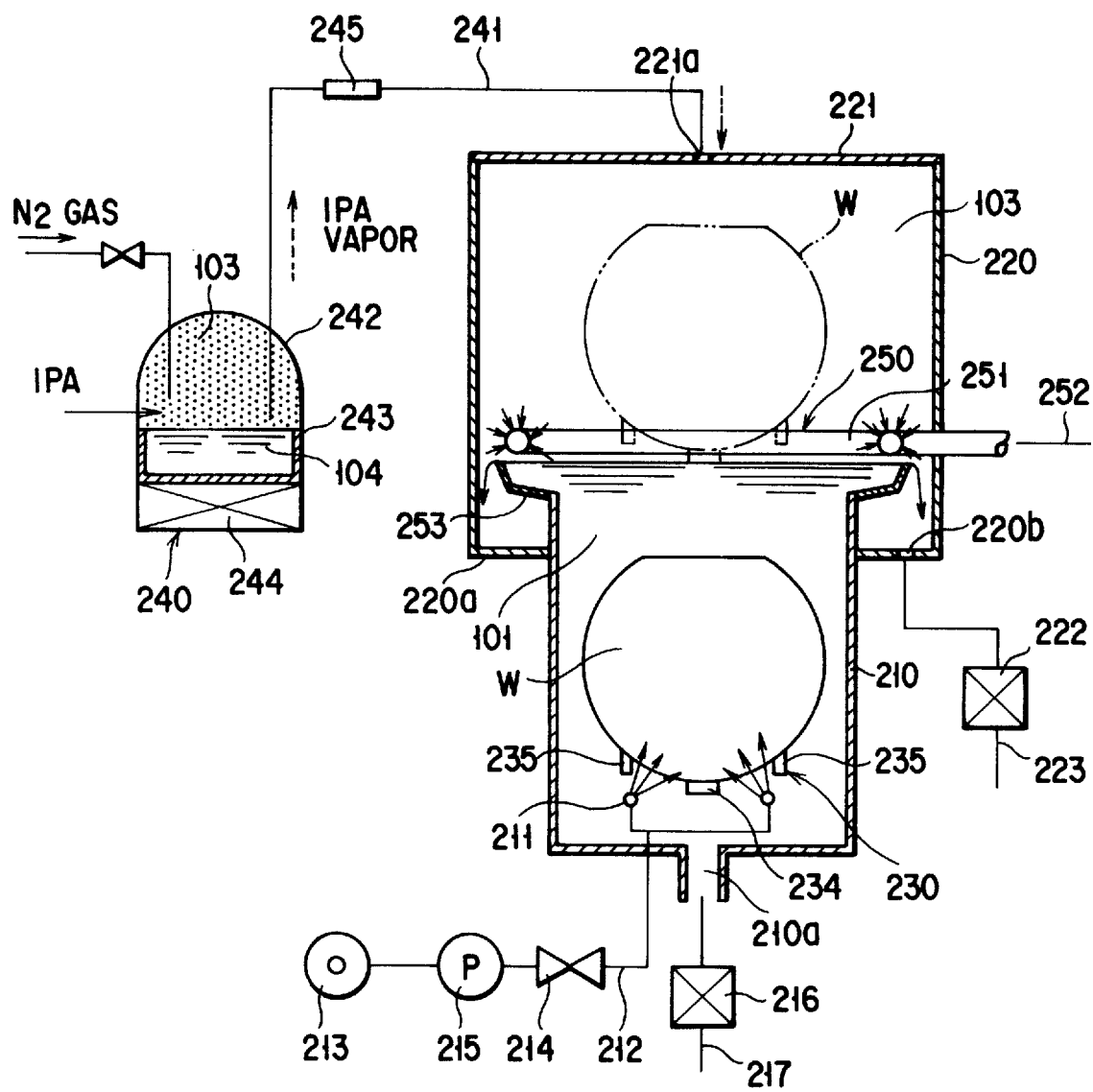
FIG. 26 is a cross sectional view showing another processing vessel, drying gas-forming apparatus and peripheral circuits thereof.
Figure 28:
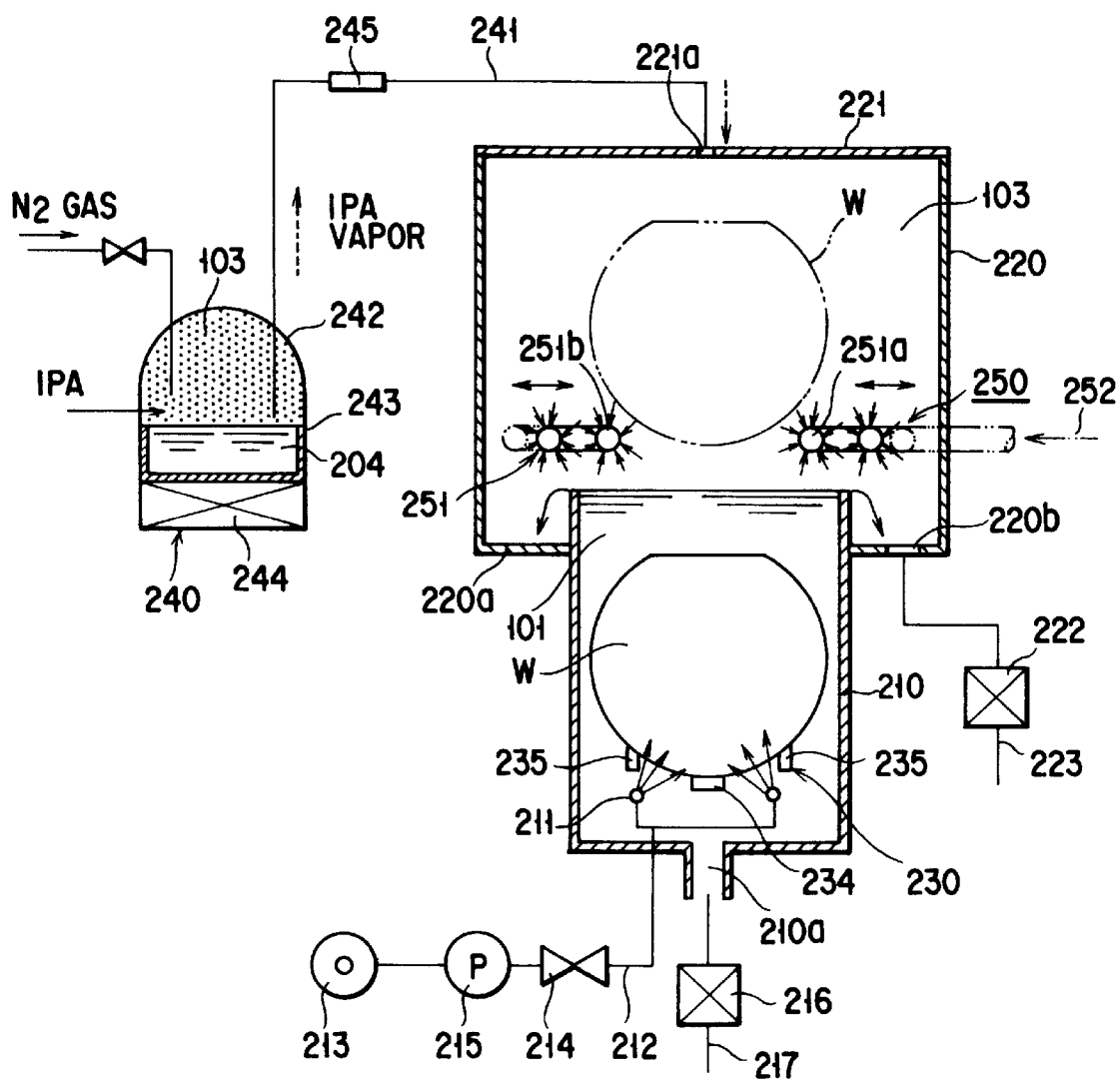
FIG. 28 is a cross sectional view showing another processing vessel, drying gas-forming apparatus and peripheral circuits thereof.
Figure 29:
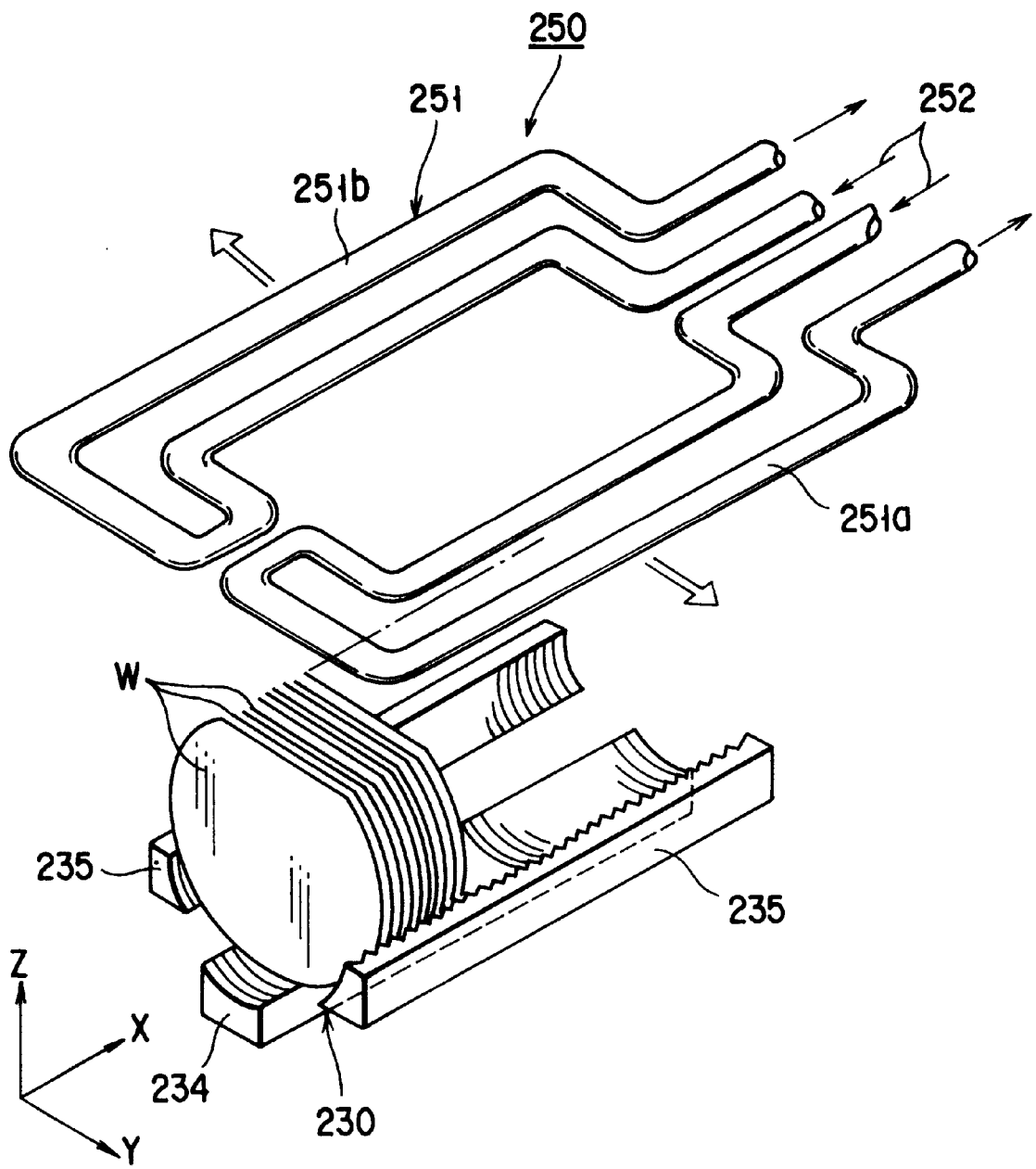
FIG. 29 is an oblique view, partly broken away, showing cooling pipes and a wafer boat positioned within the processing vessel.

FIG. 26 shows an apparatus according to another embodiment of the present invention. In this embodiment, the lower vessel 210 is shaped differently to minimize the inner volume of the lower vessel 210, making it possible to reduce the consumption of the washing solution 101 and to shorten the required washing time. To be more specific, an upper portion 253 having a larger diameter is included in the lower vessel 210, and the coolant pipe 251 is arranged right above the upper portion 253. In this embodiment, the IPA liquid 104 formed by condensation within the coolant pipe 251 is received without fail by the upper portion 253 of the lower vessel 210 and, then, flows into the lower vessel 210. Of course, the upward movement of the wafer boat 230 is not obstructed by the coolant pipe 251. It follows that it is possible for the wafer boat 230 to pass easily through the central space surrounded by the coolant pipe 251 without increasing the diameter of the lower vessel 210.

Incidentally, it is possible to arrange a water conduit member 253A as an independent member of the apparatus between the lower vessel 210 and the coolant pipe 251, as shown in FIG. 27. Since the particular water conduit member 253A is removably attached to any of the lower vessel 210, upper vessel 220 and coolant pipe 251, maintenance of the processing vessel can be performed easily FIGS. 28 and 29 collectively show an apparatus according to another embodiment of the present invention. In this embodiment, the heat exchange portion of the cooling-condensing mechanism 250 is made movable so as to minimize the inner volume of the lower vessel 210, making it possible to reduce the consumption of the washing solution 101 and to shorten the required washing time. To be more specific, the cooling-condensing mechanism 250 is provided with first and second coolant supply pipes 251a and 251b of two different systems so as to further increase the area of the heat exchange portion. As a result, it is possible to promote the condensation of IPA, etc. within the upper vessel 220. It should be noted that the first coolant supply pipe 251a and the second coolant supply pipe 251b are movably supported by a Y-axis moving mechanism (not shown) which permits these first and second coolant supply pipes 251a, 251b to be moved toward or away from each other.

When the wafer boat 230 is moved into or out of the lower vessel 210, the first and second coolant supply pipes 251a and 251b are moved away from each other. During the washing or drying operation, however, these coolant supply pipes 251a and 251b are moved toward each other. As a result, these coolant supply pipes 251a and 251b are positioned right above the lower vessel 210. It follows that the condensed IPA vapor is likely to drop into the lower vessel 210.

In the embodiment described above, the inner volume of the lower vessel 210 can be minimized, making it possible to reduce the consumption of the washing solution 101 and to shorten the required washing time. In addition, it is possible to reduce the consumption of IPA for the drying treatment.

FIGS. 30 and 31 collectively show an apparatus according to another embodiment of the present invention. In this embodiment, the heat exchange portion of the cooling-condensing mechanism 250 is mounted to the wafer boat 230 so as to minimize the inner volume of the lower vessel 210. As a result, it is possible to reduce the consumption of the washing solution 101 and to shorten the required washing time. To be more specific, the coolant supply pipe 251 is mounted to a vertical arm 233 of the wafer boat 230 so as to allow the coolant supply pipe 251 to be moved upward together with the wafer boat 230.

In the apparatus described above, the coolant supply pipe 251 can be positioned right above the lower vessel 210 during the washing-drying treatment so as to allow the condensed IPA to drop into the lower vessel 210. As a result, the inner volume of the lower vessel 210 can be minimized, making it possible to reduce the consumption of the washing solution 101 and to shorten the required washing time. It is also possible to reduce the IPA consumption.

Figure 32:
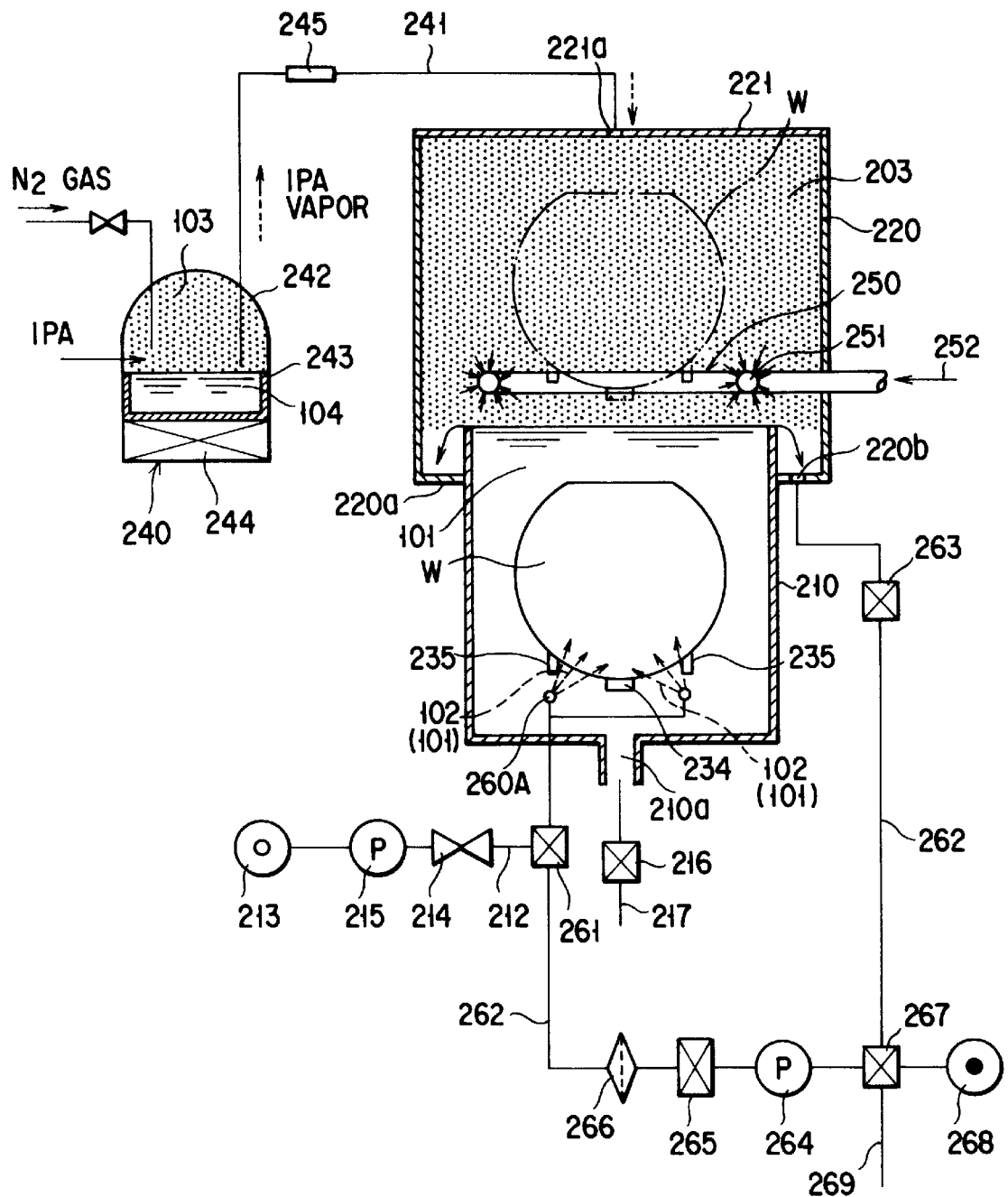
FIG. 32 is a cross sectional view showing another processing vessel, drying gas-forming apparatus and peripheral circuits thereof.

FIG. 32 shows an apparatus according to another embodiment of the present invention. In this embodiment, the chemical solution 102 is spurted from a nozzle 260A positioned within the lower vessel 210 so as to wash the wafers W with the chemical solution. To be more specific, the washing solution supply line 212 and the chemical solution supply line 262 are connected to the nozzle 260A via a switching valve 261 so as to permit performing the washing treatment with a pure water and the washing treatment with a chemical solution alternately.

As seen from the drawing, the chemical solution supply line 262 communicates with an HF aqueous solution supply source 268 and with the overflow portions 220a, 220b via valves 261, 263, 265 and a three-way valve 267 so as to form a circulating circuit for circulating the HF aqueous solution within the lower vessel 210. The three-way valve 267 communicates with each of the HF circulating line 262, an HF aqueous solution supply source 268 and a drain line 269 so as to form selectively a fluid passageway including any of these HF circulating line 262, HF aqueous solution supply source 268 and drain line 269.

A plurality of nozzles 260A are arranged to form two rows in a bottom portion of the lower vessel 210. As apparent from the drawing, these nozzles 260A are positioned right under a wafer boat 235. It should be noted that the HF aqueous solution 102 is spurted from each of the nozzles 260A toward the wafers W supported by the wafer boat 235.

In the apparatus of the construction described above, a washing treatment with a chemical solution and a water wash treatment can be performed within a single processing vessel, making it possible to miniaturize the processing system and to improve the through-put.

In the embodiment described above, the upper vessel 220 consists of a closed chamber. However, an open chamber can also be used as the upper vessel 220. Further, the drying treatment is applied immediately after the wafers W are pulled out of the pure water 101 in the embodiment described above. However, it is also possible to discharge the pure water 101 from within the lower vessel 210 without moving the wafers W so as to dry the wafers W with an IPA vapor.

FIGS. 33A to 33E collectively show a washing system according to another embodiment of the present invention. It should be noted that IPA has such a high boiling temperature as 82° C., with the result that evaporation of the washing solution (pure water) is promoted. It follows that dews 96a, 96b of pure water or IPA are formed on the inner surface of the chamber 93, as shown in FIGS. 33A to 33E. The presence of the dews causes the purging time with a nitrogen gas, which is performed for bringing the atmosphere within the chamber 93 back to the initial state, to be prolonged, leading to a low through-put. Further, the dews 96a, 96b are likely to be evaporated again when the inner pressure of the chamber 93 is lowered, with the result that the evaporated water or IPA is attached to the wafer W to form dews. It follows that water marks are likely to be formed on the wafer W. What should also be noted is that, if the dew 96a of water formed on the inner surface of the ceiling of the chamber 93 drops onto the wafer W, the wafer W incurs a serious contamination. Still further, the dew 96b of IPA is discharged without being dried, leading to waste of IPA.

Figure 33A:
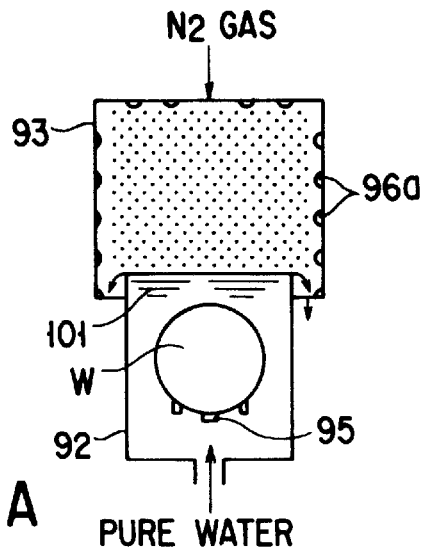
FIGS. 33A to 33E collectively denote a flow chart showing an another embodiment of washing-drying method.
Figure 33B:
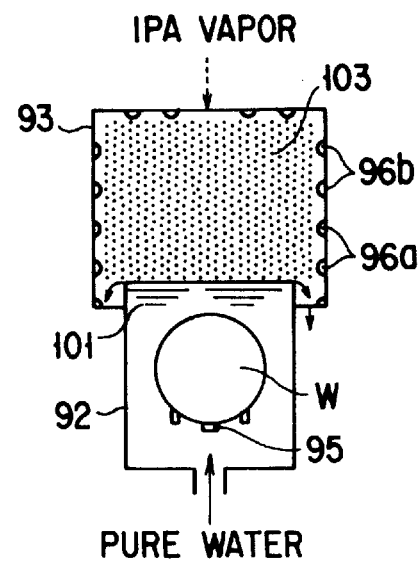

As shown in FIG. 33A, in the first step, a pure water 101 is supplied to a treating vessel 9 while permitting overflow of the pure water so as to cause wafers W and a wafer boat 95 to be dipped in the pure water 101. Incidentally, the inner surface of a chamber 93 is purged with a nitrogen gas. Then, an IPA vapor 103 is introduced into the chamber 93 to fill the chamber 93 with the IPA vapor 103, as shown in FIG. 33B.

Figure 33C:
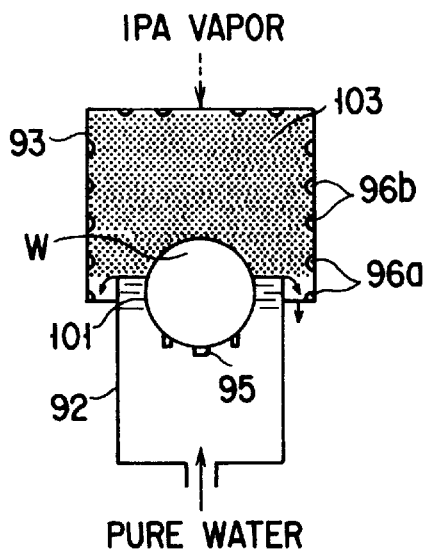
Figure 33D:
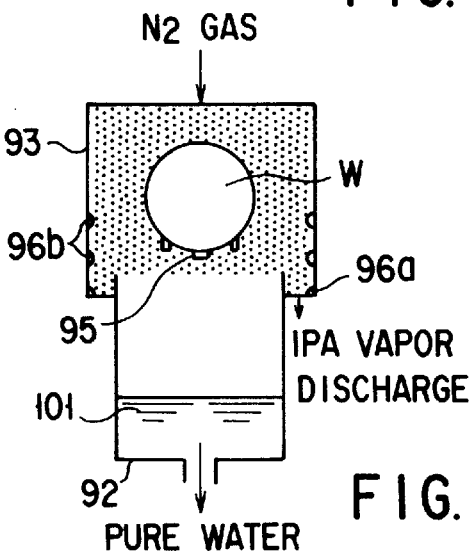

In the next step, the wafer boat 95 supporting the wafers W is pulled out of the pure water 101 filling the treating vessel 92 so as to put the wafer boat 95 and the wafers W within the IPA vapor 103 filling the chamber 93, as shown in FIG. 33C. In this step, the IPA vapor 103 is brought into contact with the wafer W. As a result, water is removed from the wafer surface because of the adsorption-condensation function performed by the IPA vapor 103. Further, a nitrogen gas is introduced into the chamber 93 so as to release the IPA vapor from within the chamber 93, as shown in FIG. 33D.

Figure 33E:
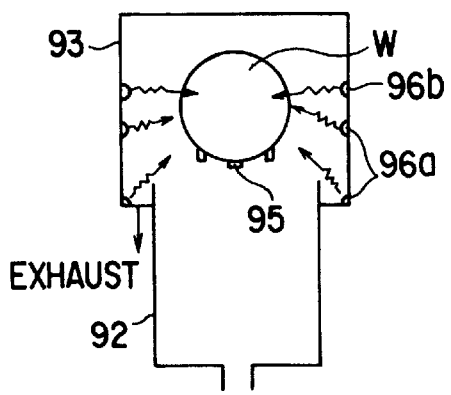
Figure 34:
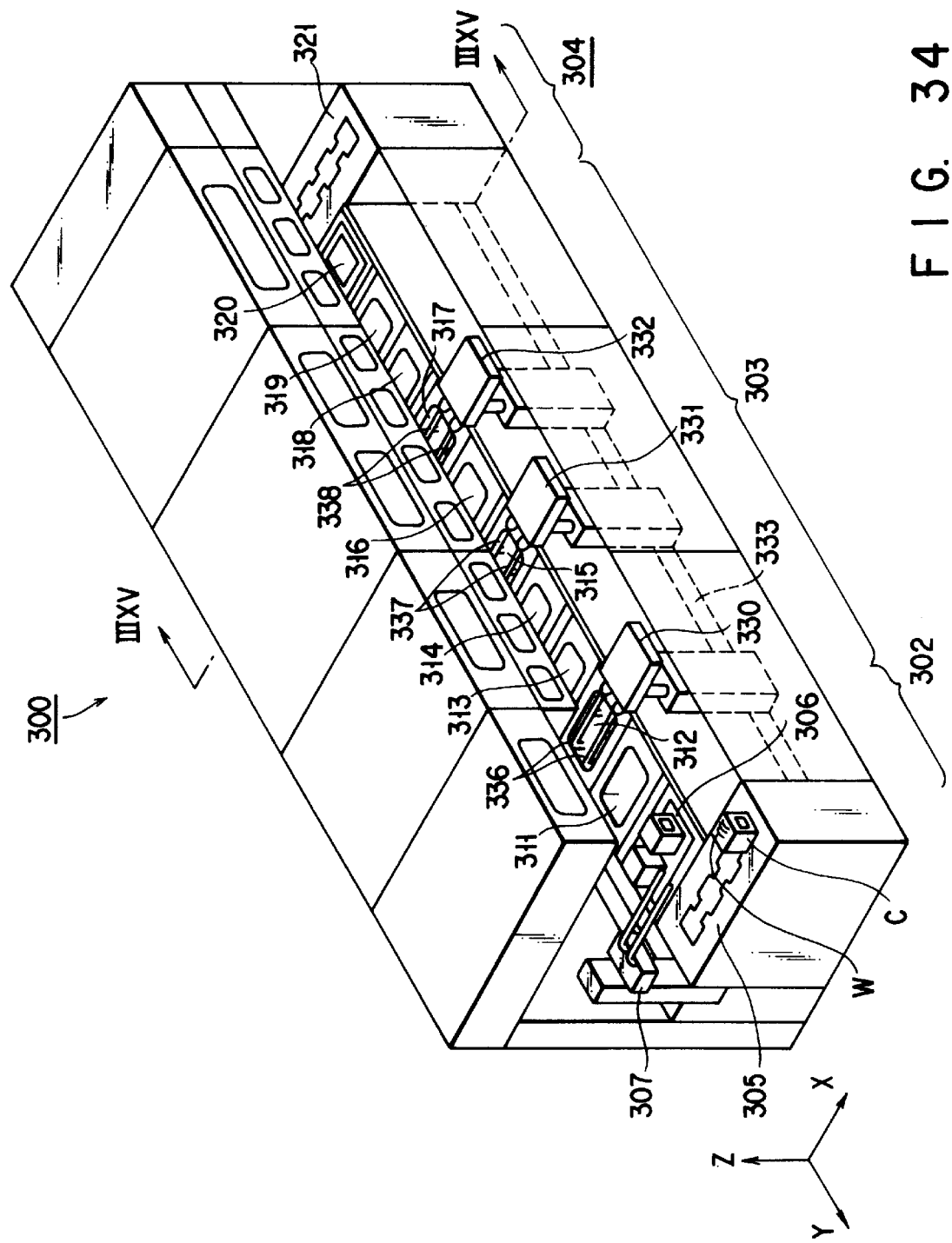
FIG. 34 is an oblique view showing the construction of the entire washing-drying apparatus.

Finally, the wafer W is dried under heat while exhausting the chamber 93, as shown in FIG. 33E.

FIGS. 34 to 40 collectively show a washing system 300 according to still another embodiment of the present invention. The washing system 300 in this embodiment comprises a process section 303, a loader section 302 and an unloader section 304. The loader section 302 is arranged on one side of the process section 303, with the unloader section 304 being arranged on the other side of the process section 303.

The loader section 302 includes a stage section 305, an interface 306, and a transfer device 307. A plurality of cassettes C each having 25 untreated semiconductor wafers W mounted therein are disposed on the stage section 305. The wafers W are collectively taken out of the cassette C and aligned at predetermined positions by the transfer device 307. Then, the aligned wafers W are transferred to the interface 306, which is positioned adjacent to the process section 303. It should be noted that the wafers W are transferred from the transfer device 307 to a first transfer mechanism 330 via the interface 306.

The process section includes 10 processing vessels arranged in series in a Y-axis direction. Each of these processing vessels includes a chemical solution vessel 312, a primary water washing vessel 313, a secondary water washing vessel 314, and a vessel 311 for washing a wafer chuck with water. A chemical solution such as an aqueous solution containing ammonia and hydrogen peroxide or an aqueous solution of hydrofluoric acid is circulated through the chemical solution vessel 312. A pure water is supplied into each of the primary water washing vessel 313 and the secondary water washing vessel 314. After washing with a pure water in each of these water washing vessels 313 and 314, the wafers W are subjected to additional treatments in the processing vessels 315 to 320 on the downstream side.

A unit including a washing-drying vessel 319 is arranged downstream of the process section 303. In this unit, the wafers W are subjected to the final washing treatment and, then, dried with IPA (isopropyl alcohol).

The wafers W are washed with different chemical solutions in the processing vessels 315 and 312. For example, a so-called SC1 washing using an alkaline chemical solution such as an aqueous solution containing ammonia and hydrogen peroxide, i.e., $NH_4OH/H_2O_2/H_2O$, is performed in the processing vessel 312. In this SC1 washing, foreign substances such as organic contaminants and particles are removed from the surfaces of the wafers W. On the other hand, a so-called SC2 washing using an aqueous solution containing hydrochloric acid and hydrogen peroxide, i.e., $HCl+H_2O_2$, is carried out in the processing vessel 315. In this SC2 washing, metal ions are removed from the surfaces of the wafers W so as stabilize the surfaces of the wafers W.

The wafers W are rinsed with the pure water 101 in each of the processing vessels 313, 314, 316 and 317. Further, a so-called HF washing and rinsing, which uses a dilute aqueous solution of hydrofluoric acid, $HF/H_2O$, is performed in the processing vessel 319, followed by drying the wafers W with an IPA vapor.

Combination of the processing vessels described above can be changed optionally depending on the kind of treatment applied to the wafers W. Also, in some cases, some of the processing vessels can be omitted. By contraries, some processing vessels can be newly added, as required. For example, it is possible to add a washing-drying vessel using an aqueous solution containing sulfuric acid and hydrogen peroxide, i.e., $H_2SO_4+H_2O_2$.

Three transfer devices 330, 331 and 332 are arranged in front of the process section 303. These transfer devices 330, 331 and 332 are movable along a guide rail 333 in a Y-axis direction and include wafer chucks 336, 337, and 338, respectively. Each of these wafer chucks 336, 337 and 338 is capable of collectively holding 50 wafers W.

Figure 35:
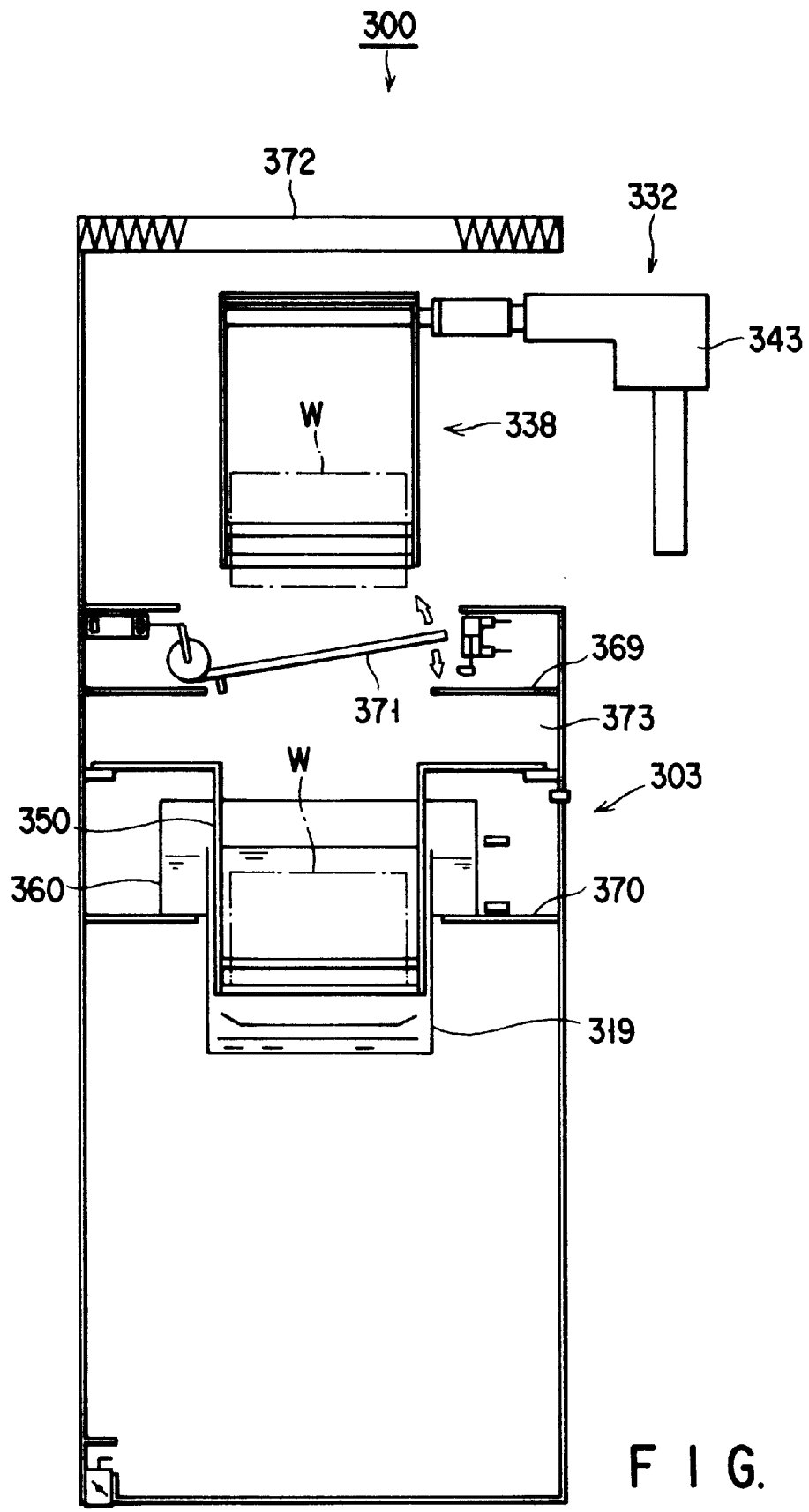
FIG. 35 is a cross sectional view along line IIIXV—IIIXV shown in FIG. 34 schematically showing the construction of the washing-drying apparatus and wafer transfer apparatus.
Figure 36:
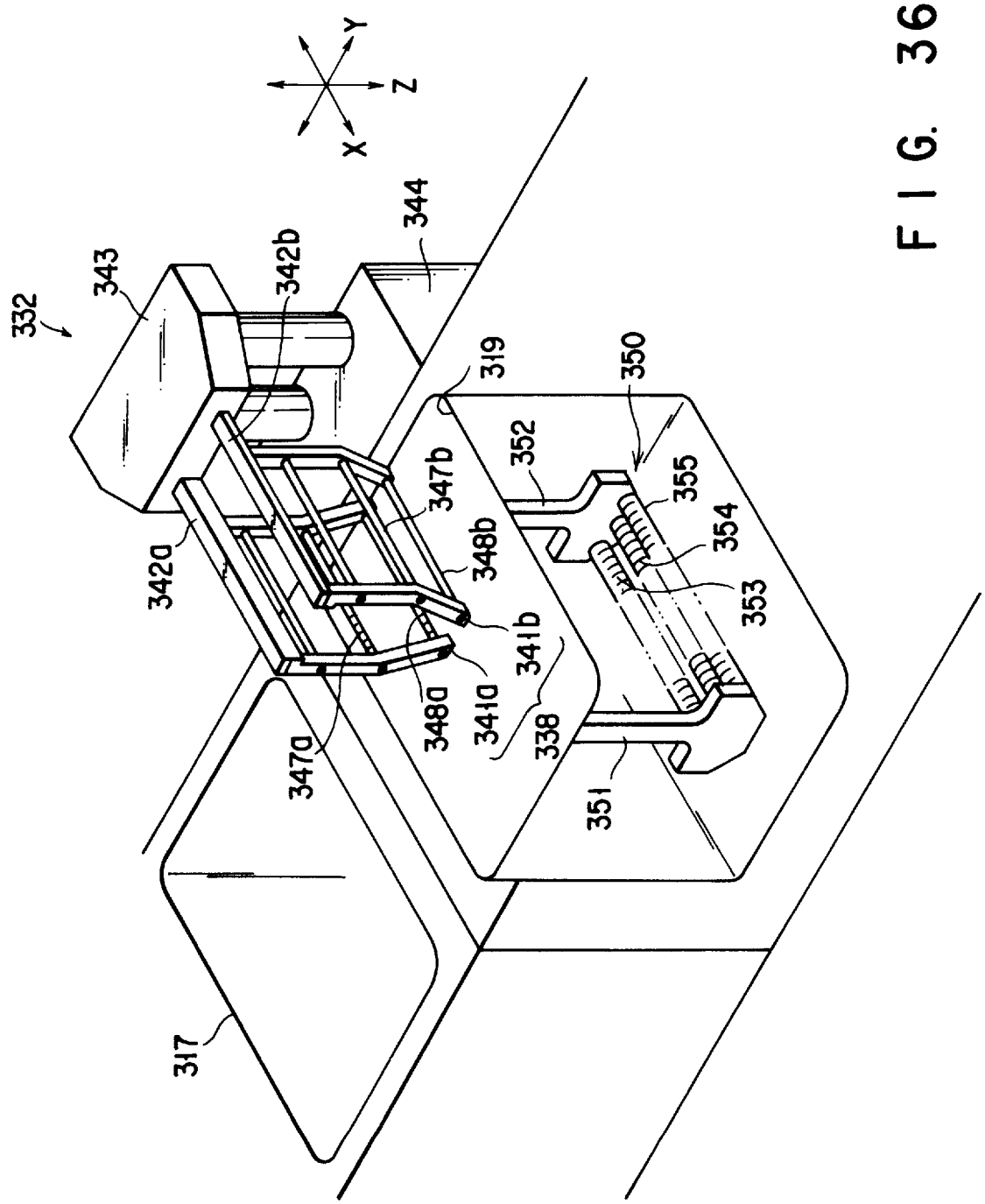
FIG. 36 is an oblique view showing a wafer transfer apparatus and a wafer boat.

As shown in FIGS. 35 and 36, the wafer chuck 338 of the transfer device 332 includes a pair of holding members 341a and 341b. These holding members 341a, 341b are supported by a supporting section 343 via rotatable shafts 342a, 342b, respectively. The supporting section 343 can be moved in a Z-axis direction by a lift mechanism 344. Further, the entire wafer chuck 338 can be moved in an X-axis direction by a mechanism (not shown) arranged within the supporting section 343.

The upper ends of the holding members 341a, 341b are fixed to the rotatable shafts 342a, 342b, respectively. Further, holding rods 347a and 348a each made of quartz are stretched in parallel in lower portions of the holding member 341a. Likewise, holding rods 347b and 348b each made of quartz are stretched in parallel in lower portions of the holding member 341b. Fifty grooves are formed in each of these holding rods 347a, 347b, 348a, 348b such that 50 wafers W can be held by the grooves formed in these holding rods.

Figure 37:
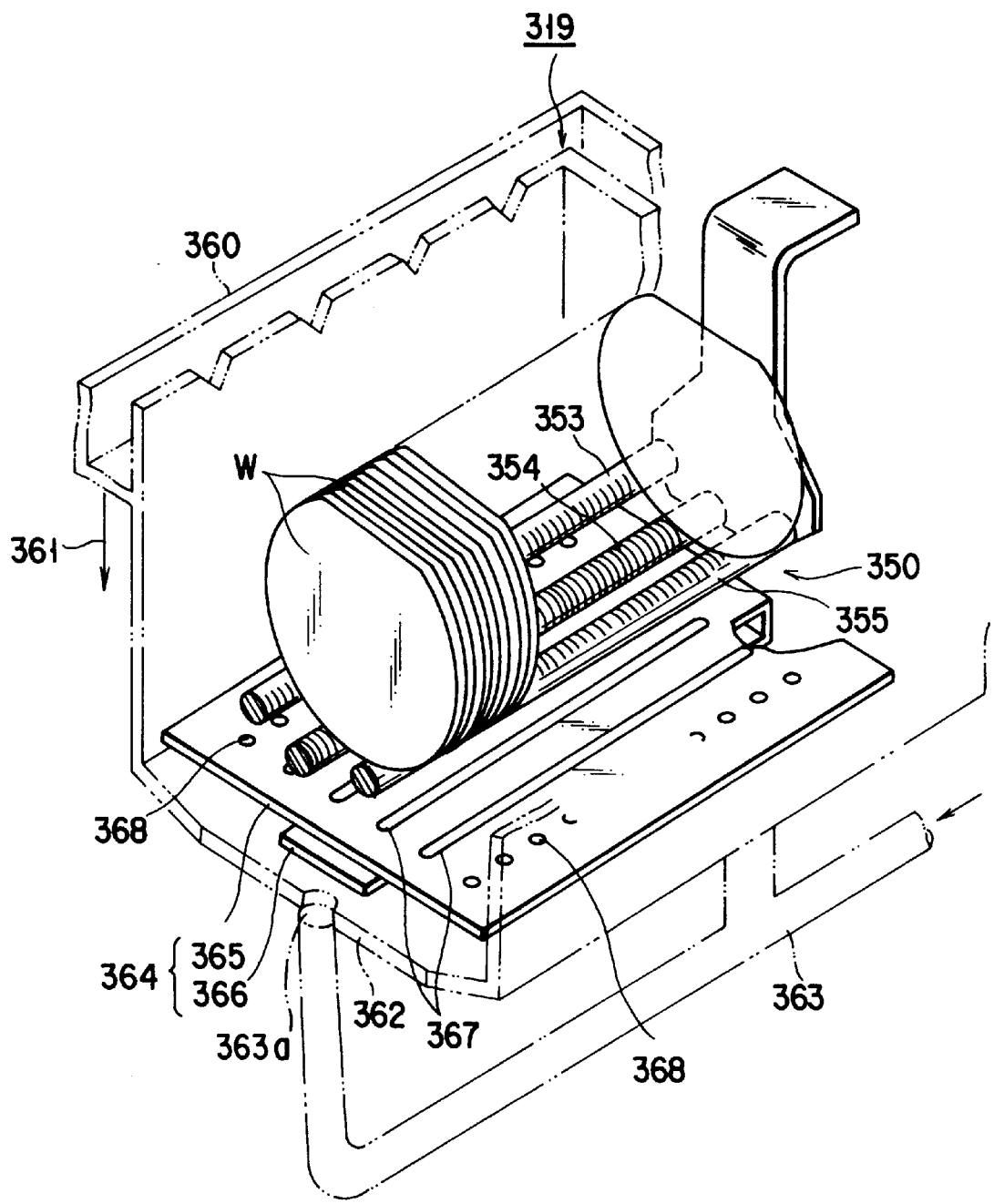
FIG. 37 is an oblique view, partly broken away, showing the wafer boat positioned within the processing vessel.

As shown in FIGS. 36 and 37, a wafer boat 350 is arranged within each of the processing vessels 312 to 317 and 319. The wafer boat 350 comprises a pair of holding members 351, 352 and three horizontal holding rods 353, 354, 355. The central holding rod 354 is positioned lower than the side holding rods 353 and 355. Fifty grooves are formed in each of these horizontal holding rods 353, 354, 355 such that 50 wafers W can be held by the grooves formed in these holding rods.

As shown in FIG. 37, the processing vessel 319 is substantially in the shape of a box having an open upper end portion which is externally surrounded by an overflow portion 360. The overflow portion 360 communicates with a washing solution circulating mechanism 385 (see FIG. 38) via a discharge line 361. A filter or the like for regenerating the recovered washing solution is housed in the washing solution circulating mechanism 385.

It is also shown in FIG. 37 that a pipe 363 is connected to a bottom portion 363 of the processing vessel 319. Further, a fluid flow regulating means 364 including a baffle plate 366 and a flow regulating plate 365 is arranged within the processing vessel 319. The baffle plate 366 is positioned right above a washing solution inlet port 363a formed in a bottom portion of the processing vessel 319. On the other hand, the fluid flow regulating plate 365 is positioned right above the baffle plate 366. As seen from the drawings, a large number of through-holes 368 and through-slits 367 are formed in the flow regulating plate 365.

The line 363 communicates via the washing solution circulating mechanism 385 with each of an HF supply source 386, a DIW supply source 387 and HOT DIW supply source 388. A dilute aqueous solution of hydrofluoric acid 102 is housed in the HF supply source 386. A pure water 101 having a temperature nearly equal to room temperature is housed in the DIW supply source 387. Further, a warm pure water 101H having the temperature controlled to fall within a range of between room temperature and about 80° C. is housed in the HOT DIW supply source 388. Upon receipt of command signals generated from the controller 403, these supply sources 386, 387, ad 388 serve to selectively supply these solutions 101, 101H and 102 to the washing solution circulating mechanism 385. It should be noted that the controller 403 is connected to an operating panel 402 so as to enable an operator to input data, as required.

As shown in FIG. 35, a case 373 equipped with an upper partition plate 369 and a lower partition plate 370 is arranged within the processing vessel 319. A lid 371, which can be opened as desired, is disposed to close the upper opening of the case 373. Also, an air conditioner 372 equipped with a filter is arranged above the case 373. A down flow of a clean air is formed by the air conditioner 372 such that the case 373 is positioned within the clean air down flow.

Figure 38:
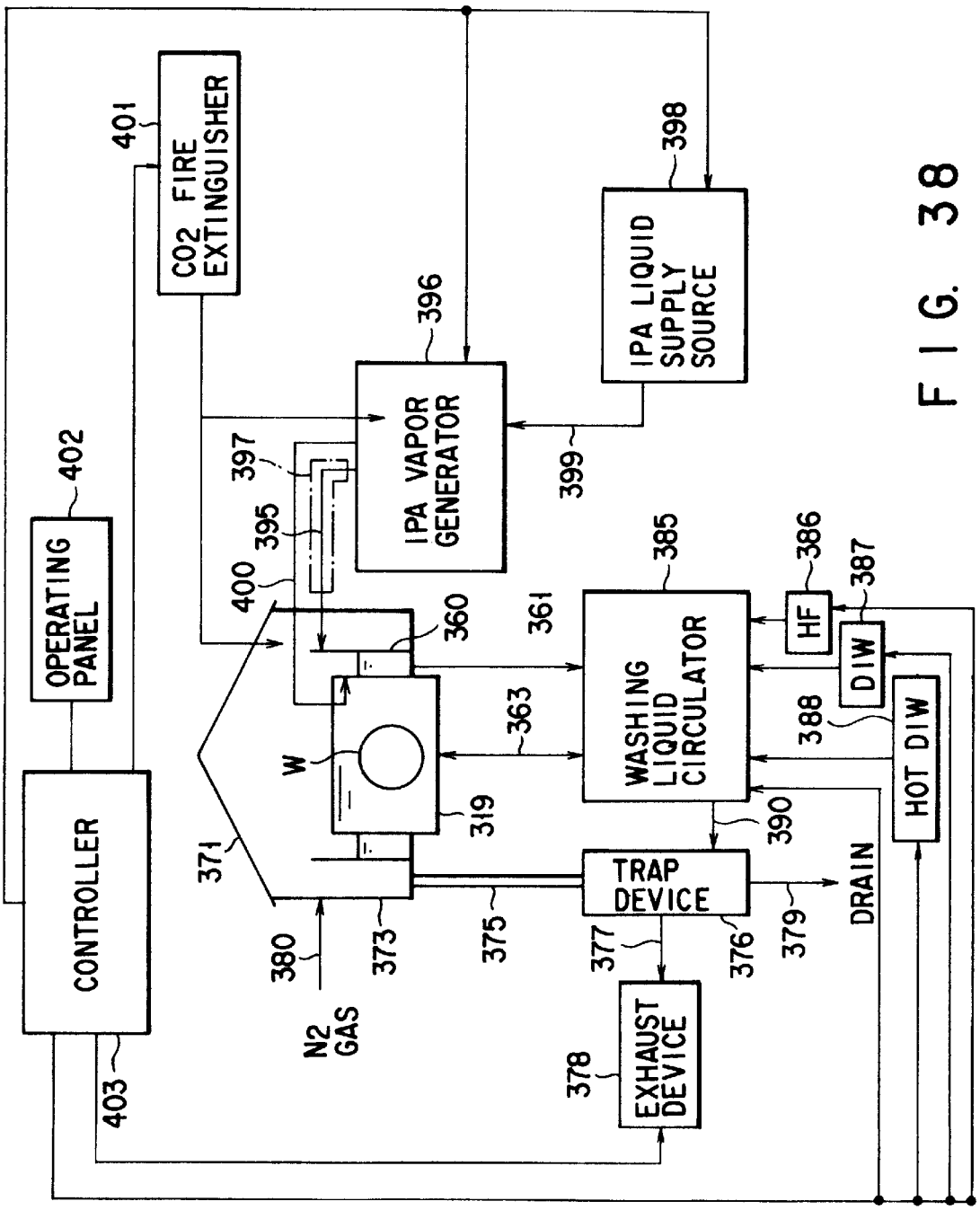
FIG. 38 is a block diagram schematically showing the construction of a washing-drying apparatus according to another embodiment of the present invention.

As shown in FIG. 38, a line 375, which is connected to a bottom portion of the case 373, communicates with an exhaust means 378 via trapping mechanism 376 and a line 377. The pressure within the case 373 is reduced by operating the exhaust means 378. It should be noted that the IPA vapor 103 mixed into the exhaust gas is trapped by the trapping mechanism and, then, discharged to the outside through the drain line 379.

A line 380 communicates with a side wall portion of the case 373 so as to permit a nitrogen gas to be supplied from a nitrogen gas supply source (not shown) into the case 373 via the line 380. Incidentally, it is possible to supply an inert gas such as an argon gas into the case 373 in place of the nitrogen gas.

An IPA vapor generator 396 communicates with an IPA liquid supply source 398 via a line 399 and also with the inner space at a side of the case 373 via a line 395. Further, the IPA vapor generator 396 communicates with the inner space of the processing vessel 319 via a line 400. It should be noted that a heater 397 is mounted to the line 395 so as to heat the IPA vapor within the line 395 to temperatures of 80° C. or more so as to prevent the IPA vapor from forming dews within the line 395.

Further, a $CO_2$ fire extinguisher 401 is allowed to communicate appropriately with the case 373. When an emergent alarm signal is supplied from an alarm system (not shown) to the fire extinguisher 401 via the controller 403, a $CO_2$ gas is supplied from the fire extinguisher 401 into the case 373 so as to extinguish the flame within the case 373.

Figure 39:
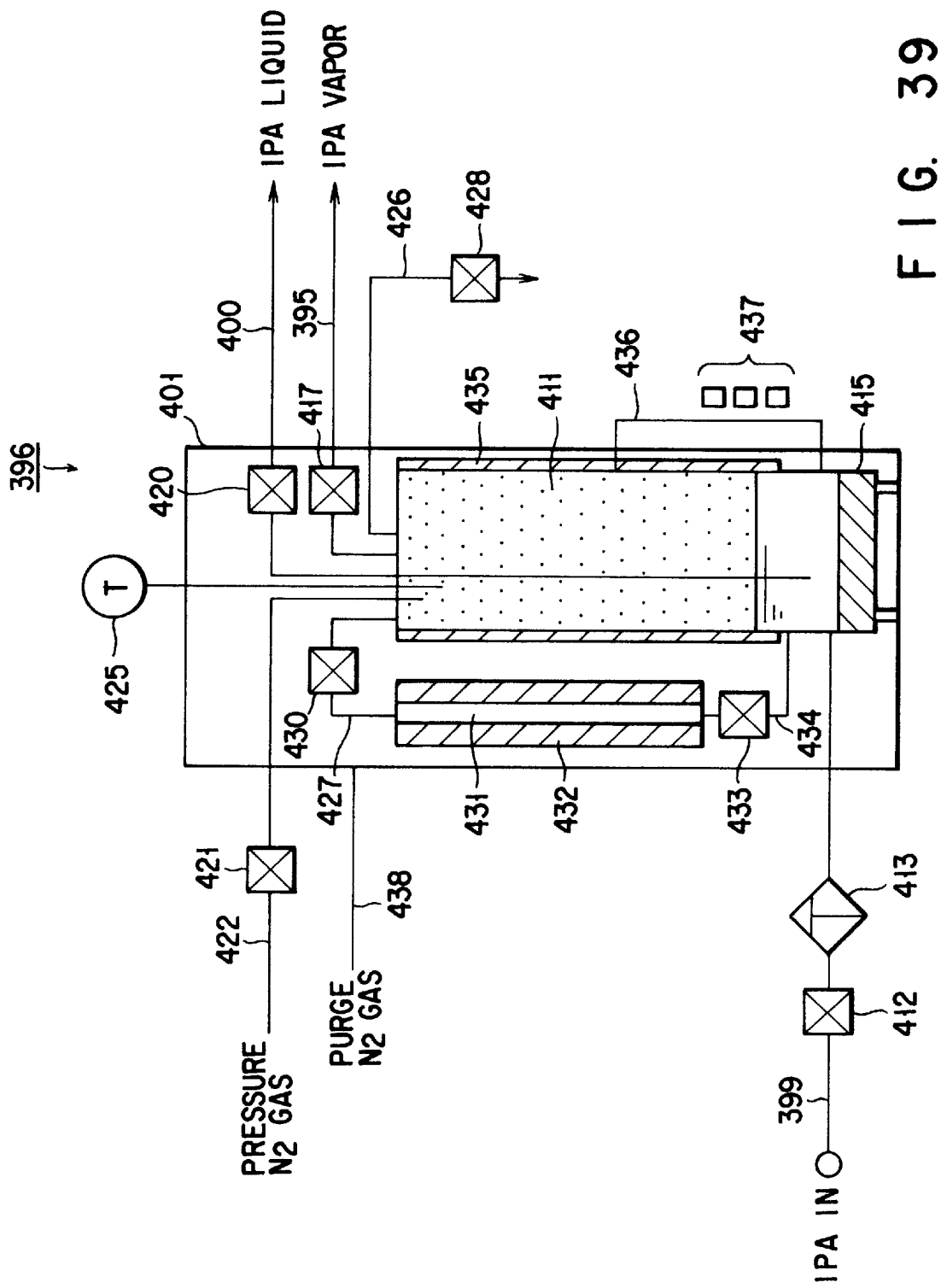
FIG. 39 is a cross sectional view showing an IPA (isopropyl alcohol) vapor generating chamber and peripheral circuits thereof.

FIGS. 38 and 39 collectively show in detail the construction of the IPA vapor generator 396. As shown in the drawings, an IPA liquid 104 is supplied from the IPA liquid supply source 398 into a body 411 of the IPA vapor generator 396 via the line 399. A control valve 412 and a filter 413 are mounted to the line 399. Further, a heater 415 is arranged at a bottom portion of the vapor generator body 411 so as to heat the IPA liquid 104 to temperatures of 80° C. or more, e.g., to about 120° C.

The vapor generator body 411 and a trapping pipe 431 are surrounded by a casing 401. A nitrogen gas for purging is supplied through the line 438 into the casing 401.

A temperature sensor 425 is arranged above the vapor generator body 411 so as to detect the temperature range within which an IPA vapor can be generated. The temperature sensor 425 is formed of, for example, a thermocouple. Further, lines 426 and 427 are arranged to communicate with an upper portion of the vapor generator body 411. The line 426 is open in an atmosphere of atmospheric pressure via a valve 428. On the other hand, the line 427 communicates with an upper end of the trapping pipe 431 via a valve 430.

A water jacket 432 is mounted to surround the trapping pipe 431. When the valve 430 is opened, the IPA vapor 103 flows from within the vapor generator body 411 into the trapping pipe 431 via the line 427 so as to be cooled and condensed by the water jacket 432.

The lower end of the trapping pipe 431 communicates with a lower portion of the vapor generator body 411 via a line 434 equipped with a valve 433. The condensed IPA liquid 104 is brought back into the vapor generator body 411 through the line 434. Further, if the temperature of the warm washing solution stored in the processing vessel 319 is set lower than 80° C., and if the IPA vapor is introduced into the processing vessel 319 through the line 395, the IPA vapor is condensed so as to be liquefied on the surface of the warm washing solution, thereby to form an IPA liquid layer.

A level gauge 436 is arranged sideward of the vapor generator body 411. The liquid level displayed by the level gauge 436 is detected by a sensor 437, and the detection signal is transmitted to the controller 403.

Figure 40:
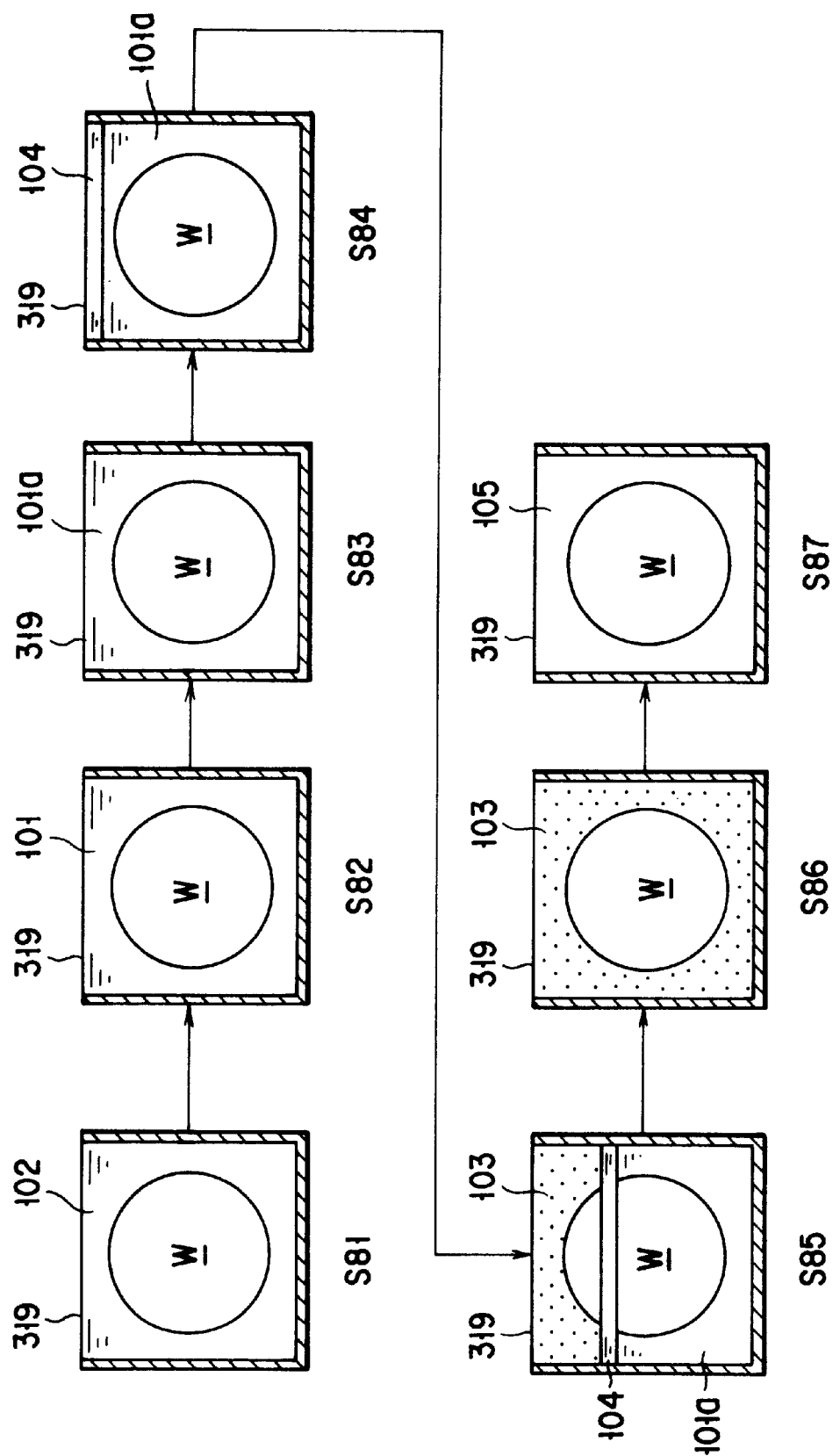
FIG. 40 is a flow chart showing steps S81 to S87 of a method according to still another embodiment of the present invention.

FIG. 40 shows how to operate the apparatus of the construction described above for subjecting the wafers W to a washing-drying treatment. In the first step, a dilute aqueous solution of hydrofluoric acid 102 is supplied from the dilute hydrofluoric acid supply source 386 into the washing solution circulating mechanism 385. Further, the dilute aqueous solution of hydrofluoric acid 102 is supplied from the washing solution circulating mechanism 385 into a bottom portion of the processing vessel 319 through the line 363 so as to form an upward stream of the hydrofluoric acid solution 102 within the processing vessel 319. It should be noted that the hydrofluoric acid solution 102 overflows the processing vessel 319 so as to flow into the overflow portion 360 and, then, into the washing solution circulating mechanism 385 through the line 361 so as to be brought back into the processing vessel 319. The overflowing solution is cleaned within the washing solution circulating mechanism 385. Further, the temperature and concentration of the overflowing solution are adjusted appropriately within the washing solution circulating mechanism 385. Of course, the wafers W are washed in this fashion with the chemical solution (hydrofluoric acid solution) in accordance with a predetermined recipe (chemical solution concentration/ washing time) (step S81).

In the next step, the dilute aqueous solution of hydrofluoric acid 102 ceases to be circulated for supply from the washing solution circulating mechanism 385 into the processing vessel 319. Then, the pure water 101 is supplied from the pure water supply source 387 into the processing vessel 319 so as to cause the dilute aqueous solution of hydrofluoric acid 102 to overflow the processing vessel 319. As a result, the dilute aqueous solution of hydrofluoric acid 102 within the processing vessel 319 is replaced by the pure water 101. It should be noted that the resistivity of the overflowing solution is detected in this step by the resistivity meter 54A so as to detect the replacement of the solution 102 with the pure water 101. It should also be noted that the overflowing hydrofluoric acid solution 102 is received by another vessel (not shown) through the drain lines 390 and 379 so as to be handled as a waste solution. In this step, the pure water 101 having room temperature is allowed to overflow the processing vessel 319 so as to subject the wafers W to a primary water wash (step S82).

After the primary water wash, the pure water 101 ceases to be supplied from the washing solution circulating mechanism 385 into the processing vessel 319. Then, a warm water 101a is supplied from the warm water supply source 388 into the processing vessel 319 so as to replace the pure water 101 of room temperature by the warm water 101a within the processing vessel 319. In this step, the warm water 101a is allowed to overflow the processing vessel 319 so as to subject the wafers W to a secondary water wash (step S83).

In the next step, the IPA liquid 104 is supplied from the IPA vapor generator 396 into the processing vessel 319 through the line 400 so as to form a layer of the IPA liquid 104 on the surface of the warm water 101a (step S84). Alternatively, the IPA vapor 103 may be introduced into the processing vessel 319 through the line 395 so as to condense and liquefy the IPA vapor 103, thereby to form the IPA liquid layer 104 on the surface of the warm water 101a.

Then, the warm water 101a is gradually withdrawn from the processing vessel 319 while introducing the IPA vapor 103 from the IPA vapor generator 396 into the processing vessel 319 (step S85). As a result, the water level within the processing vessel 319 is lowered, with the result that the wafers W are brought into contact with the IPA vapor 103 so as to be dried (step S86). In this fashion, the wafers W can be dried immediately after the washing treatment without exposing the wafers W to the air atmosphere.

After complete drying of the wafers W, a nitrogen gas 105 is introduced into the processing vessel 319, thereby to expel the IPA vapor 103 and to purge the processing vessel 319 with the nitrogen gas 105 (step 87). In this fashion, the wafers W are dried completely, with no water mark generated on the wafer surface. Incidentally, it is desirable for the nitrogen gas supplied into the case 373 to be heated to, for example, about 80° C.

It should be noted that, if the case 373 is exhausted by the exhaust means 378 while drying the wafers W with the IPA vapor 103, the pressure within the processing vessel is lowered. It follows that the vapor pressure of the IPA liquid 104 attached to the wafer surface is rendered relatively high so as to promote the drying treatment. Further, since the organic substance mixed into the line 375 is trapped by the trapping mechanism 376, it is substantially impossible for the organic substance to enter the exhaust means 378.

After completion of washing and drying of the wafers W within the processing vessel 319, the lid 371 is opened so as to take the treated wafer W out of the processing vessel 319.

Incidentally, it is possible to dispose separately an input device exclusively for transferring the wafers W into the processing vessel 319 and an output device exclusively for taking the treated wafers W out of the processing vessel 319. In this case, dry wafers W are taken out of the processing vessel 319, making it possible to keep the wafer chuck included in the output device clean and dry. It follows that the processing vessel for washing and drying the wafer chuck can be omitted, making it possible to miniaturize the washing-drying system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of washing substrates, comprising the steps of:
    (a) introducing a washing liquid into a processing vessel having a wafer boat movably mounted therein to fill the vessel with the washing liquid;
    (b) allowing a plurality of substrates to be held collectively by chuck means such that the substrates held by the chuck means are arranged at substantially an equal pitch;
    (c) dipping the substrates together with the chuck means in the washing liquid within the processing vessel;
    (d) transferring the substrates from the chuck means onto the wafer boat in an upper region of the processing vessel;
    (e) moving the substrates together with the wafer boat within the washing liquid to allow the substrates to be positioned in a lower region of the processing vessel;
    (f) discharging the washing liquid from the upper region of the processing vessel; and
    (g) supplying a fresh washing liquid into the lower region of the processing vessel so as to cause the washing liquid within the processing vessel to overflow the processing vessel; and
    (h) taking the washed substrates out of the processing vessel.

2. The method according to claim 1, wherein interposed between said steps (g) and (h) are additional steps of:
    (g') introducing a chemical solution into the lower region of the processing vessel so as to allow the substrates to be washed with said chemical solution; and
    (g") discharging the chemical solution from the lower region of the processing vessel, or supplying a washing liquid into the lower region of the processing vessel so as to substitute said washing liquid for the chemical solution, followed by causing the washing liquid to overflow the processing vessel.

3. A method of washing-drying substrates, comprising the steps of:
    (A) introducing a washing liquid into a processing vessel having a wafer boat movably mounted therein to fill the vessel with the washing liquid;
    (B) allowing a plurality of substrates to be held collectively by chuck means such that the substrates held by the chuck means are arranged at substantially an equal pitch;
    (C) dipping the substrates together with the chuck means in the washing liquid within the processing vessel;
    (D) transferring the substrates from the chuck means onto the wafer boat in an upper region of the processing vessel;
    (E) moving the substrates together with the wafer boat within the washing liquid to allow the substrates to be positioned in a lower region of the processing vessel;
    (F) discharging the washing liquid from the upper region of the processing vessel;
    (G) supplying a fresh washing liquid into the lower region of the processing vessel so as to cause the washing liquid within the processing vessel to overflow the processing vessel;
    (H) introducing a vapor for a drying treatment into the upper region of the processing vessel;
    (I) pulling the substrates out of the washing liquid to put the substrates in a gaseous phase consisting of the vapor for the drying treatment, thereby bringing the substrates into contact with the vapor for the drying treatment so as to dry the substrates; and
    (J) taking the dried substrates out of said processing vessel.

4. The method according to claim 3, wherein interposed between said steps (F) and (G) are additional steps of:
    (F') introducing a chemical solution into the lower region of the processing vessel so as to allow the substrates to be washed with said chemical solution; and
    (F") discharging the chemical solution from the lower region of the processing vessel, followed by supplying the washing liquid into the lower region of the processing vessel, or supplying the washing liquid into the lower region of the processing vessel so as to substitutes said washing liquid for the chemical solution.

5. The method according to claim 3, wherein a non-oxidizing gas is introduced into the upper region of the processing vessel in said step (F).

6. The method according to claim 3, wherein both the vapor for a drying treatment and a non-oxidizing gas are introduced into the upper region of the processing vessel in said step (H).

7. The method according to claim 1, wherein, in said steps (e) and (f), the substrate is moved downward to allow the substrate to be kept positioned below the surface of the washing liquid, and the washing liquid is discharged from the upper region of the processing vessel.

8. The method according to claim 3, wherein, in said steps (E) and (F), the substrate is moved downward to allow the substrate to be kept positioned below the surface of the washing liquid, and the washing liquid is discharged from the upper region of the processing vessel.

* * * * *